United States Patent
Ekinaka et al.

(10) Patent No.: US 11,028,284 B2
(45) Date of Patent: *Jun. 8, 2021

(54) POLYMER SUBSTRATE WITH HARDCOAT LAYER, AND MANUFACTURING METHOD FOR SAME

(71) Applicants: TEIJIN LIMITED, Osaka (JP); TSUKISHIMA KIKAI CO., LTD., Tokyo (JP)

(72) Inventors: Tatsuya Ekinaka, Osaka (JP); Tatsuichirou Kon, Osaka (JP); Takehiro Suga, Osaka (JP); Hiroshi Kishimoto, Osaka (JP); Yume Morita, Osaka (JP); Satoshi Ogata, Tokyo (JP); Masato Nakagomi, Tokyo (JP)

(73) Assignees: TEIJIN LIMITED, Osaka (JP); TSUKISHIMA KIKAI CO., LTD., Tokyo (JP)

( * ) Notice: Subject to any disclaimer, the term of this patent is extended or adjusted under 35 U.S.C. 154(b) by 82 days.

This patent is subject to a terminal disclaimer.

(21) Appl. No.: 15/761,348

(22) PCT Filed: Sep. 23, 2016

(86) PCT No.: PCT/JP2016/078127
§ 371 (c)(1),
(2) Date: Mar. 19, 2018

(87) PCT Pub. No.: WO2017/051914
PCT Pub. Date: Mar. 30, 2017

(65) Prior Publication Data
US 2018/0265731 A1   Sep. 20, 2018

(30) Foreign Application Priority Data
Sep. 25, 2015 (JP) .............................. JP2015-189003

(51) Int. Cl.
  C09D 133/12 (2006.01)
  B32B 9/00 (2006.01)
  (Continued)

(52) U.S. Cl.
  CPC .............. *C09D 133/12* (2013.01); *B32B 7/02* (2013.01); *B32B 9/00* (2013.01); *C08J 7/04* (2013.01);
  (Continued)

(58) Field of Classification Search
  CPC ............ C23C 16/0218; C23C 16/0272; C23C 16/401; C23C 16/402; C23C 28/00
  See application file for complete search history.

(56) References Cited

U.S. PATENT DOCUMENTS 4,842,941 A * 6/1989 Devins ..................... B05D 1/62
  428/412
2009/0052041 A1* 2/2009 Watanabe .............. G02B 1/113
  359/586
(Continued)

FOREIGN PATENT DOCUMENTS

EP  0 285 870   10/1988
JP  2010-253683  11/2010
(Continued)

OTHER PUBLICATIONS

Cao et al. (Thin Solid Films 516 (2008) 1941-1951).*
(Continued)

*Primary Examiner* — Alicia J Sawdon
(74) *Attorney, Agent, or Firm* — Wenderoth, Lind & Ponack, L.L.P.

(57) ABSTRACT

The present invention provides a polymer substrate with a hardcoat layer exhibiting excellent environmental resistance and wear resistance. A polymer substrate (60) is 1-20 mm thick and a hardcoat layer (70, 80) on the surface thereof
(Continued)

comprises: an underlayer cured layer (70) with a thickness of 1-20 μm, and including 10-90 parts by weight of a multifunctional acrylate, and 90-10 parts by weight of inorganic oxide fine particles and/or a silicon compound hydrolytic condensate; and a silicon oxide layer (80) which is in direct contract with the underlayer cured layer, is formed by PE-CVD with an organosilicon compound as the starter material, and satisfies all of the following conditions (a)-(c): (a) the film thickness of the silicon oxide layer is 3.5-9.0 μm; (b) the maximum indentation depth of the surface of the silicon oxide layer by nanoindentation measurement at a maximum load of 1 mN is 150 nm or less; and (c) the limit compression ratio K of the silicon oxide layer is at most 0.975 in a 3-point bending test of the polymer substrate with a hardcoat layer having been subjected to indentation deformation that causes the surface on which the silicon oxide layer is layered to be indented.

10 Claims, 7 Drawing Sheets

(51) Int. Cl.
| | | |
|---|---|---|
| *B32B 7/02* | (2019.01) | |
| *C09D 7/40* | (2018.01) | |
| *C23C 16/509* | (2006.01) | |
| *C23C 16/02* | (2006.01) | |
| *C23C 16/40* | (2006.01) | |
| *C08J 7/04* | (2020.01) | |
| *C23C 28/00* | (2006.01) | |
| *C09D 7/62* | (2018.01) | |
| *C09D 133/10* | (2006.01) | |
| *C23C 16/42* | (2006.01) | |
| *C23C 16/50* | (2006.01) | |
| *C23C 16/56* | (2006.01) | |

(52) U.S. Cl.
CPC ............. *C08J 7/0427* (2020.01); *C09D 7/40* (2018.01); *C09D 7/62* (2018.01); *C09D 133/10* (2013.01); *C23C 16/0218* (2013.01); *C23C 16/0272* (2013.01); *C23C 16/401* (2013.01); *C23C 16/402* (2013.01); *C23C 16/42* (2013.01); *C23C 16/50* (2013.01); *C23C 16/5096* (2013.01); *C23C 16/56* (2013.01); *C23C 28/00* (2013.01); *C08J 2369/00* (2013.01); *C08J 2433/00* (2013.01)

(56) References Cited

U.S. PATENT DOCUMENTS

| | | | |
|---|---|---|---|
| 2010/0010162 A1* | 1/2010 | Itou | C08F 2/54 |
| | | | 525/206 |
| 2012/0263933 A1 | 10/2012 | Higuchi et al. | |
| 2017/0107345 A1 | 4/2017 | Kon et al. | |
| 2017/0357033 A1* | 12/2017 | Ockenfuss | G02B 1/14 |

FOREIGN PATENT DOCUMENTS

| | | |
|---|---|---|
| JP | 2012-224077 | 11/2012 |
| JP | 2012-232591 | 11/2012 |
| JP | 2013-35274 | 2/2013 |
| JP | 2013-107382 | 6/2013 |
| JP | 2014-531334 | 11/2014 |
| WO | 01/41541 | 6/2001 |
| WO | 2013/032421 | 3/2013 |
| WO | 2015/147295 | 10/2015 |

OTHER PUBLICATIONS

NanoScience Dynamic Modes for AFM www.nanoscience.com/techniques accessed Jan. 23, 2020.*
International Search Report dated Dec. 27, 2016 in International (PCT) Application No. PCT/JP2016/078127.
Extended European Search Report dated Sep. 20, 2018 in European Patent Application No. 16848702.3.

* cited by examiner (a)

(b)

POLYMER SUBSTRATE WITH HARDCOAT LAYER, AND MANUFACTURING METHOD FOR SAME

TECHNICAL FIELD

The present invention relates to a polymer substrate having a hard coating layer and a method for producing that polymer substrate. More particularly, the present invention relates to a polymer substrate having a hard coating layer, which demonstrates superior abrasion resistance and heat resistance, and can be used for a long period of time even in a harsh usage environment, and a method for producing that polymer substrate. This polymer substrate having a hard coating layer can be used, for example, automobile window materials, construction members or surface protective plates of solar cells.

BACKGROUND ART

For example, since resin molding materials having high transparency such as polycarbonate resin or acrylic resin have superior light weight, impact resistance, processability, integration ability with surrounding components and design properties in comparison with inorganic glass, they are widely used in place of organic glass in various types of applications in order to take advantage of these merits.

However, since these resins are inferior to inorganic glass in terms of surface abrasion resistance and hardness, there are many cases in which they are used in the form of polymer substrates provided with a hard coating layer in which a polymer substrate is laminated with a hard coating layer for preventing damage to the polymer substrate.

In the case of polymer substrates having a hard coating layer used in automobile window materials in particular (typically referred to as resin glazing materials), a level of abrasion resistance comparable to that of inorganic glass is required to ensure mechanical strength required for use as a window material as well as visibility in terms of driving safety, while environmental performance is required so as to withstand outdoor exposure for long periods of time. With respect to environmental performance, it is necessary for these polymer substrates to demonstrate performance capable of passing various types of tests in anticipation of direct contact with moisture including inclement weather, use under both high humidity and dry conditions, use under both high temperature and low temperature conditions and exposure to high levels of ultraviolet rays. The previously proposed products can be said to be inadequate for use as resin glazing materials capable of stably realizing all of these required performance levels.

With respect to the abrasion resistance of inorganic glass and the like, when referring to standards such as the FMVSS205 safety standard applied in the U.S. or the ECE R43 safety standard applied in Europe, the required level of abrasion resistance with respect to windows used at sites requiring visibility during driving is defined as an increase in haze value ($\Delta H$) of less than 2% or 2% or less as determined with a Taber abrasion test carried out for 1000 revolutions as defined in ASTM D1044.

Although polymer substrates having a hard coating layer (see, for example, Patent Documents 1 to 6), obtained by depositing an organic silicon-based oxide polymer on a resin substrate by plasma-enhanced chemical vapor deposition (PE-CVD) using an organic silicon compound (such as organosiloxane, organosilane or silazane) for the raw material, have been proposed for use as resin glazing materials for applications requiring both high abrasion resistance and outdoor weather resistance in this manner, typically in the case of providing a hard coating layer having high hardness formed by PE-CVD on an outermost surface, due to the generation of considerable interface stress between the high hardness hard coating layer and the underlayer on which that layer is laminated, it becomes difficult to ensure durability and reliability of the resulting hard coating layer. There are also many cases in which resistance to a boiling water test, which is an accelerated test relating to direct contact with moisture in the usage environment and long-term standing in high-humidity, high-temperature environment (to be referred to as boiling water resistance), as well as resistance to a high-temperature endurance test, which is an accelerated test relating to temperature change in an usage environment (to be referred to as heat resistance), are inadequate, frequently resulting in the observation of defective adhesion of the high hardness hard coating layer as well as other defects such as peeling phenomena or crack formation.

For example, the aforementioned Patent Document 1 proposes a plastic laminate obtained by sequentially laminating an acrylic resin heat-cured film, an organosiloxane-based resin heat-cured film, and PE-CVD film using an organic silicon compound as raw material on at least one side of a plastic substrate, wherein the PE-CVD film is composed of a gradient zone, in which the abundance ratio of oxygen atoms to silicon atoms (O/Si ratio) increases gradually from the interface with the heat-cured film of the aforementioned organosiloxane-based resin, and a subsequent flat zone, in which the aforementioned ratio is nearly constant, and Examples 1 and 2 therein disclose laminates that realize Taber abrasion resistance performance of 2.0% or less, which is an object of that invention, boiling water resistance as determined by a boiling water immersion test of 2 hours, and heat resistance of 1000 hours at 110° C.

Although these exemplified references were carried out by the present applicants, with respect to the method used to evaluate boiling water resistance, several problems were determined to occur during the course of examinations conducted by the present applicants after the exemplified patent documents were filed. Namely, although the duration of immersion in boiling water is indicated as being 2 hours, it was determined that making the duration of immersion in boiling water to be at least 3 hours and preferably 4 hours or more is preferable in terms of adequately ensuring long-term reliability such as water resistance or moisture resistance. In addition, with respect to the method used to evaluate an adhesion test after immersing in boiling water, it was determined that simply evaluating immediately after testing using the crosscut tape test is inadequate, and that it is necessary to evaluate and confirm results at least 7 days after carrying out the test. This is because it was determined that, since there are many cases in which internal stress (and frequently compressive force) generated during layer formation remains in the silicon oxide layer formed by PE-CVD, and due to the action thereof, there are cases observed in which layer separation occurs over time.

On the basis of these findings, it was decided to carry out evaluation of adhesion in the boiling water test of the present invention according to the procedure described below.

Namely, an adhesion test is carried out in accordance with a crosscut tape test in compliance with JIS K5400 after immersing a polymer substrate having a hard coating layer in boiling water at 100° C., removing the polymer substrate from the boiling water after retaining in the boiling water for 3 hours, removing any adhered moisture, and finally allowing to stand in a room temperature environment for 2 hours.

The crosscut tape test is carried out by forming 10×10 squares cut out at 1 mm intervals with a cutter knife in the form of a grid followed by affixing and adhering tape having a prescribed adhesive force (such as Nichiban Cellophane Tape™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" were favorable.

According to this evaluation method, when boiling water resistance of the laminate of the aforementioned Patent Document 1 was reevaluated, although the "initial result" was favorable (100/100), according to the "elapsed result", separation of the PE-CVD layer laminated according to the PE-CVD method occurred at sites where crosscuts were made. Namely, the result of evaluation in the case of Example 1 was 70/100 (layer separation occurred in 30 of the 100 squares), and the result of evaluation in the case of Example 2 was 0/100 (layer separation occurred in all 100 squares), with satisfactory results being unable to be obtained for both examples, thereby resulting in a need to improve performance.

Moreover, in fields such as automobile windows, a technology is required for blocking infrared rays in order to inhibit the rise in temperature within the vehicle caused by entrance of sunlight.

Although infrared reflection technologies and infrared absorption technologies are employed to block infrared rays, in the case of blocking infrared rays using an infrared absorption technology in particular, although the rise in temperature inside the vehicle can be inhibited, the windows per se conversely end up reaching an extremely high temperature.

In the case of using a resin window produced using the aforementioned technology in such a high-temperature environment, due to the difference between the coefficient of linear expansion of a cured underlayer and the coefficient of linear expansion of a hard coating layer having an oxidation polymer of an organic silicon-based compound deposited thereon, there was the problem of a wavy pattern appearing in the cured underlayer and cracks forming in the hard coating layer having an oxidation polymer of an organic silicon-based compound deposited thereon.

In the case of actually reevaluating the heat resistance of the laminate of the aforementioned Patent Document 1, although abnormalities were not observed in the test piece even after testing for 1000 hours at a temperature of 110° C., cracks formed in the hard coating layer and silicon oxide layer formed by PE-CVD at the stage 500 hours of testing time had elapsed.

In addition, in the aforementioned Patent Document 2, a laminate is proposed that has a plurality of coating layers comprising an outermost layer (I), obtained by plasma polymerization of an organic silicon compound, a lower layer (II), having a silicone coating composition containing a composite oxide fine particle dispersion, a silicone resin, a curing catalyst and a solvent, and a lower layer (III) consisting of an arbitrary acrylic resin, on an organic resin substrate, and in Examples 2, 4, 5 and 7, laminates are disclosed that have Taber abrasion resistance performance of 2.0% or less, which is an object of that invention. In addition, a correlation between individual properties of each layer that composes the laminates and performance is also disclosed.

However, in these examples, the haze values of the laminates are high at 2.7% to 3.0%, thereby resulting in the problem of images transmitted through the laminates being unclear, and since this makes their use in applications requiring visibility difficult, an object of present applicants in the form of a polymer substrate having a hard coating layer is not realized.

Moreover, in these examples, although results for water resistance performance (using test conditions consisting of 3 days at 65° C.) and an accelerated weather resistance test are disclosed, there is no disclosure of boiling water resistance performance or heat resistance performance, and thus the object of the present applications in the form of a polymer substrate having a hard coating layer and a high level of weather resistance performance cannot be said to be realized.

In addition, in the aforementioned Patent Document 3, a multilayer product is proposed that is composed of a base material, a first layer obtained with a partial condensate of organosiloxane, and a second layer containing plasma-polymerized organic silicon and deposited at a power level of $10^6$ J/Kg to $10^8$ J/Kg in the presence of excess oxygen, results are disclosed in Example 2 indicating favorable appearance after an outdoor exposure test conducted for 1 year in Florida, U.S.A. (absence of microcracks) and favorable adhesion, and results indicating favorable appearance after an accelerated xenon weather resistance test at a cumulative radiation level of 6875 KJ/m$^2$ (absence of microcracks) and favorable adhesion are disclosed in Examples 4 and 5.

However, in these examples, although the results of an accelerated weather resistance test are disclosed, there is no disclosure of boiling water resistance performance or heat resistance performance, and an object of the present applicants in the form of a polymer substrate having a hard coating layer and a high level of weather resistance performance cannot be said to be realized.

On the other hand, a configuration has also been proposed in which a UV-cured or heat-cured acrylic resin coating layer is formed instead of a silicone coating layer on a resin substrate, and a layer obtained by plasma polymerization of an organic silicon compound is formed thereon.

Patent Document 4, for example, discloses a constituent in the form of a laminate obtained by sequentially laminating a cured coating layer (I), consisting of an active energy ray-cured primer composition, and an inorganic substance layer (II) on a resin substrate, wherein the active energy ray-cured primer composition contains (A) a silsesquioxane compound, in which organic groups are directly bound to a silicon atom, and at least one of the organic groups is an organic group having a (meth)acryloyloxy group, and (B) a photopolymerization initiator, and the inorganic substance layer (II) is formed by a dry deposition method.

However, although these examples disclose the results of accelerated weather resistance tests, there are no disclosures regarding boiling water resistance performance or heat resistance performance, and an object of the present applicants in the form of a polymer substrate having a hard coating layer and a high level of weather resistance performance cannot be said to be realized.

In addition, the aforementioned Patent Document 5 discloses a highly scratch-resistant hard coating film having a composition provided with a first hard coating layer composed of a UV-cured resin, an anchor coating layer composed of an organic-inorganic hybrid film, and a second hard coating layer having high scratch resistance obtained by depositing an organic silicon-based or organic aluminum-based reactive gas when carrying out chemical vapor deposition, on a substrate film.

However, although these examples disclose matters relating to weather resistance performance, there are no disclosures made regarding boiling water resistance performance or heat resistance performance, and an object of the present applicants in the form of a polymer substrate having a hard coating layer and a high level of weather resistance performance cannot be said to be realized.

In addition, the aforementioned Patent Document 6 discloses an organic resin laminate having weather resistance and scratch resistance, and having an organic resin substrate and a multilayer coating layer on the surface of the substrate, wherein the multilayer coating layer contains a hard coating uppermost surface layer (I), obtained by plasma polymerization of an organic silicon compound, and a hard coating intermediate layer (II) formed from a composite coating composition (2), one side of the intermediate layer (II) contacts the uppermost surface layer, the other side is arranged so as to contact the organic resin substrate, and the composite coating composition (2) contains inorganic oxide nanoparticles (2-A) containing those selected from silica, zinc oxide, titanium oxide, cerium oxide and combinations containing at least one thereof, a vinyl-based copolymer (2-B) having a UV-absorbing group and a reactive group selected from an alkoxysilyl group, hydroxyl group, epoxy group, carboxyl group and amino group, and a solvent (2-C).

However, although these examples disclose the results of accelerated weather resistance tests, there are no disclosures regarding boiling water resistance performance or heat resistance performance, and an object of the present applicants in the form of a polymer substrate having a hard coating layer and a high level of weather resistance performance cannot be said to be realized.

Thus, a polymer substrate having a hard coating layer that demonstrates superior abrasion resistance and heat resistance and enables long-term use even in harsh usage environments has yet to be realized.

PRIOR ART DOCUMENTS

Patent Documents

Patent Document 1: Japanese Unexamined Patent Publication No. 2010-253683
Patent Document 2: Japanese Unexamined Patent Publication No. 2012-224077
Patent Document 3: Japanese Unexamined Patent Publication No. 2012-232591
Patent Document 4: Japanese Unexamined Patent Publication No. 2013-035274
Patent Document 5: Japanese Unexamined Patent Publication No. 2013-107382
Patent Document 6: National Publication of PCT Application No. 2014-531334

SUMMARY OF THE INVENTION

Problems to be Solved by the Invention

On the basis of these circumstances, the present invention relates to a polymer substrate with hard coating layer obtained by laminating a high hardness hard coating layer by plasma-enhanced chemical vapor deposition (PE-CVD) on a surface layer, and an object thereof is to obtain a composition capable of realizing the three characteristics consisting of a high level of abrasion resistance comparable to that of inorganic glass, superior boiling water resistance as a typical property of environmental resistance (including an "elapsed result" for adhesion), and superior heat resistance.

Means for Solving the Problems

As a result of conducting extensive studies, the inventors of the present invention found that the aforementioned problems can be solved by satisfying the requirements that film thickness of a silicon oxide film obtained by PE-CVD, nanoindentation depth and critical compression ratio be within prescribed ranges in a polymer substrate having a hard coating layer, thereby leading to completion of the present invention.

In order to satisfy the aforementioned requirements, in addition to the film thickness of a silicon oxide film obtained by PE-CVD, mechanical properties and chemical properties being within prescribed ranges, it is also necessary to increase as much as possible adhesive strength between the silicon oxide layer obtained by PE-CVD and a substrate surface, and this is realized according to the means described below.

(1) A cured underlayer composed of 10 to 90 parts by weight of multifunctional acrylate and 90 to 10 parts by weight of inorganic oxide fine particles having a primary particle diameter of 1 nm to 200 nm and/or a hydrolysis-condensation product of a silicon compound is formed.

(2) Surface treatment, such as plasma treatment (under atmosphere pressure or vacuum), flame treatment, corona treatment, UV (from 150 nm to 400 nm) (Ozone) treatment, and chemical agent treatment, is performed prior to forming the silicon oxide layer by PE-CVD so that surface properties of the cured underlayer are within a prescribed range.

(3) The silicon oxide layer is formed by PE-CVD method in the vicinity of the interface with the cured underlayer (initial growth process) within the range of a low deposition rate.

These three means make it possible to greatly improve interlayer adhesive strength between the silicon oxide layer obtained by PE-CVD method and the cured underlayer as well as realize the objects of the present invention in the form of abrasion resistance, environmental resistance (boiling water resistance (elapsed adhesion)) and heat resistance.

Namely, the present invention is as described below with respect to solving the aforementioned problems.

(1) A polymer substrate with hard coating layer comprising a polymer substrate having a thickness of 1 mm to 20 mm and a hard coating layer on the surface thereof; wherein, the hard coating layer comprises:
a cured underlayer laminated on the surface of the polymer substrate, containing 10 to 90 parts by weight of multifunctional acrylate and 90 to 10 parts by weight of inorganic oxide fine particles and/or a hydrolysis-condensation product of an organic silicon compound, and having a thickness of 1 μm to 20 μm, and
a silicon oxide layer that makes direct contact with the cured underlayer on the opposite side from the polymer substrate, is formed by PE-CVD using an organic silicon compound as raw material, and satisfies all of the following requirements (a) to (c):
(a) film thickness of the silicon oxide layer is within the range of 3.5 μm to 9.0 μm, (b) maximum indentation depth of the surface of the silicon oxide layer, as determined by measuring nanoindentation under conditions of a maximum load of 1 mN, is 150 nm or less, and (c) the value of critical compression ratio K of the silicon oxide layer, as defined by formula (1) in a 3-point bending test of the polymer substrate with hard coating layer that imparts indentation displacement in which the surface laminated with the silicon oxide layer becomes concave, is 0.975 or less:

$$K=(R-D/2)/R-(0.00215\times d) \quad \text{Formula (1)}$$

(wherein,

D represents the total thickness (mm) of the polymer substrate with hard coating layer, d represents the film thickness (μm) of the silicon oxide layer, G represents the distance (mm) between two end fulcrum points in a 3-point bending tester, δL represents indentation displacement (mm), measured when the silicon oxide layer begins to separate from a cut line (separation starting line) drawn in advance at the location of the central fulcrum point where a weight is applied in a 3-point bending test, and R represents the bend radius (mm) of the polymer substrate with hard coating layer, measured when the silicon oxide layer begins to separate from a cut line (separation starting line) drawn in advance at the location of the central fulcrum point where a weight is applied in a 3-point bending test).

(2) The polymer substrate with hard coating layer described in (1) above, wherein the ratio of infrared absorbance of the silicon oxide layer at a wave number of 930 $cm^{-1}$ to that at a wave number of 1020 $cm^{-1}$ ($\alpha_{930}/\alpha_{1020}$) is 0.30 or less.

(3) The polymer substrate with hard coating layer described in (1) or (2) above, wherein the ratio of infrared absorbance of the silicon oxide layer at a wave number of 1280 $cm^{-1}$ to that at a wave number of 1020 $cm^{-1}$ ($\alpha_{1280}/\alpha_{1020}$) is within the range of 0.002 to 0.020.

(4) The polymer substrate with hard coating layer described in any of (1) to (3) above, wherein indentation hardness of the surface of the silicon oxide layer as determined by measuring nanoindentation under conditions of a maximum load of 1 mN is 3.0 GPa or more.

(5) The polymer substrate with hard coating layer described in any of (1) to (4) above, wherein surface roughness (Ra) of the silicon oxide layer when measured using the dynamic force mode (DFM) of a scanning probe microscope under conditions of observing by 5.0 μm square is 5.0 nm or less.

(6) The polymer substrate with hard coating layer according to any of (1) to (5), containing a (meth)acrylic resin containing 0.1 to 5 mol/kg of hydroxyl groups, amino groups, carboxyl groups, alkoxysilyl groups or a combination thereof in the compound thereof.

(7) A method for producing the polymer substrate with hard coating layer according to any of (1) to (6), comprising: forming the cured underlayer by coating a precursor material composition containing 10 to 90 parts by weight of a multi-functional acrylate and 90 to 10 parts by weight of an inorganic oxide fine particle and/or silicon compound hydrolysis-condensation product onto the polymer substrate followed by drying and heat curing or active energy ray curing.

(8) The method for producing the polymer substrate with hard coating layer according to (7), wherein the surface of the cured underlayer is adjusted by plasma excitation or colliding an ionized inert gas with the surface of the cured underlayer.

(9) The method for producing the polymer substrate with hard coating layer according to (7) or (8), wherein the silicon oxide layer is formed by making the average deposition rate (nm/sec) from the start of deposition to 30 seconds after the start of deposition to be 1 nm/sec or less.

(10) The method for producing the polymer substrate with hard coating layer according to (9), wherein the silicon oxide layer is formed by making the average deposition rate (nm/sec) starting from 30 seconds after the start of deposition to be 2 nm/sec or more.

(11) The method for producing the polymer substrate with hard coating layer according to (10), wherein the deposition rate of the silicon oxide layer is increased continuously or incrementally in two or more steps.

Effects of the Invention

According to the present invention, since a polymer substrate with hard coating layer can be obtained that is provided with a high level of abrasion resistance comparable to that of inorganic glass and the like, the ability to withstand harsh environmental conditions corresponding to outdoor use (boiling water resistance (elapsed adhesion)) and heat resistance, it can be used in a wide range of applications as a high-performance resin glazing material for use in automobile window glass and the like.

DETAILED DESCRIPTION OF THE INVENTION

Figure 4:
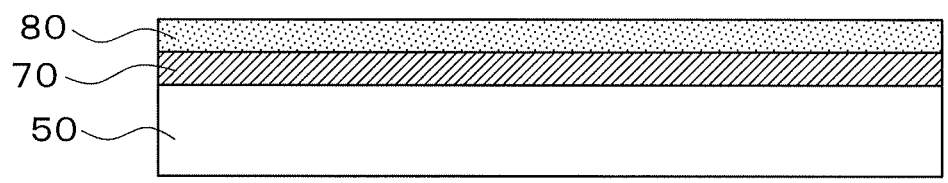
FIG. 4 is a cross-sectional schematic diagram of a polymer substrate with hard coating layer applied in one embodiment of the present invention.
Figure 5:
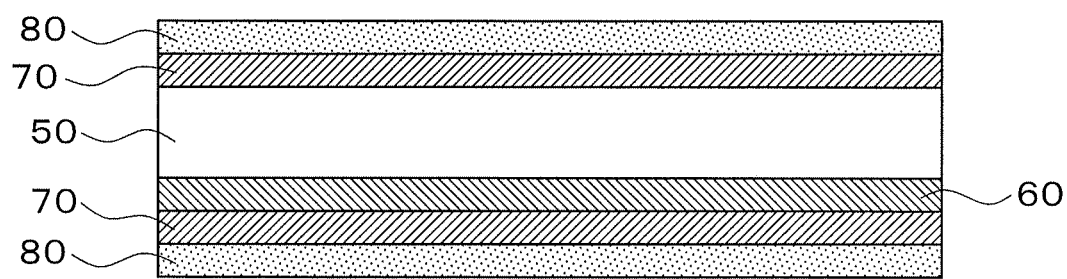
FIG. 5 is a cross-sectional schematic diagram of a polymer substrate with hard coating layer applied in another embodiment of the present invention.

In the present invention, as shown in FIGS. 4 and 5, although it is essential that the cured underlayer 70 and the silicon oxide layer 80 obtained by PE-CVD be laminated in that order on at least one side of the polymer substrate 50, the laminated layers are not required to be present on the other side, and a preferable configuration is selected according to the application as necessary. For example, as shown in FIG. 4, another layer may be present on the other side of the polymer substrate 50. In addition, as shown in FIG. 5, for example, a layer other than an adhesive layer 60, the cured underlayer 70 and the silicon oxide layer 80 obtained by PE-CVD (such as a UV-cured resin layer) can be selected to be laminated and formed on the other side of the polymer substrate 50.

The following provides a sequential detailed explanation of each component that composes the polymer substrate with hard coating layer according to the present invention and methods for adjusting each component.

<Polymer Substrate 50>

Examples of materials of the polymer substrate 50 include polycarbonate resin, acrylic resin such as polymethyl methacrylate, polyester resin such as polyethylene terephthalate, polybutylene terephthalate or poly(ethylene-2,6-naphthalate), polystyrene resin, polypropylene resin, polyarylate resin, polyethersulfone resin, ABS resin and polylactic acid resin. These resins can be used alone or two or more types can be used as a mixture. Among these, polycarbonate resin having superior transparency, heat resistance and impact resistance is particularly preferable in the case of considering use in automobile window applications. Acrylic coated polycarbonate substrate obtained by co-extruding polycarbonate resin with acrylic resin which coats the surface is particularly preferable as the polymer substrate.

Furthermore, with respect to resin heat resistance, the heat distortion temperature (HDT) is preferably 100° C. or higher, more preferably 120° C. or higher and even more preferably 130° C. or higher.

One example of a polycarbonate resin is a polycarbonate resin obtained by reacting a divalent phenol and a carbonate precursor by an interfacial polycondensation method or a fusion method. Typical examples of divalent phenols include 2,2-bis(4-hydroxyphenyl)propane (commonly referred to as bisphenol A), 2,2-bis(3-methyl-4-hydroxyphenyl)propane, 2,2-bis(3,5-dimethyl-4-hydroxyphenyl)propane, 1,1-bis(4-hydroxyphenyl)ethane, 1,1-bis(4-hydroxyphenyl)cyclohexane, 2,2-bis(4-hydroxyphenyl)butane, 2,2-bis(4-hydroxyphenyl)-3-methylbutane, 9,9-bis{(4-hydroxy-3-methyl)phenyl}fluorene, 2,2-bis(4-hydroxyphenyl)-3,3-dimethylbutane, 2,2-bis(4-hydroxyphenyl)-4-methylpentane, d1,1-bis(4-hydroxyphenyl)-3,3,5-trimethylcyclohexane and α,α-bis(4-hydroxyphenyl)-m-diisopropylbenzene, bis(4-hydroxyphenyl)sulfide and bis(4-hydroxyphenyl)sulfone, and among these, bisphenol A is preferable. These divalent phenols can be used alone or two or more types can be used as a mixture.

In addition, a carbonyl halide, carbonate ester or haloformate and the like is used for the carbonate precursor, and specific examples thereof include phosgene, diphenyl carbonate and dihaloformates of divalent phenols.

In the production of a polycarbonate resin by reacting a divalent phenol and carbonate precursor by an interfacial polycondensation method or fusion method, a catalyst, chain-end terminator or antioxidant of a divalent phenol may be used as necessary. In addition, the polycarbonate resin may be a branched polycarbonate resin obtained by copolymerizing a polyfunctional aromatic compound having three or more functional groups, or may be a mixture obtained by mixing two or more types of the resulting polycarbonate resins.

The molecular weight of the polycarbonate resin in terms of the viscosity-average molecular weight (M) is preferably 10,000 to 50,000 and more preferably 15,000 to 35,000. A polycarbonate resin having this viscosity-average molecular weight allows the obtaining of adequate strength and demonstrates favorable melt fluidity during molding, thereby making this preferable.

Viscosity-average molecular weight as referred to in the present invention is determined by substituting specific viscosity ($\eta_{sp}$), which is determined from a solution obtained by dissolving 0.7 g of polycarbonate resin in 100 ml of methylene chloride at 20° C., into the formula indicated below.

$$\eta_{sp}/c=[\eta]+0.45\times[\eta]^2 c \text{(where, } [\eta] \text{ represents limiting viscosity)}$$

$$[\eta]=1.23\times10^{-4}M^{0.83}$$

$$c=0.7$$

In addition, other preferable examples of polycarbonate resins include polycarbonate resin obtained by copolymerization of isosorbide and an aliphatic diol, and various types of copolymerized polycarbonates such as polycarbonate-polyorganosiloxane copolymers.

The polycarbonate resin can be used after adding and mixing therein a stabilizer such as a phosphite ester or phosphonate ester, a flame retardant such as tetrabromobisphenol A, a low molecular weight polycarbonate of tetrabromobisphenol A or decabromodiphenol, an organic ultraviolet absorber such as a benzotriazole, benzophenone, triazine or salicylate, an inorganic ultraviolet absorber such as titanium oxide, cerium oxide or zinc oxide, an ultraviolet shielding agent such as a cyanine-based compound, squarylium-based compound, thiol-nickel complex salt-based compound, phthalocyanine-based compound, triallylmethane-based compound, naphthoquinone-based compound, anthraquinone-based compound, carbon black, antimony oxide, tin oxide doped with indium oxide or lanthanum boride, a colorant or a lubricant as necessary.

Furthermore, the thickness of the polymer substrate is preferably within the range of 1 mm to 20 mm. If the thickness is less than 1 mm, it becomes difficult to retain mechanical strength required by an automobile window and the like, flexural deformation of the substrate increases accompanying lamination of the silicon oxide layer by PE-CVD, and there are many cases in which problems with dimensional stability and appearance occur, thereby making this undesirable. On the other hand, if the thickness exceeds 20 mm, it becomes difficult to retain surface smoothness necessary for a window material and obtain a molded substrate having a low level of optical distortion (such as perspective distortion) while also increasing the substrate weight, thereby making this undesirable.

The thickness of the polymer substrate is more preferably 2 mm to 10 mm and even more preferably 3 mm to 7 mm.

(Cured Underlayer 70)

The cured underlayer 70 is laminated on the surface of the polymer substrate, contains a hydrolysis-condensation product of an organic silicon compound as the main component thereof, contains 10 to 90 parts by weight of a multifunctional acrylate and 90 to 10 parts by weight of inorganic oxide fine particles and/or silicon compound hydrolysis-condensation product, and the thickness thereof is 1 to 20 μm. This thickness may be, for example, 1 μm or more, 3 μm or more or 5 μm or more, and 20 μm or less, 15 μm or less or 10 μm or less.

This cured underlayer (70) is preferably a layer obtained by heat curing or active energy ray curing of a precursor composition containing 10 to 90 parts by weight of a multi-functional acrylate having two or more (meth)acryloyl groups in a molecule thereof and 90 to 10 parts by weight of inorganic oxide fine particles and/or a silicon compound hydrolysis-condensation product (to be referred to as the "precursor composition"), and is particularly preferably a layer obtained by active energy ray curing.

Furthermore, in the present invention, the term "(meth) acrylate" refers to both an acrylate and methacrylate, and a "(meth)acryloyl group" refers to both an acryloyl group and a methacryloyl group.

Examples of this multi-functional (meth)acrylate include trimethylolpropane (meth)acrylate, ethylene oxide-modified trimethylolpropane (meth)acrylate, propylene oxide-modified trimethylolpropane (meth)acrylate, glycerin di(meth) acrylate, bis(2-(meth)acryloyloxyethyl)hydroxyethyl isocyanurate, pentaerythritol tri(meth)acrylate, ditrimethylolpropane tri(meth)acrylate and dipentaerythritol penta(meth)acrylate.

Although one type of these (meth)acrylates can be used, two or more types are preferably used in combination to achieve balance between hardness and flexibility. In addition, among these (meth)acrylates, pentaerythritol tri(meth) acrylate and pentaerythritoltetra(meth)acrylate are preferably incorporated in fixed amounts since they are capable of improving scratch resistance.

Examples of inorganic oxide fine particles include titanium oxide, zinc oxide and silicon oxide fine particles.

Examples of the silicon compound hydrolysis-condensation product include alkoxysilane compounds, and more specifically, hydrolysis-condensation products including alkyltrialkoxysilanes such as methyltrimethoxysilane, methyltriethoxysilane, ethyltrimethoxysilane or ethyltriethoxysilane, 3-(meth)acryloyloxypropyltrialkoxysilanes such as 3-(meth)acryloyloxypropyltrimethoxysilane or 3-(meth) acryloyloxypropyltriethoxysilane, vinyltrialkoxysilanes such as vinyltrimethoxysilane or vinyltriethoxysilane, aminomethoxysilane, aminomethyltriethoxysilane, 2-aminoethyltrimethoxysilane, 2-aminoethyltriethoxysilane, 3-aminopropyltrimethoxysilane and 3-aminopropyltriethoxysilane.

In a hydrolysis-condensation reaction, the condensation reaction proceeds together with hydrolysis, the majority, and preferably 100%, of the hydrolyzable groups of the hydrolyzable silane are hydrolyzed to hydroxyl groups (OH), and the majority, and preferably 80% or more, more preferably 85% or more, and particularly preferably 90% or more, of the OH groups are condensed, which is preferable from the viewpoint of liquid stability.

Although the hydrolysis reaction may be carried out with alkoxysilane alone, it is preferably carried out in the presence of inorganic oxide fine particles in order to improve dispersibility of the inorganic oxide fine particles.

In addition, a compound is preferably reacted and used that has a (meth)acrylic resin having alkoxysilyl groups in a side chain thereof, a (meth)acrylic resin having hydroxyl groups, amino groups or carboxyl groups which are highly polar in a side chain thereof, and inorganic oxide fine particles and/or a silicon compound hydrolysis-condensation product in order to improve dispersibility of the inorganic fine particles.

Examples of these (meth)acrylic resins having alkoxysilyl groups in a side chain thereof include copolymers of a (meth)acrylic monomer having alkoxysilyl groups represented by general formula (1):

[Chemical Formula 1]

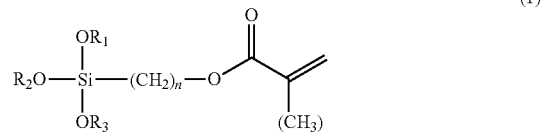

(wherein, $R^1$, $R^2$ and $R^3$ respectively and independently represent an alkyl group having 1 to 4 carbon atoms, and n represents an integer of 1 to 6), and another (meth)acrylic monomer.

Examples of other monomers are indicated in the following sections (1) to (5):

(1) (meth)acrylic esters having an alkyl group having 1 to 22 carbon atoms such as methyl (meth)acrylate, ethyl (meth) acrylate, propyl (meth)acrylate, n-butyl (meth)acrylate, t-butyl (meth)acrylate, hexyl (meth)acrylate, heptyl (meth) acrylate, octyl (meth)acrylate, nonyl (meth)acrylate, decyl (meth)acrylate, dodecyl (meth)acrylate, tetradecyl (meth) acrylate, hexadecyl (meth)acrylate, stearyl (meth)acrylate, octadecyl (meth)acrylate or docosyl (meth)acrylate;

(2) (meth)acrylic esters having an alicyclic alkyl group such as cyclohexyl (meth)acrylate, isobornyl (meth)acrylate, dicyclopentanyl (meth)acrylate or dicylopentenyloxyethyl (meth)acrylate;

(3) (meth)acrylic esters having an aromatic ring such as benzoyloxyethyl (meth)acrylate, benzyl (meth)acrylate, phenylethyl (meth)acrylate, phenoxyethyl (meth)acrylate, phenoxydiethylene glycol (meth)acrylate or 2-hydroxy-3-phenoxypropyl (meth)acrylate;

(4) (meth)acrylic esters having a hydroxyalkyl group such as hydroxyethyl (meth)acrylate, hydroxypropyl (meth)acrylate, hydroxybutyl (meth)acrylate, glycerol (meth)acrylate, lactone-modified hydroxyethyl (meth)acrylate or meth (acrylic) esters having a polyalkylene glycol group such as polyethylene glycol (meth)acrylate or polypropylene glycol (meth)acrylate; and, (5) unsaturated carboxylic esters such as dimethyl fumarate, diethyl fumarate, dibutyl fumarate, dimethyl itaconate, dibutyl itaconate, methylethyl fumarate, methylbutyl fumarate or methylethyl itaconate.

In addition, examples of (meth)acrylic resins having hydroxyl groups, amino groups or carboxyl groups which are highly polar in a side chain thereof include polymers obtained by copolymerizing a polymerizable monomer having a (meth)acryloyl group and an epoxy group with another monomer followed by expressing the polar group by carrying out a ring-opening reaction on the epoxy group, and polymers of an acrylic monomer having a polar group, such as hydroxyethyl (meth)acrylate, aminopropyl (meth)acrylate or (meth)acrylic acid, and another acrylic monomer.

Examples of other monomers include the previously described (meth)acrylic esters.

These (meth)acrylic resins preferably contain 0.1 to 5.0 mol/kg, and for example, 3.0 to 4.0 mol/kg, of hydroxyl groups, amino groups, carboxyl groups, alkoxysilyl groups or combination thereof within the compound. The content of the hydroxyl groups, amino groups, carboxyl groups, alkoxysilyl groups or combination thereof is determined by dividing the weight of each monomer used when polymerizing the (meth)acrylic resin by the molecular weight thereof to calculate the incorporated substance equivalent, by totaling the product of that value and the number of hydroxyl groups, amino groups, carboxyl groups or alkoxysilyl groups contained in a single molecule of each monomer used, and by dividing the total value by the total weight of the used monomers to obtain the quotient thereof.

Since organic components such as acrylic resin and inorganic components such as colloidal silica can be uniformly dispersed in the reaction products and the reaction products can be favorably dispersed in the organic component and inorganic component by reacting the acrylic resin with colloidal silica and/or a silicon compound hydrolysis-condensation product, the presence of these reaction products facilitates compatibility between the organic component and inorganic component, thereby enhancing uniformity of the organic component and inorganic component in the coating layer.

At the lower limit or higher of the amount of hydroxyl groups, amino groups, carboxyl groups, alkoxysilyl groups or combination thereof contained in the (meth)acrylic resin compound, the ability to be compatible with the inorganic component is adequate, thereby making this preferable, and if that amount is equal to or less than the upper limit, the coating layer is resistant to peeling and cracking in a boiling water test without undergoing a decrease in water resistance of the cured underlayer.

A cured underlayer prepared in this manner is able to realize an extremely favorable surface for ensuring adhesion with the silicon oxide layer obtained by PE-CVD as a result of decomposing or removing a portion of the organic component in the layer by subsequently subjecting to surface treatment, such as plasma treatment (under atmospheric pressure or vacuum), flame treatment, corona treatment, UV (from 150 nm to 400 nm) (ozone) treatment or chemical agent treatment, and gradually increasing the proportion of inorganic component in a sloping manner moving towards the surface.

Further, in order to obtain superior environmental resistance or boiling water resistance of the present invention, the surface of the cured underlayer preferably has 35° or less of water contact angle, and from 0.7 to 10.0 nm of surface roughness (Ra) when measured using the DFM method under conditions of observing by 5.0 μm square. Since the cured underlayer has frequently electrically insulation property, the surface is advantageously observed by DFM method, as explained below.

Here, water contact angle reflects the magnitude of the intermolecular force between the surface of the polymer substrate and a polar substance. Namely, although a liquid such as water on a solid surface becomes spherical as a result of reducing surface area if intermolecular force between the water and the surface is not present, if intermolecular force (surface energy) acts between the solid surface and the water, the water spreads over the solid surface as a result of having been stabilized by acquiring a larger amount of surface energy and the contact angle decreases. Since it is necessary to overcome the intermolecular force between the water and solid surface in order to remove water in this state from a solid, a large amount of energy is required (namely, it is difficult to remove the water). Since the silicon oxide layer obtained by PE-CVD is a highly polar layer, it is stabilized by acquiring a large amount of surface energy from a solid surface having a small water contact angle.

The water contact angle of the substrate surface of the present invention is preferably 35° or less since this allows the obtaining of adequate adhesive strength with the silicon oxide layer.

Further, although surface roughness as measured in the DFM mode reflects surface smoothness of the surface of the cured underlayer at the nano-level, in terms of enhancing adhesive strength with the silicon oxide layer obtained by PE-CVD, suitable surface irregularities defined by a preferable range of surface roughness are preferably present. Surface irregularities refer to those observed in the DFM mode in the form of independent or mutually connected holes and/or projections, and the presence of these surface irregularities is thought to enhance anchoring effects relating to improvement of adhesive strength.

If surface roughness (Ra) of the surface of the cured underlayer of the present invention is less than 0.7 nm, it becomes difficult to obtain an effect that improves adhesive strength, while if surface roughness (Ra) exceeds 10.0 nm, mechanical strength of the surface of the cured underlayer decreases, and there are cases in which this leads to a decrease in adhesive strength as a result thereof, thereby making this undesirable. More preferably, surface roughness (Ra) of the surface of the cured underlayer is within the range of 1.0 nm to 5.0 nm.

Furthermore, in the same manner as previously described, measurement using the DFM mode is preferably carried out under conditions of an observation area of 5 μm square using 256×256 measuring points, and measurements are preferably made in a plurality of regions followed by using the average value thereof.

Curing of the coating layer is preferably carried out by adding a photopolymerization initiator to the cured underlayer coating agent and irradiating with ultraviolet light.

Examples of the photopolymerization initiator include those indicated in the following sections (a) to (d), and these may be used alone or two or more types may be used in combination:

(a) benzophenone and various types of benzophenones such as 3,3'-dimethyl-4-methoxybenzophenone, 4,4'-bisdimethylaminobenzophenone, 4,4'-bisdiethylaminobenzophenone, 4,4'-dichlorobenzophenone, Michler's ketone or 3,3', 4,4'-tetra(t-butylperoxycarbonyl)benzophenone;

(b) xanthones and thioxanthones such as xanthone, thioxanthone, 2-methylthioxanthone, 2-chlorothioxanthone or 2,4-diethylthioxanthone, acylo in ethers such as benzo in, benzo in methyl ether, benzoin ethyl ether or benzoin isopropyl ether;

(c) α-diketones such as benzyl or diacetyl diketones, sulfides such as tetramethylthiuram disulfide or p-tolyl disulfide, benzoic acids such as 4-methylaminobenzoic acid or 4-dimethylaminobenzoic acid; and, (d) 3,3-carbonylbis(7-diethylamino)coumarin, 1-hydroxycyclohexyl phenyl ketone, 2,2'-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyl diphenylphosphine oxide, bis(2,4,6-trimethylbenzoyl)phenylphosphine oxide, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethylsulfide, 2,2'-diethoxyacetophenone, benzyl dimethyl ketal, benzyl-β-methoxyethylacetal, methyl o-benzoylbenzoate, bis(4-dimethylaminophenyl)ketone, p-dimethylaminoacetophenone, α,α-dichloro-4-phenoxyacetophenone, pentyl-4-dimethylaminobenzoate, 2-(o-chlorophenyl)-4,5-diphenylimidazolyl dimer, 2,4-bis-trichloromethyl-6-[di-(ethoxycarbonylomethyl)amino] phenyl-S-triazine, 2,4-bis-trichloromethyl-6-(4-ethoxy) phenyl-S-triazine, 2,4-bis-trichloromethyl-6-(3-bromo-4-ethoxy)phenyl-S-triazine anthraquinone, 2-t-butyl anthraquinone, 2-amyl anthraquinone and β-chloranthraquinone.

Among the aforementioned photopolymerization initiators, the use of one type or a mixed system of two or more types selected from the group consisting of 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, thioxanthone and thioxanthone derivatives, 2,2'-dimethoxy-1,2-diphenylethan-1-one, 2,4,6-trimethybenzoyl diphenylphosphine oxide, bis(2,4,6-trimethylbenzoyl)phenylphosphine oxide, 2-methyl-1-[4-(methylthio)phenyl]-2-morpholino-1-propanone and 2-benzyl-2-dimethylamino-1-(4-morpholinophenyl)-butan-1-one is preferable since activity is indicated for light of a wider range of wavelengths, thereby allowing the obtaining of a highly curable coating.

The amount of the aforementioned photopolymerization initiator used is preferably an amount within a range that allows the function thereof as a photopolymerization initiator to be adequately demonstrated but does not allow the occurrence of crystal precipitation or deterioration of coating properties, and more specifically, the photopolymerization initiator is preferably used within a range of 0.05 to 20 parts by weight, and particularly preferably used within a range of 0.1 to 10 parts by weight, based on 100 parts by weight of the resin composition.

The resin composition of the present invention may further use various photosensitizers together with the aforementioned photopolymerization initiator. Examples of photosensitizers include amines, ureas, sulfur-containing compounds, phosphorous-containing compounds, chlorine-containing compounds, and nitriles and other nitrogen-containing compounds.

An ultraviolet absorber or solvent is further added as necessary to the cured underlayer coating agent of the present invention. An organic or inorganic ultraviolet absorber can be used for the aforementioned ultraviolet absorber, and examples of organic ultraviolet absorbers include triazine derivatives such as 2-[4-{(2-hydroxy-3-dodecyloxypropyl)oxy}-2-hydroxyphenyl]-4,6-bis(2,4-dimethylphenyl)-1,3,5-triazine or 2-[4-{(2-hydroxy-3-tridecyloxypropyl)oxy}-2-hydroxyphenyl]-4,6-bis(2,4-dimethylphenyl)-1,3,5-triazine, as well as 2-(2'-xanthenecarboxy-5'-methylphenyl)benzotriazole, 2-(2'-o-nitrobenzyloxy-5'-methylphenyl)benzotriazole, 2-xanthenecarboxy-4-dodecyloxybenzophenone and 2-o-nitrobenzyloxy-4-dodecyloxybenzophenone. In addition, examples of inorganic ultraviolet absorbers include metal oxide fine particles such as titanium oxide, zinc oxide or cerium oxide fine particles. Among these ultraviolet absorbers, triazine-based ultraviolet absorbers are used particularly preferably from the viewpoints of the intensity and wavelength of ultraviolet absorption, resistance to decomposition and resistance to elution.

There are no particular limitations on the solvent provided it is a solvent that has affinity with both the (meth)acrylic resin and inorganic fine particles present in the coating agent, and examples thereof are as follows:

ketone-based solvents such as acetone, methyl ethyl ketone, methyl n-propyl ketone, methyl isopropyl ketone, methyl n-butyl ketone, methyl isobutyl ketone, methyl n-amyl ketone, methyl n-hexyl ketone, diethyl ketone, ethyl n-butyl ketone, di-n-propyl ketone, diisobutyl ketone, cyclohexanone or isophorone;

ether-based solvents such as ethyl ether, isopropyl ether, n-butyl ether, diisoamyl ether, ethylene glycol dimethyl ether, ethylene glycol diethyl ether, diethylene glycol dimethyl ether, diethylene glycol, dioxane or tetrahydrofuran;

ester-based solvents such as ethyl formate, propyl formate, n-butyl formate, ethyl acetate, n-propyl acetate, isopropyl acetate, n-butyl acetate, n-amyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate or ethyl-3-ethoxypropionate;

alcohol-based solvents such as methanol, ethanol, isopropyl alcohol, n-butyl alcohol, isobutyl alcohol, diacetone alcohol, 3-methoxy-1-propanol, 3-methoxy-1-butanol or 3-methyl-3-methoxybutanol; and, hydrocarbon-based solvents such as toluene, xylene, Solvesso 100, Solvesso 150, Swazol 1800, Swazol 310, Isopar E, Isopar G, Exxon Naphtha No. 5 and Exxon Naphtha No. 6.

These solvents may be used alone or two or more types may be used in combination.

In the case of forming the cured underlayer, the thickness of the cured layer is preferably within the range of 1 to 20 μm, more preferably within the range of 2 to 15 μm, even more preferably within the range of 3 to 10 μm, and most preferably within the range of 4 to 10 μm. If the thickness is less than 1 μm, the thickness is inadequate for absorbing the difference in coefficient of linear expansion with the silicon oxide layer obtained by PE-CVD, thereby resulting in a lack of adhesion in a heat resistance test and the formation of cracks due to thermal stress. In addition, if the thickness exceeds 20 μm, cracks form in the underlayer attributable to stress accompanying cure shrinkage of the layer, or wavy marks remain in the underlayer due to the silicon oxide layer strongly inhibiting expansion of the underlayer during a rise in temperature attributable to a difference in coefficient of linear expansion between the underlayer and the silicon oxide layer.

In the present invention, the surface status of the cured underlayer is preferably controlled and adjusted to a preferable range prior to starting to form the silicon oxide layer by PE-CVD.

Namely, surface roughness (Ra) in the case of having measured the surface of the cured underlayer immediately prior to lamination of the silicon oxide layer by PE-CVD at a water contact angle of 35° or less under observation conditions of measuring 5 μm in all directions in the dynamic mode (DFM) of an atomic force microscope is preferably adjusted to within the range of 0.7 to 10 nm, and an example of a specific method thereof consists of carrying out plasma treatment on the surface of the cured underlayer immediately prior to laminating the silicon oxide layer by PE-CVD.

Plasma treatment refers to a treatment consisting of colliding a gaseous species and electrons imparted with a high level of kinetic energy by plasma excitation with the surface of the cured underlayer, and consists of activation of the surface of the cured underlayer (appearance of active groups due to severing of chemical bonds and crosslinking structure) and aging treatment at those portions where crosslink density of the surface layer is low.

An example of a specific method consists of evacuating the inside of a chamber by drawing a vacuum with a substrate placed on one of the electrodes using a capacitive coupling type of plasma device that uses parallel plate electrodes, followed by allowing a treatment gas to flow in and applying a high-frequency magnetic field (such as that at a frequency of 13.56 MHz) to generate plasma.

The main control parameters of plasma treatment include the type of gas, gas pressure or flow rate (and directly, the gas concentration in the vicinity of the substrate), the applied power of the high-frequency magnetic field (to be referred to as high-frequency applied power), distance between electrodes and treatment time, and these parameters can be used to control treatment intensity.

Although both an inert gas such as argon, helium or krypton, as well as an active gas such as oxygen, nitrogen, water or carbon dioxide in the case of incorporating in a chemically bonded state in the treatment target depending on the plasma excitation conditions, can be used for the gaseous species, in consideration of the object of the present invention, a gas mainly composed of an inert gas is preferable due to the ease of controlling the surface of the cured underlayer, and argon gas is used particularly preferably due to its superior controllability.

Although it is difficult to universally specify preferable ranges for the gas flow rate, high-frequency applied power and distance between electrodes since they are dependent on the surface area of the substrate and electrodes, the volume of the vacuum chamber, the shape of the substrate and the like, in the case of a flat substrate and converting to a surface area in square meters, the gas flow rate is generally within the range of about 1000 sccm to 5000 sccm, and the high-frequency applied power is preferably controlled to within a range of about 2 KW to 7 KW and more preferably 3 KW to 5 KW.

Treatment time is preferably generally within the range of about 1 minute to 20 minutes, more preferably about 2 minutes to 15 minutes and even more preferably about 3 minutes to 10 minutes.

As a result of controlling these treatment parameters, the surface status of the cured underlayer is preferably controlled and adjusted to a preferable range prior to starting to form the silicon oxide layer by PE-CVD.

Furthermore, plasma treatment can also be carried out with a device other than a capacitive coupling type of CVD device that uses parallel plate electrodes as described above, and examples thereof include an inductively coupled CVD device that generates plasma around a substrate by generating a high-frequency magnetic field with a magnetic field coil arranged around the substrate, and a method consisting of allowing gas particles imparted with high energy from a plasma field primarily using an inductively coupled plasma gun to accelerate and collide with a substrate surface by injection pressure or an electromagnetic field.

<Silicon Oxide Layer 80>

With respect to the polymer substrate with hard coating layer of the present invention, examples of configuration requirements required of the silicon oxide layer obtained by PE-CVD in order to realize the three characteristics of a high level of abrasion resistance comparable to that of inorganic glass, boiling water resistance (including adhesion) and heat resistance include film thickness of the silicon oxide layer, mechanical properties (elastic modulus, hardness) and a high degree of compactness with respect to the microstructure of the silicon oxide layer.

(Film Thickness)

The film thickness of the silicon oxide layer obtained by PE-CVD of the present invention is 3.5 μm to 9.0 μm.

In a Taber abrasion test, a thicker film thickness tends to be more favorable, and if the film thickness is less than 3.5 μm, there are many cases in which the increase in haze value (ΔH) under the aforementioned test conditions exceeds 2%, thereby making this undesirable. In terms of obtaining better performance (smaller haze value), film thickness is preferably 4 μm or more and more preferably 4.5 μm or more. On the other hand, accompanying an increase in film thickness or accompanying increases in deposition time of the silicon oxide layer (as related to production cost) and increases in layer internal stress (generated due to differences in the coefficient of thermal expansion between layers or reaction shrinkage of the silicon oxide layer), since these act as negative elements of the reaction system, the upper limit of film thickness is preferably about 9.0 μm.

(Maximum Indentation Depth as Determined by Nanoindentation)

The maximum indentation depth of the silicon oxide layer obtained by PE-CVD as determined by measuring nanoindentation under conditions of a maximum test load of 1 mN in order obtain favorable Taber abrasion resistance is 150 nm or less. This is because, if the maximum indentation depth is greater than 150 nm, the indentation depth of the surface of the silicon oxide layer by abrasive particles demonstrates a relative increase during contact abrasion between the silicon oxide layer obtained by PE-CVD and the abrasive particles, and as a result thereof, the depth of scratches (concave portions formed by abrasion) increases and layer destruction proceeds.

Furthermore, the maximum indentation depth as determined by measuring nanoindentation under these conditions is more preferably 130 nm or less, even more preferably 110 nm or less and most preferably 100 nm or less. Furthermore, in the case of measuring maximum indentation of the surface of a commercially available silicon wafer under these conditions, the resulting value of maximum indentation is about 55 nm, while that in the case of measuring the surface of a commercially available fused quartz plate is about 75 nm to 80 nm.

(Critical Compression Ratio K in 3-Point Bending Test)

The value of critical compression ratio K of the silicon oxide layer obtained by PE-CVD as defined in the following formula (1) in a 3-point bending test, which imparts indentation displacement in which the surface laminated with the silicon oxide layer becomes concave, is 0.975 or less.

$$K=(R-D/2)/R-(0.00215 \times d) \qquad \text{Formula (1)}$$

Figure 6:
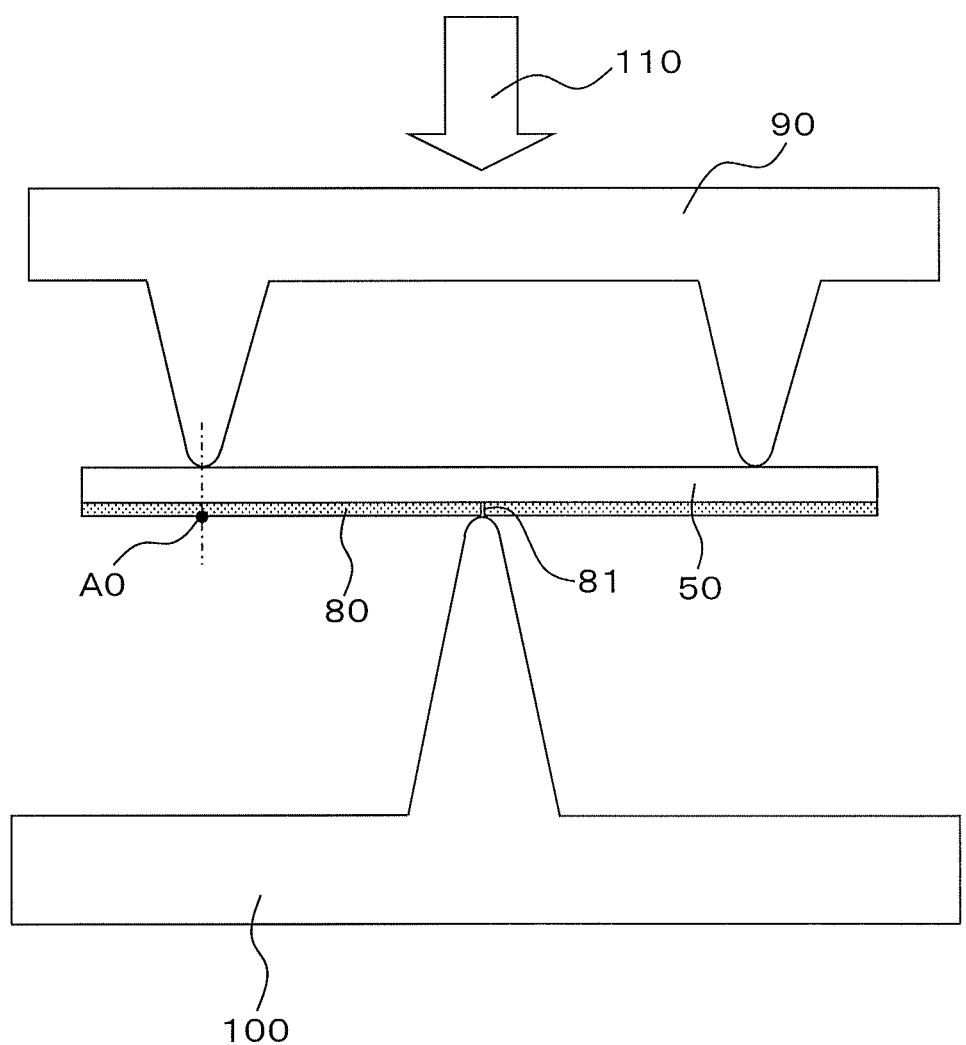
FIG. 6 is a schematic diagram of a 3-point bending test (sample placement stage, prior to generation of bending displacement) carried out on the polymer substrate with hard coating layer of the present invention.
Figure 7:
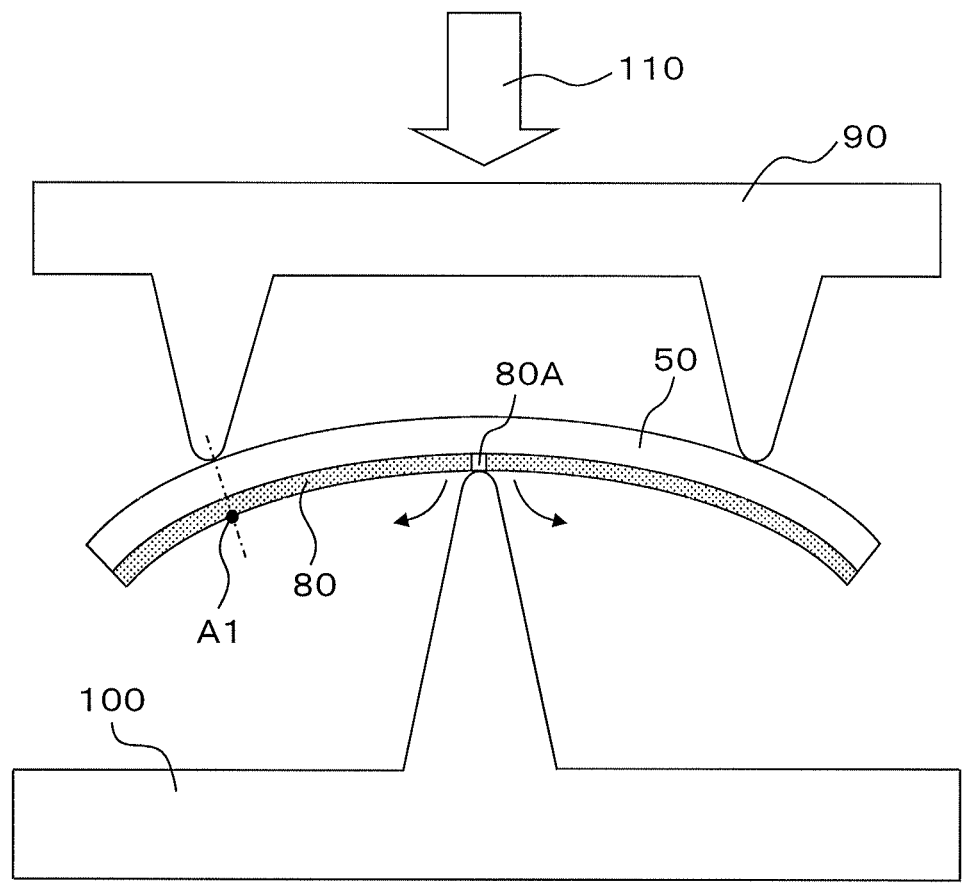
FIG. 7 is a schematic diagram of a 3-point bending test (test in progress, during generation of bending displacement) carried out on the polymer substrate with hard coating layer of the present invention.

Here, as indicated in the schematic diagram of a 3-point bending test exemplified in FIGS. 6 and 7, D represents the total thickness (mm) of the polymer substrate with hard coating layer, d represents the film thickness (μm) of the silicon oxide layer, G represents the distance (mm) between two end fulcrum points in a 3-point bending tester, δL and R respectively represent indentation displacement (mm), measured when the silicon oxide layer begins to separate from a cut line (separation starting line) drawn in advance at the location of the central fulcrum point, and the bend radius (mm) of the polymer substrate with hard coating layer when subjected to 3-point bending deformation during a 3-point bending test.

Figure 9:
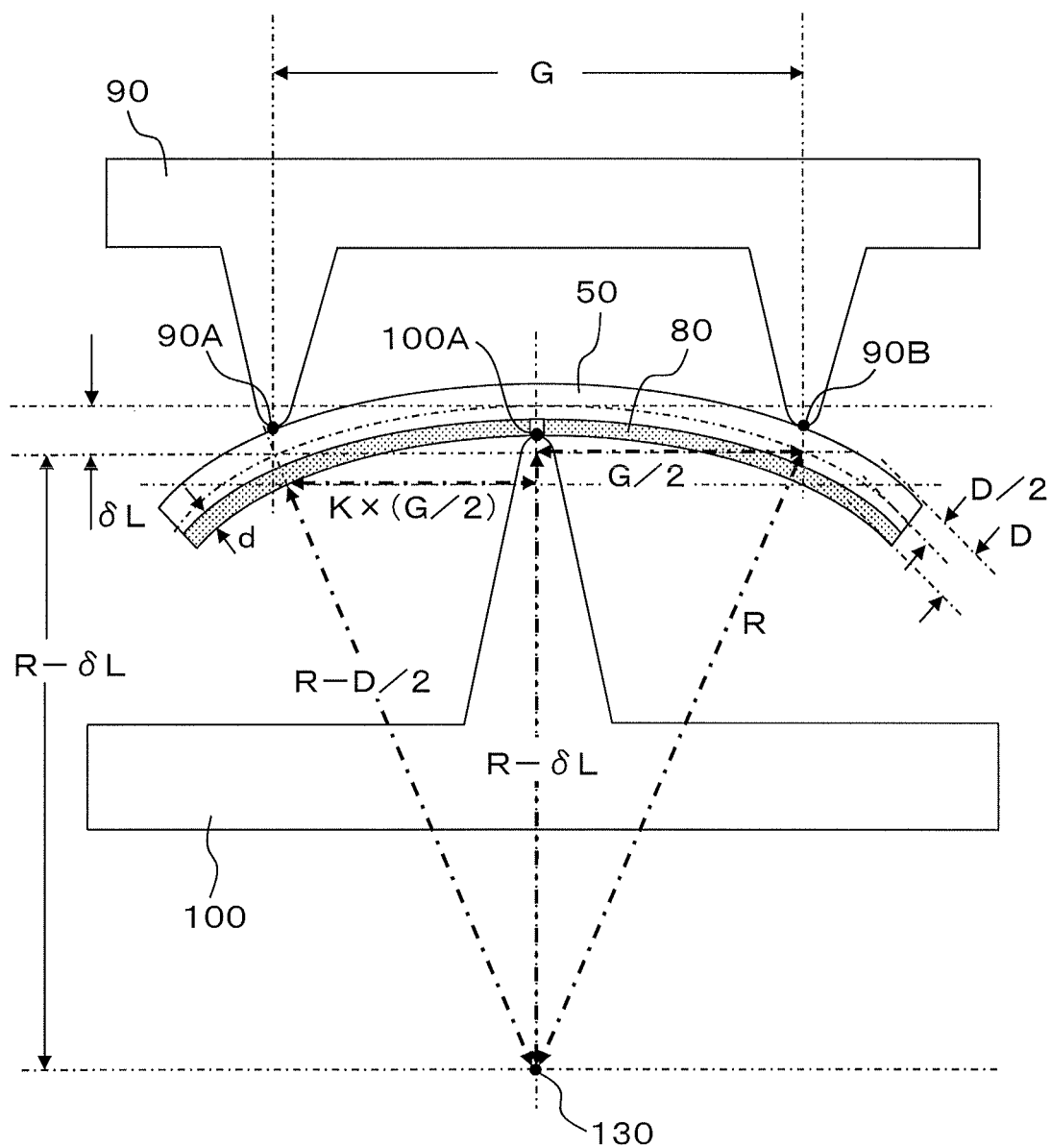
FIG. 9 is an explanatory drawing relating to calculation of critical compression ratio from the results of a 3-point bending test.

This critical compression ratio is a value that indicates resistance of the silicon oxide layer to compressive stress, and in the case of causing bending deformation in a direction in which the surface on which the silicon oxide layer is laminated becomes concave using the 3-point bending tester exemplified in FIGS. 6, 7 and 9 followed by increasing that amount of deformation over time, is defined as the value obtained by subtracting a correction term (0.00215×d) relating to the thickness of the silicon oxide layer based on dimensional compression ratio (dimension at start of separation in the lengthwise direction/ratio of initial dimension) when the silicon oxide layer is unable to withstand compressive deformation causing the silicon oxide layer alone to undergo spontaneous separation at the interface with the underlayer. Furthermore, this critical compression ratio has been originally defined and introduced by the inventors of the present invention for the purpose of representing and defining the novel characteristics relating to the materials and physical properties of the polymer substrate with hard coating layer of the present invention.

Figure 8:
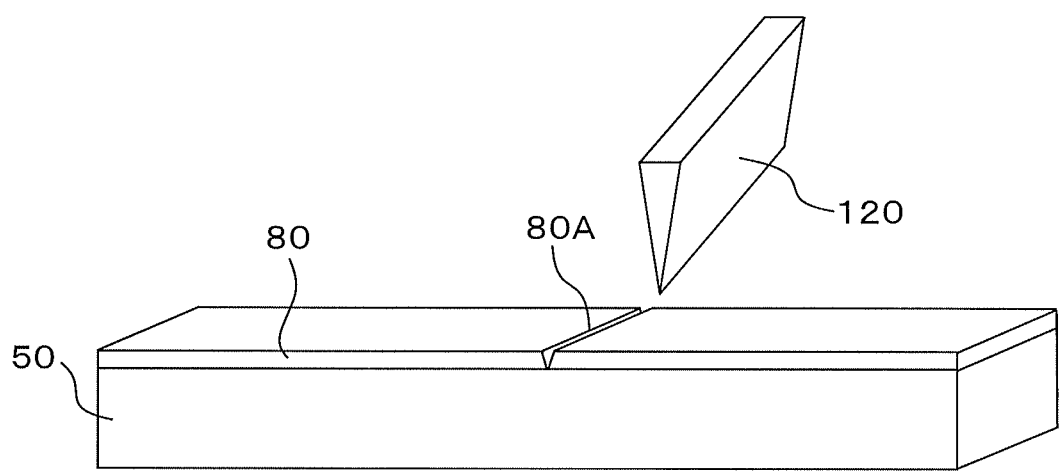
FIG. 8 is a diagram for explaining a cut line (separation starting line) of a 3-point bending test.

More specifically, indentation displacement (δL) at the start of separation is measured followed by calculating critical compression ratio according to formula (1). Furthermore, a cut line serving as the origin for the start of destruction is preliminarily made with a cutter knife in the silicon oxide layer to ensure stable measured values as shown in FIG. 8.

Furthermore, although the total thickness (D) of the polymer substrate with hard coating layer and the thickness (d) of the silicon oxide layer are included in formula (1), this is because the indentation displacement (δL) serving as the primary measurement value of this test is dependent on these two elements. Conversely, in the case of measuring using constant values for D and d, a favorable performance correlation can be obtained with a relative value of δL only.

Namely, the inventors of the present invention found that, if this value of critical compression ratio K is 0.975 or less, superior performance is demonstrated in a boiling water test used as a representative test of environmental resistance of a polymer substrate with hard coating layer laminated with the silicon oxide layer obtained by PE-CVD. In the case the value of critical compression ratio K exceeds 0.975, there are many cases in which exacerbation of boiling water performance (consisting mainly of the occurrence of peeling and lifting of the silicon oxide layer) is observed, thereby making this undesirable. Furthermore, the value of critical compression ratio K is more preferably 0.973 or less and even more preferably 0.972 or less.

(Ratio of Infrared Absorbance)

In addition, the ratio of infrared absorbance at a wave number of 930 cm$^{-1}$ to that at a wave number of 1020 cm$^{-1}$ ($\alpha_{930}/\alpha_{1020}$) of the silicon oxide layer obtained by PE-CVD is preferably 0.30 or less. Here, infrared absorbance α is represented by α=−Log T/100 (wherein, T represents the infrared transmittance of the sample).

With respect to calculating absorbance, absorption spectrum is preferably measured by ATR for the surface on which is formed the silicon oxide layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ from the value on this absorbance spectrum from 650 cm$^{-1}$ to 1500 cm$^{-1}$.

Baseline $\alpha_{B930}$ at a wave number of 930 cm$^{-1}$ =

$$\alpha_{B930} = \alpha_{1330} + (\alpha_{1330} - \alpha_{1430})/100 \times (1330 - 930) =$$

$$\alpha_{1330} + (\alpha_{1330} - \alpha_{1430}) \times 4$$

Baseline $\alpha_{B1020}$ at a wave number of 1020 cm$^{-1}$ =

$$\alpha_{1330} + (\alpha_{1330} - \alpha_{1430})/100 \times (1330 - 1020) =$$

$$\alpha_{1330} + (\alpha_{1330} - \alpha_{1430}) \times 3.1$$

Here, the infrared absorbance at a wave number of 930 cm$^{-1}$ reflects the relative content of Si—OH groups, and as this value becomes larger following the formation of Si—OH groups by oxidative degradation of the raw material organic silicon compound during PE-CVD deposition, the dehydration condensation reaction thereof and the progression of crosslinking to the formation of a three-dimensional Si—O—Si network structure become inadequate, resulting in a relative decrease in thermal stability.

If the infrared absorbance ratio at a wave number of 930 cm$^{-1}$ to that at a wave number of 1020 cm$^{-1}$ ($\alpha_{930}/\alpha_{1020}$), as determined by measuring the infrared absorption spectrum of the silicon oxide layer obtained by PE-CVD, is 0.30 or less, superior heat resistance (as determined by a heat resistance test conducted by allowing to stand at a high temperature) is demonstrated, thereby making this preferable. In contrast, in the case this ratio ($\alpha_{930}/\alpha_{1020}$) exceeds 0.30, a decrease in heat resistance is observed and thermal stability becomes low, thereby making this undesirable. In addition, there is no particular lower limit value of the preferable range. Furthermore, in actuality, the preferred ratio ($\alpha_{930}/\alpha_{1020}$) varies somewhat according to the required level of heat resistance (as determined under the conditions for carrying out a heat resistance test) of each type of application of the polymer substrate with hard coating layer of the present invention, and in order to be able to withstand even higher levels, this ratio ($\alpha_{930}/\alpha_{1020}$) is more preferably 0.28 or less, even more preferably 0.26 or less and most preferably 0.24 or less.

The ratio of infrared absorbance at a wave number of 1280 cm$^{-1}$ to that at a wave number of 1020 cm$^{-1}$ ($\alpha_{1280}/\alpha_{1020}$) of the silicon oxide layer obtained by PE-CVD of the present invention based on measurement of the infrared absorption spectrum of that layer is preferably within the range of 0.002 to 0.020. Here, infrared absorbance at a wave number of 1020 cm$^{-1}$ indicates the degree of formation of a three-dimensional Si—O—Si network structure, while the infrared absorbance at a wave number of 1280 cm$^{-1}$ reflects the relative content of Si—CH$_3$ groups in the silicon oxide layer obtained by PE-CVD.

Here, infrared absorbance α is represented by α=−Log T/100 (wherein, T represents the infrared transmittance of the sample).

With respect to calculating absorbance, absorption spectrum is preferably measured by ATR for the surface on which is formed the PE-CVD layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ equal from the value on this absorbance spectrum from 650 cm$^{-1}$ to 1500 cm$^{-1}$.

Baseline $\alpha_{B1020}$ at a wave number of 1020 cm$^{-1}$ =

$$\alpha_{1330} + (\alpha_{1330} - \alpha_{1430})/100 \times (1330 - 1020) =$$

$$\alpha_{1330} + (\alpha_{1330} - \alpha_{1430}) \times 3.1$$

Baseline $\alpha_{B1280}$ at a wave number of 1280 cm$^{-1}$ = $(\alpha_{1260} + \alpha_{1300})/2$ The reason for favorable boiling water performance within the aforementioned range is presumed to be, since the silicon oxide layer obtained by PE-CVD contains a small amount of Si—CH$_3$ groups therein, it demonstrates suitable flexibility, thereby demonstrating the effect of inhibiting concentration of stress in the layer. In the case the ratio of infrared absorbance at a wave number of 1280 cm$^{-1}$ to that at a wave number of 1020 cm$^{1}$ ($\alpha_{1280}/\alpha_{1020}$) is less than 0.002, boiling water performance decreases, thereby making this undesirable, while in the case this ratio ($\alpha_{1280}/\alpha_{1020}$) exceeds 0.020, there are cases in which a decrease in abrasion resistance and the like is observed, thereby making this undesirable. Furthermore, this ratio ($\alpha_{1280}/\alpha_{1020}$) is more preferably 0.003 to 0.016, even more preferably 0.004 to 0.014 and most preferably within the range of 0.005 to 0.012.

(Maximum Indentation Depth as Determined by Nanoindentation)

With respect to the hardness (abrasion resistance) of the silicon dioxide layer obtained by PE-CVD of the present invention, the silicon oxide layer obtained by PE-CVD preferably has high hardness in terms of obtaining superior Taber abrasion resistance, and indentation depth as determined by measuring nanoindentation under conditions of a maximum test load of 1 mN is preferably 3.0 GPa or more. This is because, in the case this layer has high hardness, the size of scratches caused by abrasive particles and the like can be reduced.

In addition, similar to measurement of maximum indentation hardness as previously described, measurement of nanoindentation is preferably carried out using the ENT-2100 Nanoindentation Hardness Tester manufactured by Elionix Inc. Furthermore, indentation hardness as determined by measuring nanoindentation under these conditions is more preferably 4.0 GPa or more and most preferably 5.0 GPa or more.

(Surface Roughness (Ra))

With respect to the compactness of the silicon oxide layer obtained by PE-CVD of the present invention and in terms of obtaining superior Taber abrasion resistance, the silicon oxide layer obtained by PE-CVD preferably has a compact fine structure, and surface roughness (Ra), as determined by measuring the surface of the silicon oxide layer in the dynamic force mode (DFM) of a scanning probe microscope under conditions of observing by 5.0 µm square is preferably 5.0 nm or less.

DFM is a measuring method that uses a scanning probe microscope that carries out measurement in a vibrational mode (dynamic force mode), and since it causes little abrasion with a sample surface and there is little effect of surface charging on measurements, it is effective for observing the surface of the silicon oxide layer obtained by PE-CVD which is frequently electrically insulated.

According to observing a surface by DFM, the silicon oxide layer obtained by PE-CVD undergoes vapor phase growth in the form of nanometer-sized fine particles, and a layer is formed of a form in which these fine particles accumulate on each other. Although surface roughness and surface area ratio of a layer surface are dependent on PE-CVD deposition conditions, a silicon oxide layer in which surface roughness measured under conditions of observing by 5 µm square is 5.0 nm or less demonstrates high layer compactness, is structurally stable, and is highly resistance to surface abrasion. If surface roughness exceeds 5.0 nm, fine particles undergoing vapor phase growth increase in size and layer compactness decreases resulting in a relatively sparse structure, thereby resulting in a decrease in resistance to surface abrasion, while there are also many cases in which an increase in haze value (ΔH) according to the conditions of the aforementioned Taber abrasion test exceeds 2%, thereby making this undesirable. In order to obtain even greater abrasion resistance, surface roughness is more preferably 4.0 nm or less and even more preferably 3.0 nm or less.

Furthermore, with respect to measuring surface roughness (Ra) and surface area ratio by DFM, since there are cases in which discrepancies occur attributable to the measuring device, cantilever used and measurement conditions, the SP13800N scanning probe microscope manufactured by Hitachi High-Tech Science Corp. is preferably used for the measuring device, the NSG10 manufactured by NT-MDT Corp. is preferably used for the cantilever, and measurement is preferably carried out under conditions of an observation area of a square measuring 5 µm on a side and measuring 256×256 measurement points. Measurements are preferably made in a plurality of regions followed by using the average value thereof, and in the present invention, measurements are carried out at 10 or more points.

(Average Deposition Rate)

The silicon oxide layer obtained by PE-CVD is preferably formed at a low average deposition rate (mm/sec) between the initial point of the start of deposition, such as the start of deposition, and 30 seconds or 60 seconds thereafter of deposition.

As a result of making this deposition rate to be low, the particle size of the silicon oxide layer obtained by PE-CVD formed (during initial deposition) in the vicinity of the interface with the cured underlayer can be reduced, and as a result thereof, a layer of high compactness is obtained. In addition, it is also possible to obtain time for the reaction degradation products of PE-CVD method to permeate into the cured underlayer, thereby enhancing the introduction rate of Si—O—Si bonds between layers and allowing the obtaining of an anchoring effect as previously described.

If this deposition rate is too high, the particle size of the silicon oxide layer obtained by PE-CVD becomes relatively large, layer compactness decreases and adhesive strength with the cured underlayer tends to decrease, thereby making this undesirable. This deposition rate is more preferably 1.0 nm/sec or less, 0.8 nm/sec or less and even more preferably 0.6 nm/sec or less.

Furthermore, the amount of time required to deposit the layer at a low deposition rate is preferably within the range of 30 seconds to 180 seconds after the start of deposition. This is because, due to the high compactness and high flexibility of this layer, interfacial stress with the cured underlayer increases accompanying an increase in deposition time, namely an increase in layer thickness, thereby resulting in cases in which adhesive strength decreases. Deposition time is more preferably within the range of 30 seconds to 120 seconds and even more preferably within the range of 30 seconds to 90 seconds.

In order to ensure adhesion between the cured underlayer and silicon oxide layer by inhibiting increases in interface stress with the cured underlayer and to alleviate the effects of compressive stress and tensile stress caused by differences in coefficient of thermal expansion, the silicon oxide layer is preferably deposited at a low deposition rate over a prescribed amount of time followed by increasing the deposition rate. Increasing the deposition rate makes it possible to enhance productivity of silicon oxide layer deposition. The increased deposition rate in this case is for example, 2 nm/sec or more, 3 nm/sec or more, 4 nm/sec or more, 5 nm/sec or more, 7 nm/sec or more or 10 nm/sec or more.

Switching from a low deposition rate to a high deposition rate by changing the deposition rate continuously or incrementally in two or more steps is preferable since continuity is maintained between layers obtained at the low deposition rate and layers obtained at the high deposition rate, thereby inhibiting peeling.

(Plasma Generation Method)

In the PE-CVD method of the present invention, examples of methods used to generate plasma using excitation of decomposition and condensation reactions of the raw material silicon oxide compound include a method using a capacitive coupling type of plasma device that generates plasma in the space between parallel plates using opposing parallel plate electrodes, a method using an inductively coupled plasma device that generates plasma in the space within a coil using an electromagnetic coil, and a device that collides gas particles imparted with high energy by a plasma field onto a substrate surface by accelerating with injection pressure of an electromagnetic field by primarily using an inductively coupled plasma gun (and this includes atmospheric pressure plasma devices of this type).

Among these, a method using a capacitive coupling type of plasma device enabling superior stability and uniform control of plasma density is preferable. In particular, a device having a cooling mechanism provided with water or other coolant pipes within the electrodes and in which the electrode that holds and immobilizes the substrate is also provided with a heat sink function is preferable, and is preferably able to effectively carry out cooling (heat dissipation) of the substrate, which undergoes a rise in temperature as a result an influx of heat and so forth from the contact surface with high energy plasma, by holding and immobilizing the polymer substrate in a state in which it makes surface contact with one of the parallel plate electrodes.

In addition, in the case the polymer substrate has a three-dimensional or two-dimensional shape or a curved shape, the electrode having the aforementioned heat sink function is preferably preliminarily processed into a shape that matches the shape of the polymer substrate so as to afford surface contact therewith. In addition, metal attachments having various shapes corresponding to the shape of each substrate are processed and prepared so as to be able to adapt to numerous types of substrate shapes, and can preferably be attached and removed corresponding to substrate shape.

Furthermore, a material that is resistant to corrosion and degenerative corrosion attributable to plasma is preferable for the material of the metal used for the electrodes, and examples thereof include stainless steel (SUS) and aluminum.

In a capacitive coupling type of plasma device, an external electrode type, in which high-frequency electrodes are installed outside the vacuum chamber (reaction vessel), or an internal electrode type, in which high-frequency electrodes are installed inside the vacuum chamber (reaction vessel), can be used.

Although a high-frequency power supply is used to input high-frequency electrical power, the frequency thereof is a frequency designated as an industrial frequency band according to the Radio Act, and although examples thereof include frequencies of 13.56 MHz, 27.12 MHz, 40.68 MHz, 85 MHz. 2.45 GHz, 5.8 GHz and 22.125 GHz, that having a frequency of 13.56 MHz can be used most commonly.

Although the applied power during input of high-frequency electrical power (to be referred to as high-frequency applied power) varies according to the type of raw material used and size of the PE-CVD device (size of the substrate), it is generally about 50 W to 10000 W. However, since many commercially available, commonly used power supplies have an applied power of 5000 W or less, input electrical power is preferably controlled to 5000 W or less.

Furthermore, although the high-frequency applied power is preferably applied continuously, a portion thereof may also be applied in the form of intermittent pulses as necessary.

The degree of vacuum of the vacuum chamber (reaction vessel) in terms of the ultimate vacuum of the vacuum chamber (reaction vessel) prior to carrying out each step is preferably $10^{-2}$ Pa or less and more preferably $10^{-3}$ Pa or less. In addition, the degree of vacuum when forming the silicon oxide layer by PE-CVD or during plasma treatment is preferably 20 Pa or less and more preferably 10 Pa or less from the viewpoints of stable continuation of plasma and ensuring uniformity, and is preferably typically $1\times10^{-2}$ Pa or more.

(Deposition Raw Materials and Conditions)

Organic silicon compounds containing a carbon atom or organic silicon compounds containing a carbon atom, oxygen atom or nitrogen atom are preferable for the raw material organic silicon compound used during formation of the silicon oxide layer by PE-CVD, and more specifically, an organosiloxane, organosilane or (organo)silazane and the like can be used preferably.

Specific examples of organic silicon compounds that can be used include tetramethoxysilane, vinyltrimethoxysilane, octamethylcyclotetrasiloxane, tetraethoxysilane, hexamethylcyclotrisiloxane, octamethyltrisiloxane, hexamethyldisiloxane, hexaethyldisiloxane, hexaethylcyclotrisiloxane, tetramethylsilane, 1,1,3,3-tetramethyldisiloxane, 1,1,3,3-tetramethyldisilazane, pentamethyldisiloxane, hexamethyldisilazane, heptamethyldisilazane, 1,3-dimethoxytetramethyldisiloxane, 1,3-diethoxytetramethyldisiloxane, hexamethylcyclotrisilazane, 1,1,3,3,5,5-hexamethyltrisiloxane, 1,1,1,3,5,5,5-heptamethyltrisiloxane, 1,3,5,7-tetramethylcyclotetrasiloxane, 1,1,1,3,5,7,7,7-octamethyltetrasiloxane, 1,1,3,3,5,5,7,7-octamethylcyclotetrasilazane, 1,3,5,7-tetramethylcyclotetrasiloxane, tris(trimethylsiloxy) silane and tetramethyltetrasiloxane.

One type of these organic silicon compounds can be used alone or two more types can be used in combination. In addition, a gas such as oxygen, nitrogen, argon, helium or hydrogen (to be referred to as carrier gas) is preferably used in combination for the purpose of promoting decomposition and condensation of these organic silicon compounds in a gaseous plasma composition or control the chemical composition of the silicon oxide layer formed (represented by SiOxCyHz). The organic silicon compound and carrier gas can be preliminarily mixed and then supplied to the vacuum reaction vessel of the plasma polymerization device, or can be separately supplied to this vacuum reaction vessel and then mutually mixed therein.

In the case of using oxygen for the carrier gas, although the ratio of oxygen to organic silicon compound cannot be universally defined since it varies according to the type of organic silicon compound used and desired chemical composition and film thickness of the silicon oxide layer, it is suitably selected from a range of about 5 times to 500 times, and more preferably about 10 times to 100 times, the volume of a water vapor of the organic silicon compound.

Although it is difficult to universally define a preferable range for the gas flow rate, high-frequency applied power and distance between electrodes during deposition since they are dependent on such factors as the areas of the substrate and electrodes, volume of the vacuum chamber and shape of the substrate, in the case of, for example, a flat substrate and converting to a substrate area in square meters, the total gas flow rate combining the raw material organic silicon compound and the carrier gas is generally within the range of about 1000 sccm to 5000 sccm, the high-frequency applied power is preferably controlled to within a range of about 2 KW to 7 KW and more preferably 3 KW to 5 KW, and the distance between electrodes is preferably controlled to about 80 mm to 300 mm.

Deposition time of the silicon oxide layer is preferably within the range of about 1 minute to 30 minutes, more preferably about 2 minutes to 20 minutes, and even more preferably about 3 minutes to 10 minutes. Furthermore, deposition can be divided into separate deposition times as necessary, mutually partitioned with a partition wall, or deposition may be carried out separately in a plurality of vacuum chambers capable of being interconnected by an inline system and the like.

In addition, in the silicon oxide layer deposition step, the flow rates of the raw material organic silicon compound and carrier gas and/or the high-frequency applied power and frequency and the like are preferably changed over time as necessary. Each flow rate, high-frequency applied power and frequency may be changed independently or simultaneously.

Figure 1:
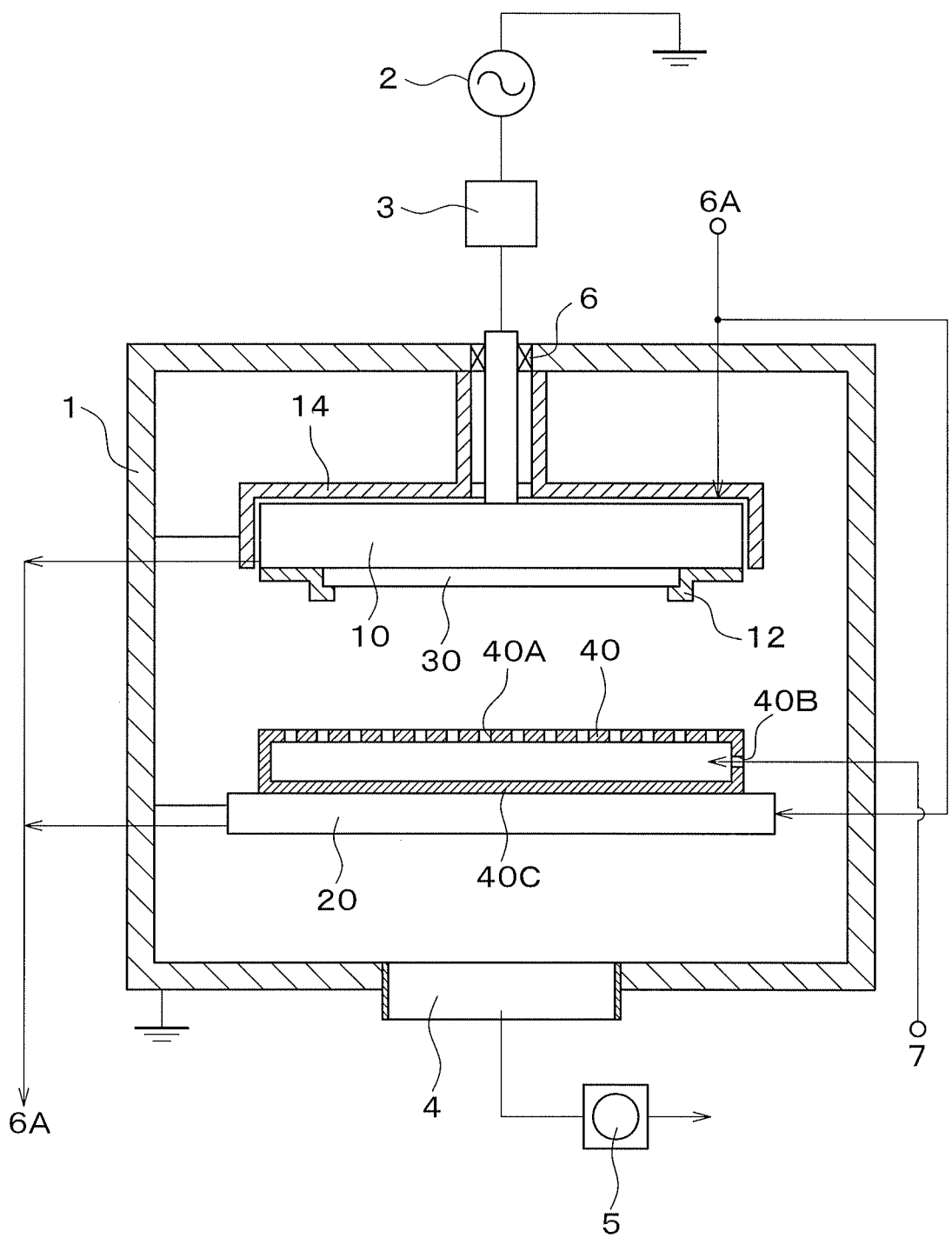
FIG. 1 is a schematic diagram of one example of a capacitive coupling type of PE-CVD device able to be used to form the silicon oxide layer of the present invention by PE-CVD.

FIG. 1 shows one example of a capacitive coupled type of CVD device able to be preferably used to form the polymer substrate with hard coating layer of the present invention. Furthermore, in this drawing, although a first electrode 10, a second electrode 20, a treated substrate 30 and an introducing head 40 are arranged in the vertical direction, they can also be arranged in a row in the horizontal direction.

In the example shown in this drawing, the first electrode (cathode electrode) 10 and the second electrode (anode electrode) 20 are arranged in mutual opposition within a vacuum vessel. A treated substrate in the form of a polymer substrate 30 is arranged on the surface of the first electrode 10 and supported by a holder 12. The inside of the vacuum vessel 1 is reduced in pressure by a vacuum pump 5 through an exhaust port 4, and while reaction gas 7 is introduced into the vacuum vessel 1 though the introducing head 40 from the outside, plasma of the reaction gas is formed between the first electrode (cathode electrode) 10 and the second electrode (anode electrode) 20.

The first electrode (cathode electrode) 10 is connected to a power supply 2 through a matching box 3. The first electrode 10 is insulated from the vacuum vessel 1 by an insulating seal 6. In addition, although not in detail in the drawing, a cooling medium 6A flows through the first electrode (cathode electrode) 10, and the polymer substrate 30 is cooled by cooling and dissipating heat through the interface between the first electrode 10 and the polymer substrate 30. Moreover, a shielding component 14 is provided at a slight interval on the outer periphery of the first electrode (cathode electrode) 10 with the exception of the surface opposing the second electrode (anode electrode) 20. In addition, the second electrode (anode electrode) 20 is grounded.

Figure 3:
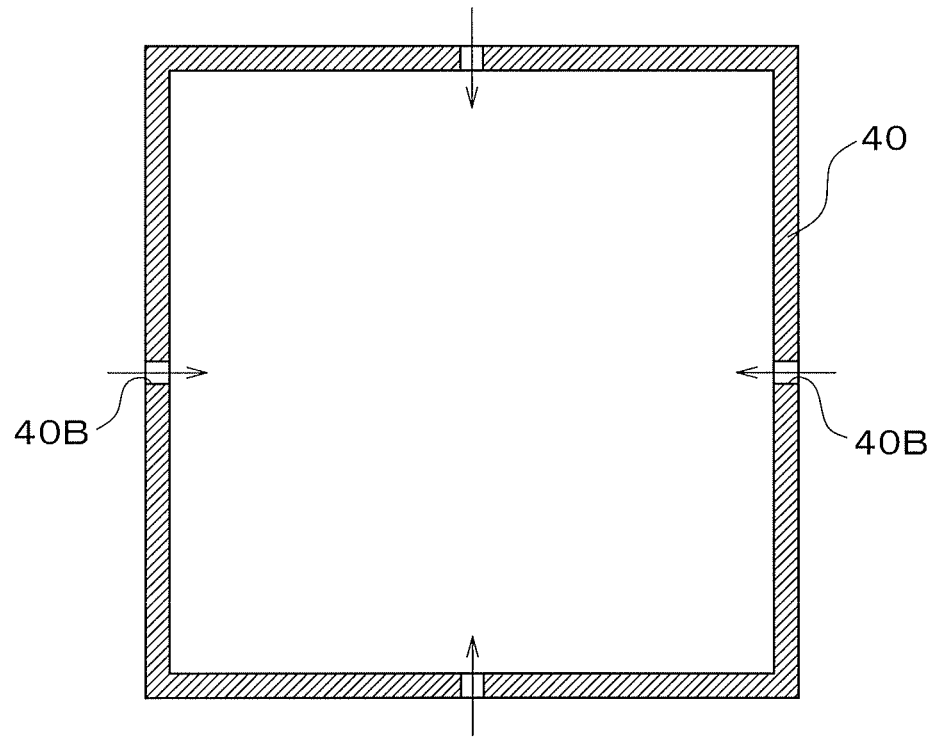
FIG. 3 shows an example of a reactive gas introducing head provided on an electrode in a capacitive coupling type of PE-CVD device able to form the silicon oxide layer of the present invention by PE-CVD, with (a) depicting a horizontal cross-sectional view and (b) indicating the arrangement (example) of a large number of gas blowout holes provided in a surface on the side opposing a treated substrate.
Figure 3:
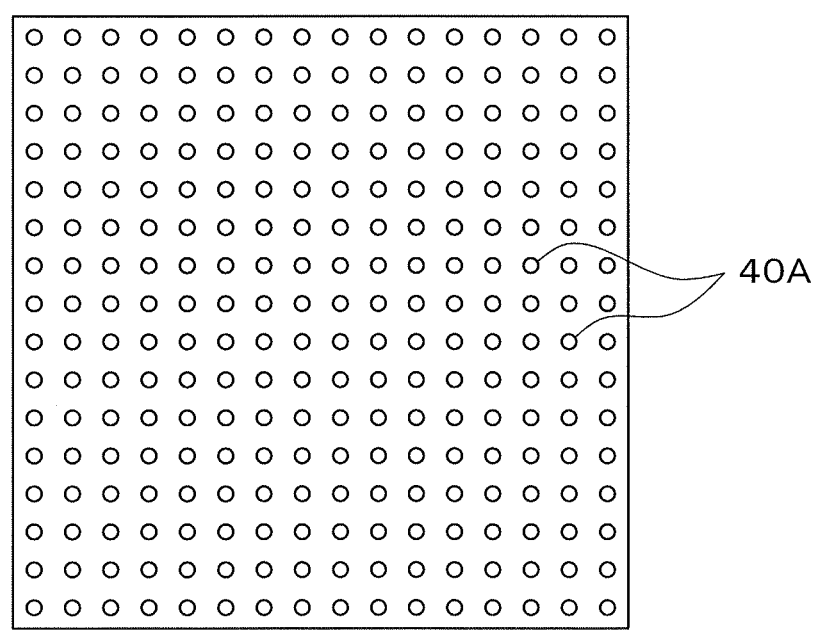

In the example shown in this drawing, a box-shaped introducing head 40 for introducing the reaction gas 7 is provided between the treated substrate in the form of the polymer substrate 30 and the second electrode (anode electrode) 20. As indicated with one example of the shape thereof in FIG. 3, the introducing head 40 has a large number of gas blowout holes 40A in the wall surface on the side opposing the first electrode (cathode electrode) 10, and the reaction gas 7 is introduced into the introducing head 40 through inlets 40B. The introducing head 40 is configured so that the reaction gas 7 that has been introduced into the introducing head 40 is blown out from the blowout holes 40A onto a side of the first electrode (cathode electrode) 10, namely towards the polymer substrate 30 held on the surface of the first electrode (cathode electrode) 10.

Although the introducing box is preferably in the shape of a flat box, the specifications thereof are not limited to those shown in the drawing, but rather the shape of the box and the shape, size, formation density, interval or distribution and the like of the blowout holes 40A can be adjusted as desired according to the shape and dimensions of the treated substrate in the form of the polymer substrate 30. However, in the case of a large number of the blowout holes 40A, the introducing head is preferably circular having a diameter of about 2 mm to 7 mm, and the interval between holes (pitch) is preferably about 4 mm to 20 mm.

In the case the polymer substrate has a two-dimensional, three-dimensional or curved shape, the space between the polymer substrate and the electrode on which the polymer substrate is held and immobilized preferably ensures surface adhesion whenever possible, and a gap is preferably prevented from being formed between the two. This is due to the need for cooling the polymer substrate, plasma uniformity and stability, and if a prominent gap is present, there are many cases in which problems such as a significant rise in the temperature of the polymer substrate or the occurrence of abnormal discharge in the plasma space are actualized, thereby making this undesirable. Thus, at least the shape of the electrode on the side on which the polymer substrate is held and immobilized preferably matches the shape of the polymer substrate and is formed to a similar shape.

Figure 2:
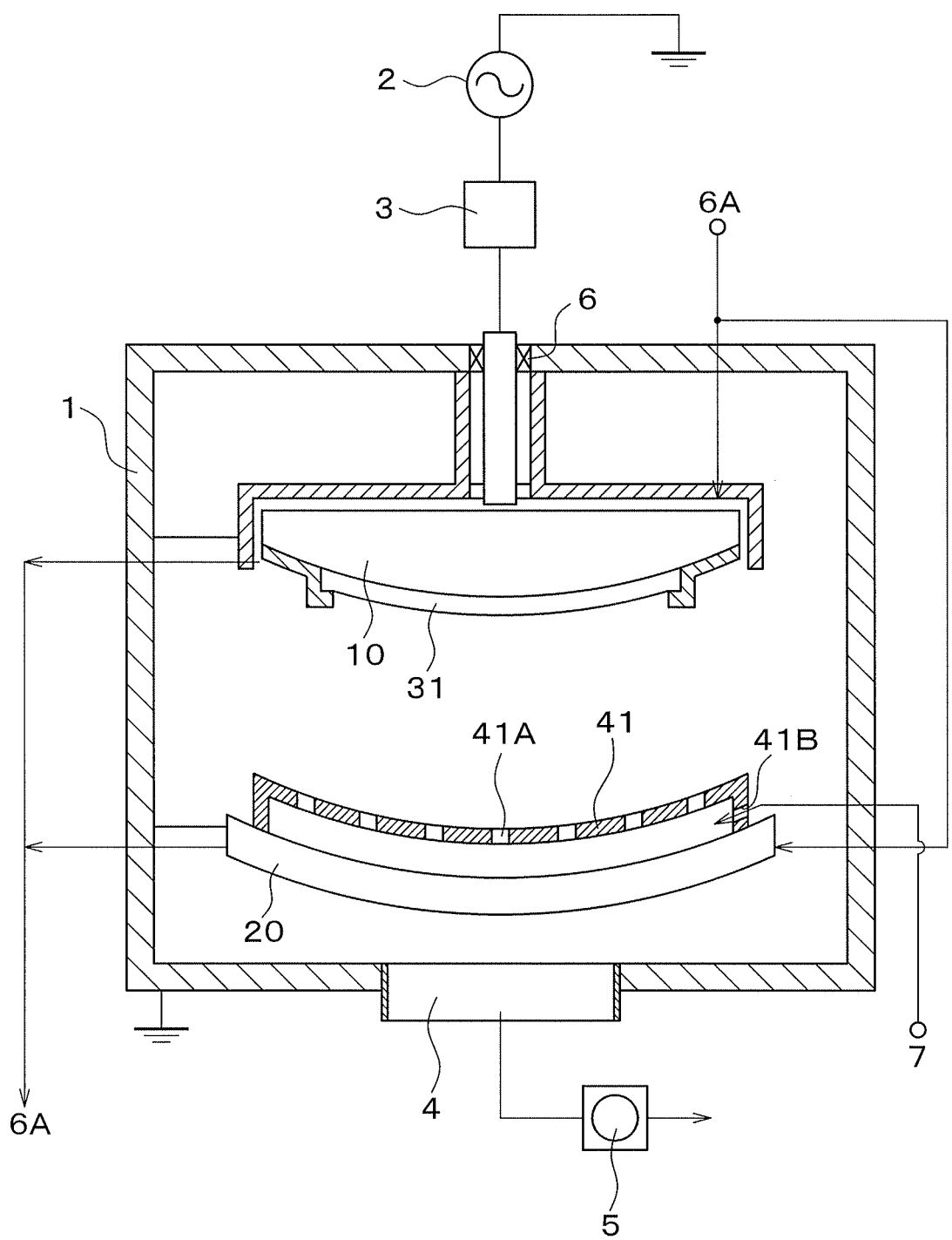
FIG. 2 is a schematic diagram of another example of a capacitive coupling type of PE-CVD device able to be used to form the silicon oxide layer of the present invention by PE-CVD.

FIG. 2 shows another example of a capacitive coupled type of CVD device that can be preferably used to form the polymer substrate with hard coating layer of the present invention, and indicates an example of the specifications of a preferable device in the case the treated substrate in the form of the polymer substrate 30 has a curved shape.

In the example shown in this drawing, the first electrode (cathode electrode) 10, the second electrode (anode electrode) 20 and an introducing head 41 each have a curved shape similar to the curved shape of a polymer substrate 31. In the case of adopting such a configuration, the density distribution of the reaction gas 7 and the uniformity of the distribution of high-frequency electrical power (spatial electrical field, spatial current) are enhanced in the plasma reaction space interposed between the polymer substrate 30 on the first electrode (cathode electrode) 10 and the introducing head 41 on the second electrode (anode electrode) 20, thereby making this preferable.

<Lamination of Functional Layers>

In the polymer substrate with hard coating layer of the present invention, a functional layer such as fouling prevention layer or antistatic layer may be further laminated on a surface layer, electrically conductive layer or silicon oxide layer obtained by PE-CVD formed on an infrared absorbing/reflecting layer on one side or both sides thereof as necessary.

A fouling prevention layer is a layer having a function that inhibits the adhesion of fingerprints or dirt to the silicon oxide layer obtained by PE-CVD or the formation of scale based on long-term use in an outdoor environment, and is a layer having an effect that continuously enhances surface water repellency, oil repellency, hydrophilicity or lipophilicity over a long period of time according to the particular objective. This layer is preferably formed into a thin film having a thickness of several nanometers to several hundred nanometers, and specific examples of the effects thereof include water repellency and/or oil repellency demonstrated by a layer obtained by decomposing and condensing a silicon compound having a fluoroalkyl group, and hydrophilicity and/or lipophilicity demonstrated by a titanium oxide layer, zinc oxide layer, niobium oxide layer or cerium oxide layer. With respect to the latter hydrophilic and/or lipophilic layer in particular, in the case of a layer having a photocatalytic function that acts as an oxidation-reduction catalyst when excited by ultraviolet light or light in the visible light region, a self-cleaning effect is obtained that enables dirt adhered to the outermost surface to be degraded and washed off due to the combined actions of sunlight and rain in an outdoor environment, thereby making this preferable.

In addition, examples of an antistatic layer (layer having electrical conductivity) include transparent electrically conductive layers (such as ITO or IZO) composed of metal oxides having indium oxide, tin oxide or zinc oxide and the like as a main component thereof, and transparent electrically conductive layers obtained by dispersing an electrically conductive material such as a metal, metal oxide or carbon in a layer obtained by hydrolytic condensation of an organic silicon compound.

In addition, examples of an electrically conductive layer include a layer obtained by printing the aforementioned transparent electrically conductive layer, an electrically conducive paste obtained by dispersing silver, copper or other metal fine particles having superior electrical conductivity in a resin binder, and a layer formed by mechanically punching out a metal thin plate or metal foil or forming an electrically conductive pattern by chemical etching, and can also be used as a heating layer based on the application of current to the electrically conductive layer (in order to remove fogging or frost caused by water vapor having condensed on a laminate surface) or as an antenna for transmitting and receiving radio waves or as an electromagnetic wave shielding layer.

Furthermore, the antistatic layer or electrically conductive layer are not necessarily required to be formed on the outermost surface, but rather may be formed on the polymer substrate, adhesive layer or cured underlayer and the like, and the adhesive layer and/or cured underlayer and/or silicon oxide layer obtained by PE-CVD may be further laminated following the formation thereof. In addition, the electrically conductive layer may be integrally formed with the polymer substrate when molding the polymer substrate by a method such as insert molding or in-mold transfer.

<Annealing of Polymer Substrate with Hard Coating Layer>

The polymer substrate with hard coating layer of the present invention may be further subjected to thermal annealing as necessary for the purpose of relieving internal strain and further promoting crosslinking and curing of each laminated layer after the silicon oxide layer obtained by PE-CVD has been laminated as necessary. Although annealing treatment may be carried out at vacuum pressure or normal pressure, it is generally preferably carried out within the range of 60° C. to 130° C. Although varying according to the treatment temperature, treatment time is preferably roughly 10 minutes to 48 hours.

<Method for Preparing Polymer Substrate with Hard Coating Layer>

In the polymer substrate with hard coating layer of the present invention, according to the target application as previously described, a silicon oxide layer is formed on a surface layer on one or both sides using PE-CVD capable of forming a hard coating layer having high hardness similar to that of inorganic glass so that the increase in haze value ($\Delta H$) on a surface laminated with the hard coating layer is 2% or less in a Taber abrasion test using a CS-10F abrading wheel at a load of 4.9 N and test rotating speed of 1000 revolutions.

<Haze Value of Polymer Substrate with Hard Coating Layer>

The initial haze value (referring to prior to carrying out an abrasion resistance test or environmental resistance test and the like) of the polymer substrate with hard coating layer of the present invention is preferably 1.0% or less, more preferably 0.8% or less and even more preferably 0.6% or less in the case of using in an application requiring a high level of visibility such as an automobile window. This is because, if the haze value exceeds 1.0%, images seen there through become indistinct resulting in cases in which this presents a problem in terms of driving (safety standards for automobile window materials may require a haze value of 1.0% or less depending on the country).

<Visible Light Transmittance of Polymer Substrate with Hard Coating Layer>

Visible light transmittance of the polymer substrate with hard coating layer of the present invention is preferably 70.0% or more in the case of using in an application requiring a high level of visibility such as an automobile window. Here, visible light transmittance refers to the transmittance of all light in the visible wavelength range with respect to a C light source or C65 light source, and although varying according to the application, is generally more preferably 75% or more, even more preferably 80% or more and most preferably 85% or more.

Furthermore, the polymer substrate with hard coating layer of the present invention may also be colored as necessary, and can be colored green, gray or various other colors. Although this coloring is typically carried out by suitably mixing pigments or dyes, these pigments or dyes may be mixed into the polymer substrate or mixed into a coating layer laminated on the polymer substrate.

<Accelerated Weather Resistance of Polymer Substrate with Hard Coating Layer>

The polymer substrate with hard coating layer of the present invention preferably demonstrates a prescribed level of performance or better in an accelerated weather resistance test as related to resistance to the external environment (such as with respect to ultraviolet light, temperature changes or humidity changes and the like) over a long period of time. More specifically, in the case of carrying out an exposure test for 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., there are no decreases in appearance or adhesion observed, and the duration is more preferably 10000 hours or more.

<Abrasion Resistance of Polymer Substrate with Hard Coating Layer>

With respect to abrasion resistance comparable to that of inorganic glass, required abrasion resistance for windows used at sites requiring visibility during driving with reference to, for example, U.S. safety standard FMVSS205 or European safety standard ECE R43 is an increase in haze value ($\Delta H$) of less than 2% and/or 2% or less as determined by a Taber abrasion test carried out for 1000 revolutions in accordance with ASTM D1044.

<Boiling Water Resistance and Adhesion of Polymer Substrate with Hard Coating Layer>

An adhesion test was carried out according to the crosscut tape method in compliance with JIS K5400 after immersing the polymer substrate with hard coating in boiling water at 100° C. and retaining in the boiling water for 3 hours followed by removing from the boiling water, removing any adhered moisture, and allowing to stand in a room temperature environment for 2 hours. The crosscut tape test is carried out by forming 10×10 squares cut out at 1 mm intervals with a cutter knife in the form of a grid followed by affixing and adhering tape having a prescribed adhesive force (such as Nichiban Cellophane Tape™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" was favorable.

This is because there are many cases in which internal stress (and frequently compressive force) generated during layer formation remains in the silicon oxide layer obtained by PE-CVD, and due to the action thereof, there are cases observed in which layer separation is observed to occur over time. On the basis thereof, in terms of ensuring long-term reliability of environmental resistance of the polymer substrate with hard coating layer of the present invention, both a favorable "initial result" and a favorable "elapsed result" are required.

EXAMPLES

The following clarifies the effects of the present invention while indicating examples and comparative examples thereof.

Furthermore, although examples of the silicon oxide layer obtained by PE-CVD being laminated only on one side of the surface layer are indicated in the present examples and comparative examples, a configuration in which the silicon oxide layer is laminated on both sides may also be preferably carried out without incident.

[Evaluation Methods]

Various evaluations in the examples and comparative examples were carried out according to the methods indicated below.

<Measurement of Maximum Indentation Depth, Indentation Hardness and Depression Elastic Modulus by Nanoindentation>

Maximum indentation depth ($h_{max}$), indentation hardness ($H_{IT}$) and indentation elastic modulus ($E_{IT}$) were determined by measuring a loading and unloading curve (force curve) under conditions of a maximum load of 1 mN, load steps of 4 μN, 250 step divisions, loading time of 20 sec, unloading time of 20 sec and maximum load retention time of 0.4 sec using the ENT-2100 Nanoindentation Hardness Tester manufactured by Elionix Inc. and a triangular pyramidal indenter having an apex angle of 65 degrees (crest interval: 115 degrees), followed by calculating in compliance with ISO14577-1 2002-10-01 Part 1 (using device internal software). Furthermore, measurements were carried out at 10 different locations followed by taking the average value thereof.

Furthermore, since the shape of the end of the triangular pyramidal indenter changes due to variations in the processing thereof and wear caused by use thereby resulting in variations and uncertainty in measured values, confirmatory work or corrective work is preferably carried out prior to measuring samples.

Confirmatory work is carried out by measuring a commercially available silicon wafer under the aforementioned test conditions, confirming that maximum indentation depth is within the range of 55±3 nm, and replacing the triangular pyramidal indenter with a new one in the case of outside that range (this method is employed in the case of measuring using the ENT-1100 tester manufactured by Elionix Inc.).

In addition, corrective work can be carried out by measuring a fused quartz plate as a reference sample and calculating the value with internal software of the aforementioned tester (due to the configuration of the software, this method can only be used in the of measuring using the ENT-2100 tester manufactured by Elionix Inc.).

<Measurement of Surface Roughness (Ra) and Specific Surface Area Using Scanning Probe Microscope with Dynamic Force Mode (DFM)>

Surface roughness (Ra) and surface area ratio were determined by measuring using the SPI3800N scanning probe microscope manufactured by SII Nanotechnology Inc. (and distributed by Hitachi High-Tech Science Corp.) and the NSG10 silicon cantilever (equipped with a tip having a radius of curvature of about 10 nm) for the cantilever under conditions of a measuring range of 5 μm×5 μm in the vertical and horizontal directions, measuring 256×256 measurement points and a scanning frequency of 1 KHz followed by calculating the results with device internal software. Furthermore, measurements were carried out at 10 different locations followed by taking the average value thereof.

Here, surface roughness (average surface roughness, Ra) is a value obtained by averaging the absolute value of the difference of height from a reference surface to a designated surface (Z coordinate). Here, the reference surface is a surface containing the average value of the Z coordinates of all measurement points, while the designated surface is a surface that connects the Z coordinates of all measurement points (having for a unit surface thereof a triangle formed by connecting the closest 3 points).

In addition, surface area ratio is the ratio of the area of the designated surface (measurement surface) to the area of the reference surface (flat surface where Z coordinates are constant).

<Measurement of Film Thickness>

The film thickness of each layer is preferably measured by according to a known optical interference method based on the optical interference pattern appearing in the transmission spectrum or reflection spectrum measured over a wavelength range of, for example, 450 nm to 650 nm and the refractive index of each layer. However, in the case of an absence of any difference in the refractive index of each layer or in the case the optical interference pattern is ambiguous due to the presence of disturbances (surface irregularities) in a layer interface thereby making measurement difficult, an alternative measurement method may be employed that is based on observing the cross-section of the polymer substrate with hard coating layer with a scanning electron microscope. In either case, measurements are carried out at 5 different locations followed by taking the average value thereof. Furthermore, the refractive index of each layer is measured with an Abbe refractometer and the like.

<Measurement of Critical Compression Ratio>

The value of critical compression ratio K of the silicon oxide layer as defined in the following formula (1) is determined in a 3-point bending test that imparts indentation displacement in which the surface laminated with the silicon oxide layer becomes concave.

$$K=(R-D/2)/R-(0.00215 \times d) \quad \text{Formula (1)}$$

In the schematic diagram of a 3-point bending test indicated in FIGS. 6, 7 and 9, D represents the total thickness (mm) of the polymer substrate with hard coating layer, d represents the film thickness (μm) of the silicon oxide layer, G represents the distance (mm) between two end fulcrum points in a 3-point bending tester, δL and R respectively represent indentation displacement (mm) measured when the silicon oxide layer begins to separate from a cut line (separation starting line) drawn with a cutter knife in advance at the location of the central fulcrum point, and the bend radius (mm) of the polymer substrate with hard coating layer when subjected to 3-point bending deformation during a 3-point bending test.

With respect to the test dimensions, although a preferable example thereof consists of a test piece size measuring 25 mm on the short side and 130 mm on the long side and the distance between the two end fulcrum points of the 3-point bending tester being 100 mm, test dimensions are not limited thereto.

A cut line is formed in the direction perpendicular to the long side at a location nearly in the center relative to the long side in the surface laminated with the silicon oxide layer obtained by PE-CVD according to the procedure indicated in FIG. 8 prior to carrying out the 3-point bending test.

According to the 3-point bending test, the position of a test piece is adjusted so as to face in the direction in which compressive force is externally applied (increased) on the silicon oxide layer obtained by PE-CVD and so that the aforementioned cut line aligns with the central fulcrum point of 3-point bending, followed by placing the test piece on the 3-point bending tester.

With the central fulcrum point immobilized, external force is applied to the two end fulcrum points and the test piece is pushed down at a constant speed to carry out a 3-point bending test on the test piece. When the test piece has been pushed down to a certain point (when compression ratio has reached a certain value), separation of the silicon oxide layer obtained by PE-CVD begins with the aforementioned cut line as the starting line of separation. Furthermore, in the present example, the size of the test piece measured 25 mm on the short side and 130 mm on the long side, the distance between the two endpoints of the 3-point bending tester was 100 mm, and the pressing speed resulting from applying external force to the two endpoints was 0.5 mm/sec.

The value of critical compression ratio K is determined by calculating using formula (1) based on indentation displacement (δL) at the start of separation as previously described. A schematic diagram for explaining the calculation method is shown in FIG. 9.

In the case point A0 prior to bending displacement moves to point A1 following bending displacement after having applied an indentation load, the distance between the central fulcrum point and point A0 is G/2, the distance between the central fulcrum point and point A1 can be approximated as K×G/2, and based on the correlation of the two triangles shown in FIG. 9, G/2:K×G/2=R−D/2. As a result, critical compression ratio K is represented by K=(R−D/2)/R.

On the other hand, according to the Pythagorean theorem, $R^2=(G/2)^2+R-\delta L)^2$ is obtained.

Furthermore, in formula (1), (0.00215×d) is a correction term relating to film thickness of the silicon oxide layer obtained by PE-CVD.

Measurement of indentation depression (δL) is carried out with five or more test pieces having the same thickness as the silicon oxide layer obtained by PE-CVD sampled from different locations followed by taking the average value thereof.

<Appearance Evaluation>

The surface of the polymer substrate with hard coating layer having a silicon oxide layer obtained by PE-CVD was observed visually to confirm the presence or absence of cracks.

<Adhesion>

100 crosscuts were made at an interval of 1 mm with a cutter knife in the surface of the polymer substrate with hard coating layer having a silicon oxide layer obtained by PE-CVD followed by repeating three times a procedure consisting of adhering Nichiban adhesive tape thereto and forcibly peeling off the tape while pulling in the perpendicular direction and then evaluating adhesion in terms of the number of squares remaining on the substrate (in compliance with JIS K5400).

<Measurement of Total Light Transmittance and Haze Value>

Haze value was measured using the NDH2000 Haze Meter manufactured by Nippon Denshoku Industries Co., Ltd. Furthermore, haze value (H) is represented by H=Td/Tt×100 (Td: diffuse light transmittance, Tt: total light transmittance).

(Abrasion Resistance)

The surface of the polymer substrate with hard coating layer having a silicon oxide layer obtained by PE-CVD was evaluated by abrading the surface of an abrading wheel using the CS-10F abrading wheel manufactured by Taber Industries Inc. for 25 revolutions with the ST-11 grindstone manufactured by Taber Industries Inc. prior to testing, followed by carrying out a Taber abrasion test for 1000 revolutions at a load of 500 g and measuring the change in haze value (ΔH) before and after the Taber abrasion test (in compliance with ASTM D1044).

Measurements were carried out on three test pieces having the same specifications, and the average value thereof was used as the performance value of the sample. Furthermore, the abrasion test was carried out after confirming that the abrading wheel used in the test demonstrated a change in haze value (ΔH) within the range of 0.6% to 1.0% in the case of having carried out the Taber abrasion test for 1000 revolutions by the same method on commercially available float glass (plate glass), and abrading wheels that were outside this range were not used in testing.

<Boiling Water Resistance>

A test piece of the polymer substrate with hard coating layer cut to a size of 60 mm×120 mm was immersed in boiling water at 100° C. followed by removing from the boiling water after holding therein for 3 hours, removing any adhered moisture, and allowing to stand in a room temperature environment for 2 hours followed by confirming any appearance and testing adhesion of the surface of the polymer substrate with hard coating layer having a silicon oxide layer obtained by PE-CVD.

Appearance was evaluated by confirming layer separation, formation of cracks, color tone and the presence or absence of changes in haze value.

Adhesion was evaluated by carrying out a crosscut tape test in compliance with JIS K5400, and after having formed 10×10 squares cut out at 1 mm intervals with a cutter knife in the form of a grid, tape having a prescribed adhesive force (such as Nichiban Cellophane Tape™) was affixed and adhered and then peeled off.

Furthermore, the appearance (status of layer peeling or lifting) immediately after carrying out testing (after having removed the test piece from boiling water, removed any adhered water, and allowed to stand for 2 hours in a room temperature environment) was designated as the "appearance", adhesion was designated as "adhesion", and the result obtained after the passage of 7 days after carrying out the test was designated as the "elapsed result". Furthermore, elapsed result was assessed as favorable (A) in the case of no changes from the result obtained immediately after testing, while elapsed result was assessed as poor (D) in the case a portion of the hard coating layer had separated spontaneously from the substrate starting at mainly those locations where the substrate had been cut with the cutter knife in order to evaluate adhesion. The polymer substrate with hard coating layer of the present invention was required to demonstrate favorable results for all of "appearance", "adhesion" and "elapsed results". Furthermore, the size of the test pieces was that which enabled testing to be carried out even if different from that indicated above.

<Heat Resistance>

A test piece of the polymer substrate with hard coating layer cut to a size of 60 mm×120 mm was held in a constant temperature tank at 110° C. or 130° C. followed by evaluating appearance changes and adhesion of the polymer substrate with hard coating layer having a silicon oxide layer obtained by PE-CVD 1000 hours later.

Further, as in the boiling water resistance, the result obtained after the passage of 7 days after carrying out the test was designated as the "elapsed result".

<Accelerated Weather Resistance>

An exposure test was carried out for 2000, 4000, or 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., and after removing the test piece and gently scrubbing the surface of the polymer substrate with hard coating layer having a silicon oxide layer obtained by PE-CVD with a sponge soaked with a neutral detergent, the test piece was evaluated for appearance, adhesion, and changes in color (ΔE) before and after testing.

(Method for Preparing Precursor Material Liquid of Cured Underlayer)

<Preparation of Surface-Coated Colloidal Silica Liquid Dispersion (A')>

12 parts by weight of acetic acid were added to 81.2 parts by weight of a water-dispersible colloidal silica liquid dispersion (Cataloid SN-30, particle diameter approx. 17 nm, solid content concentration: 30% by weight, manufactured by Catalysts and Chemicals Industry Co., Ltd.) and stirred followed by the addition of 128.8 parts by weight of methyltrimethoxysilane to this liquid dispersion while cooling in an ice bath. After stirring this mixture for 90 minutes at 30° C., the reaction liquid stirred for 8 hours at 60° C. was cooled with ice water after which 2 parts by weight of a curing catalyst in the form of sodium acetate were mixed therein while cooling with ice water to obtain a surface-coated colloidal silica liquid dispersion (A').

<Preparation of Cured Underlayer Raw Material (A1)>

164 parts by weight of methoxypropanol were added to a reaction vessel followed by raising the temperature to 80° C., dropping in a mixture containing 40 parts by weight of methyl methacrylate (MMA), 8 parts by weight of butyl methacrylate (BMA), 36 parts by weight of butyl acrylate (BA), 24 parts by weight of acrylic acid (AA), 4 parts by weight of 3-methacryloxypropyltrimethoxysilane (MPTS) and 6 parts by weight of tert-butylperoxy-2-ethylhexanoate (TBPEH) into the aforementioned reaction vessel over the course of 4 hours and further reacting at the same temperature for 2 hours to obtain an acrylic polymer organic solvent solution (A1") containing carboxyl groups and hydrolyzable silyl groups and having a number average molecular weight of 10200. The combined content of hydroxyl groups, amino groups, carboxyl groups and alkoxysilyl groups (specific functional groups) in A1" was 3.13 mol/kg (refer to the following Table 1-1).

224 parts of the aforementioned surface-coated colloidal silica liquid dispersion (A') were then added at the same temperature and stirred for 1 hour followed by the addition of 50 parts of glycidyl acrylate and 0.07 parts of methoquinone and stirring for 1 hour to obtain cured underlayer raw material (A1) in which the hydrolyzable silyl groups in the polymer organic solvent solution (A1") were bound to the surface-coated colloidal silica.

<Preparation of Cured Underlayer Raw Material (A2)>

198 parts by weight of methoxypropanol were added to a reaction vessel followed by raising the temperature to 80° C., dropping in a mixture containing 60 parts by weight of ethyl methacrylate (EMA), 16 parts by weight of hydroxyethyl methacrylate (HEMA), 30 parts by weight of butyl acrylate (BA), 30 parts by weight of acrylic acid (AA), 4 parts by weight of 3-methacryloxypropyltrimethoxysilane (MPTS), 54 parts by weight of PnP and 6 parts by weight of tert-butylperoxy-2-ethylhexanoate (TBPEH) into the aforementioned reaction vessel over the course of 4 hours and further reacting at the same temperature for 2 hours to obtain an acrylic polymer organic solvent solution (A2") containing carboxyl groups and hydrolyzable silyl groups and having a number average molecular weight of 10200. The combined content of hydroxyl groups, amino groups, carboxyl groups and alkoxysilyl groups (specific functional groups) in A2" was 3.53 mol/kg (refer to the following Table 1-1).

224 parts of the aforementioned surface-coated colloidal silica liquid dispersion (A') were then added at the same temperature and stirred for 1 hour followed by the addition of 50 parts of glycidyl acrylate and 0.07 parts of methoquinone and stirring for 1 hour to obtain cured underlayer raw material (A2) in which the hydrolyzable silyl groups in the polymer organic solvent solution (A2") were bound to the surface-coated colloidal silica.

| (meth)acrylic resin | Monomer | | | | Substance equivalent of SFG* | Substance equivalent of SFG* per weight |
|---|---|---|---|---|---|---|
| | Type | Molecular weight | Number of SFG* per one molecule | Amount | | |
| A1 | MMA | 100.1 | 0 | 40 | 0 | 3.13 |
| | BMA | 142.2 | 0 | 8 | 0 | |
| | BA | 128.2 | 0 | 36 | 0 | |
| | AA | 72.1 | 1 | 24 | 0.33 | |
| | MPTS | 228.3 | 1 | 4 | 0.02 | |

-continued

| (meth)acrylic resin | Type | Monomer | | | | Substance equivalent of SFG* per weight |
|---|---|---|---|---|---|---|
| | | Molecular weight | Number of SFG* per one molecule | Amount | Substance equivalent of SFG* | |
| A2 | EMA | 114.1 | 0 | 60 | 0 | 3.53 |
| | HEMA | 130.1 | 1 | 16 | 0.12 | |
| | BA | 128.2 | 0 | 30 | 0 | |
| | AA | 72.1 | 1 | 24 | 0.33 | |
| | MPTS | 228.3 | 1 | 4 | 0.02 | |

SFG* (specific functional groups): amino group, carboxylic group, and alkoxysilyl group <Preparation of Cured Underlayer Coating Agent (I)>

40 parts by weight of pentaerythritol tetraacrylate (Aronix M-450, Toagosei Co., Ltd.), 20 parts by weight of ethylene oxide-modified trimethylolpropane triacrylate (Aronix M-350, Toagosei Co., Ltd.), 50 parts by weight of the aforementioned cured underlayer raw material (A1), 50 parts by weight of organic solvent-dispersible surface-modified colloidal silica (MEK-AC-2140Z, solid content: 40%, Nissan Chemical Industries, Ltd.), 10 parts by weight of hydroxyphenyltriazine-based ultraviolet absorber (Tinuvin 400, BASF Corp.), 10 parts by weight of phenyl 1-hydroxyethyl ketone (Irgacure 184, BASF Corp.), 20 parts by weight of methyl ethyl ketone, 100 parts by weight of methoxypropanol and 40 parts by weight of isopropanol were added to prepare cured underlayer coating agent (I). The raw material composition of the cured underlayer coating agent (I) is summarized in the following Table 1.

<Preparation of Cured Underlayer Coating Agents (II) to (VIII)>

Cured underlayer coating agents (II) to (VIII) were prepared to have the compositions shown in the following Table 1-2 using the same method as that of cured underlayer coating agent (I).

<Preparation of Coating Composition (IX) for Cured Underlayer>

56 g of tungsten acetate slurry (PCTR-2020 manufactured by Sumitomo Osaka Cement Co., Ltd., solid content concentration: 20% by weight) were diluted with 848 g of 2-propanol. The slurry was subjected to dispersion treatment using a bead mill. The particle diameter at 50% in the cumulative distribution and the particle diameter at 90% in the cumulative distribution as determined by measuring particle size distribution of the slurry subjected to dispersion treatment by laser diffraction were 44 nm and 75 nm, respectively.

Next, 0.1 part by weight of concentrated hydrochloric acid (12 M) were added to 100 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred well. This liquid dispersion was then cooled to 10° C. followed by dropping in 161 parts by weight of methyltrimethoxysilane. The temperature of the reaction solution began to rise due to heat of the reaction immediately after adding the methyltrimethoxysilane, and rose to 60° C. within several minutes after the start of addition of the methyltrimethoxysilane. After reaching 60° C., the temperature of the reaction solution was gradually lowered while cooling in an ice bath. At the stage the temperature of the reaction solution reached 35° C., the reaction solution was stirred for 5 hours to maintain at this temperature, and after having mixed therein 0.8 parts by weight of a 45% by weight methanol solution of a curing catalyst in the form of choline and 5 parts by weight of a pH adjuster in the form of acetic acid, the mixture was stirred to uniformity to obtain a hydrolysis-condensation product of an organic silicon compound.

267 parts by weight of a solution of a partial condensate of an organic silicon compound were slowly mixed with 181 parts by weight of the titanium oxide slurry subjected to the aforementioned dispersion treatment by dropping followed by stirring well to obtain a coating composition (IX) for the cured underlayer containing a hydrolysis-condensation product of an organic silicon compound as a main component thereof.

(Method for Preparing Adhesive Layer Coating Agent>

79.9 parts by weight of ethyl methacrylate (EMA), 33.6 parts by weight of cyclohexyl methacrylate (CHMA), 13.0 parts by weight of 2-hydroxyethyl methacrylate (HEMA), 126.6 parts by weight of methyl isobutyl ketone (MIBK) and 63.3 parts by weight of 2-butanol (2-BuOH) were added to and mixed in a flask equipped with a reflux condenser and stirrer in which the air had been replaced with nitrogen. After passing nitrogen gas through the mixture to remove the oxygen, the temperature was raised to 70° C. in the presence of a nitrogen gas flow followed by the addition of 0.33 parts by weight of azobisisobutyronitrile (AIBN) and reacting in the presence of a nitrogen gas flow for 5 hours while stirring at 70° C. An additional 0.8 parts by weight of AIBN were added followed by raising the temperature to 80° C. and reacting for 3 hours to obtain an acrylic copolymer solution having a non-volatile content concentration of 39.6% by weight. The weight average molecular weight of the acrylic copolymer as measured by GPC (column: Shodex GPCA-804, eluent: chloroform) as polystyrene was 125,000.

Continuing, 43.2 parts by weight of MIBK, 21.6 parts by weight of 2-BuOH and 83.5 parts by weight of 1-methoxy-2-propanol were added to 100 parts by weight of the aforementioned acrylic copolymer solution and mixed followed by the addition of 5.3 parts by weight of Tinuvin 400 (triazine-based ultraviolet absorber, Ciba Specialty Chemicals Plc Ltd.) and 10.6 parts by weight of Vestanat B1358/100 (polyisocyanate compound precursor, Degussa Japan Co., Ltd.) at 1.0 equivalent of isocyanate groups to 1 equivalent of hydroxyl groups of the acrylic copolymer present in the acrylic resin solution, and further adding 0.15 parts by weight of dimethyl dineodecanoate tin (DMDNT) and stirring for 1 hour at 25° C. to prepare an adhesive layer coating agent having an acrylic copolymer resin for the main component thereof.

TABLE 1-2

| | multi-functional acrylate | | organic-inorganic hybrid type side chain acrylic group (meth) acrylic resin | | Surface modified Colloidal silica | |
|---|---|---|---|---|---|---|
| | | | A1 solid content | A2 solid content con.: 40% | | |
| Coating composition | M450 tetrafunctional acrylate (parts by weight) | M350 trifunctional acrylate (parts by weight) | con.: 40% inorganix oxides fine particles amount: 44% (parts by weight) | inroganix oxides fine particles amount: 33% (parts by weight) | MEK-AC-2140Z solid content con.: 40% (parts by weight) | ultraviolet absorbing agent Tinuvin 400 (parts by weight) |
| (VIII) | — | 4 | 20 | — | 220 | — |
| (VII) | 60 | 40 | — | — | — | — |
| (VI) | 40 | 30 | — | — | 75 | — |
| (V) | 60 | 20 | 30 | — | 20 | — |
| (IV) | — | 12 | 20 | — | 200 | — |
| (III) | 40 | 20 | 50 | — | 50 | — |
| (II) | 50 | 10 | — | 50 | 50 | 10 |
| (I) | 40 | 20 | 50 | — | 50 | 10 |
| (IX) | | | see text of Specification | | | |

[Production of Polymer Substrate with Hard Coating Layer]

Example 1

A polycarbonate resin (Panlite L1250Z, Teijin Ltd.) was charged into an injection press molding device to obtain a transparent polycarbonate resin sheet having a thickness of 4 mm and measuring 600 mm on a side.

Both sides of the polycarbonate resin sheet serving as a substrate were dip-coated with the aforementioned cured underlayer coating agent (I) and dried followed by irradiating both sides with ultraviolet light at 1000 mJ/cm² with a high-pressure mercury lamp to form a cured underlayer having a film thickness of about 8 μm on both sides of the polycarbonate substrate.

The polycarbonate resin substrate of 60 cm×60 cm size having a cured underlayer formed on both sides thereof was placed in the capacitive coupling type of PE-CVD device shown in FIG. 1 on the side of the parallel plate electrode to which high-frequency electrical power is applied by tightly pressing against the electrode so that there were no gaps between the substrate and the electrode surface (reference number 30 in the drawing) followed by drawing a vacuum for 1 hour. The ultimate vacuum pressure was 0.03 Pa.

Next, argon gas (purity: 99.9% or more) was introduced into the system at 1200 sccm through a line equipped with a mass flow controller followed by applying high-frequency electrical power of 13.56 MHz and 1.0 KW between parallel plate electrodes having cooling lines to generate plasma between the parallel plate electrodes. High-frequency electrical power was applied for a total of 200 seconds while in this state to carry out plasma treatment on one side of the cured underlayer.

Following the aforementioned plasma treatment, the introduction of argon gas was discontinued and a step was carried out for forming a silicon oxide layer by PE-CVD.

More specifically, 1,3,5,7-tetramethylcyclotetrasiloxane (purity: 99.99% or more, abbreviated as D4H) at 10 sccm and oxygen (purity: 99.9% or more) at 300 sccm were introduced into the system through separate lines equipped with mass flow controllers followed by the application of high-frequency electrical power of 13.56 MHz and 1.5 KW between parallel plate electrodes through a matching box to generate plasma in the space between the parallel plate electrodes.

After applying high-frequency electrical power of 1.5 KW for 60 seconds at a D4H flow rate of 10 sccm and oxygen flow rate of 300 sccm, the flow rate of the D4H was continuously increased to 95 sccm for 40 seconds (with "continuously" referring to increasing at a constant rate per unit time) after which high-frequency electrical power was continuously decreased to 1.0 KW.

Here, the average deposition rate until 30 seconds after the start of formation of the silicon oxide layer by PE-CVD was 0.8 nm/sec.

After applying high-frequency electrical power of 1.0 KW for a total of 720 seconds at a D4H flow rate of 95 sccm and oxygen flow rate of 1350 sccm, the D4H flow rate continuously decreased to 0 sccm over the course of 30 seconds while holding the high-frequency electrical power at 1.0 KW followed by discontinuing the application of high-frequency electrical power. Furthermore, the oxygen flow rate was fixed at 1350 sccm until the application of high-frequency electrical power was discontinued. The average deposition rate when applying high-frequency electrical power of 1.0 KW for a total of 720 seconds at a D4H flow rate of 95 sccm and oxygen flow rate of 1350 sccm was 9.5 nm/sec.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 μm. In addition, the maximum temperature of the substrate surface on the side laminated with the silicon oxide layer by PE-CVD was about 110° C. throughout the plasma treatment step and silicon oxide layer lamination step by PE-CVD.

The results of evaluating the performance of the polymer substrate with hard coating layer along with the physical properties of each layer are shown in Table 2-1. The results of evaluating the performance of the polymer substrates with hard coating layer obtained in each of the examples in the same manner as Example 1 along with the physical properties of each layer are also shown in Table 2-2 to 2-31. Furthermore, the physical property values of the cured underlayer shown in the table are the physical property values at the stage immediately prior to deposition and formation of the silicon oxide layer by PE-CVD after having carried out plasma treatment on that same layer.

Example 2

A polymer substrate with hard coating layer was formed in the same manner as Example 1 with the exception of using the cured underlayer coating composition (II) instead of the cured underlayer coating composition (I) used in in Example 1.

Example 3

A polymer substrate with hard coating layer was formed in the same manner as Example 1 with the exception of using the cured underlayer coating composition (III) instead of the cured underlayer coating composition (I) used in in Example 1.

Example 4

A polymer substrate with hard coating layer was formed in the same manner as Example 1 with the exception of using the cured underlayer coating composition (IV) instead of the cured underlayer coating composition (1) used in in Example 1.

Example 5

A polymer substrate with hard coating layer was formed in the same manner as Example 4 with the exception of changing the plasma treatment time in Example 4 to 400 seconds.

Example 6

A polymer substrate with hard coating layer was formed in the same manner as Example 1 with the exception of forming the silicon oxide layer obtained by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 840 seconds at a D4H flow rate of 95 sccm and oxygen flow rate of 1700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 8.3 μm. In addition, the maximum temperature of the substrate surface on the side laminated with the silicon oxide layer by PE-CVD was about 115° C. throughout the plasma bombardment treatment step and silicon oxide layer lamination step by PE-CVD.

Example 7

A polymer substrate with hard coating layer was formed in the same manner as Example 1 with the exception of forming the silicon oxide layer obtained by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 1500 sccm over the course of 40 seconds, and high-frequency electrical power was continuously decreased to 1.0 KW.

After applying high-frequency electrical power of 1.0 KW for a total of 800 seconds at a D4H flow rate of 70 sccm and oxygen flow rate of 1500 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1500 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.5 μm. In addition, the maximum temperature of the substrate surface on the side laminated with the silicon oxide layer by PE-CVD was about 115° C. throughout the plasma treatment step and silicon oxide layer lamination step by PE-CVD.

Example 8

A polymer substrate with hard coating layer was formed in the same manner as Example 1 with the exception of forming the silicon oxide layer obtained by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.3 In addition, the maximum temperature of the substrate surface on the side laminated with the silicon oxide layer by PE-CVD was about 110° C. throughout the plasma treatment step and silicon oxide layer lamination step by PE-CVD.

Example 9

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.1 KW.

After applying high-frequency electrical power of 1.1 KW for a total of 450 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.1 KW.

After applying high-frequency electrical power of 1.1 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.1 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.2 μm. In addition, the maximum temperature of the substrate surface on the side laminated with the silicon oxide layer by PE-CVD was about 115° C. throughout the plasma treatment step and silicon oxide layer lamination step by PE-CVD.

Example 10

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 0.8 KW.

After applying high-frequency electrical power of 0.8 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 0.8 KW.

After applying high-frequency electrical power of 0.8 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 0.8 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.5 μm. In addition, the maximum temperature of the substrate surface on the side laminated with the silicon oxide layer by PE-CVD was about 100° C. throughout the plasma treatment step and silicon oxide layer lamination step by PE-CVD.

Example 11

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.1 KW.

After applying high-frequency electrical power of 1.1 KW for a total of 290 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.1 KW.

After applying high-frequency electrical power of 1.1 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.1 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 4.3 μm. In addition, the maximum temperature of the substrate surface on the side laminated with the silicon oxide layer by PE-CVD was about 105° C. throughout the plasma treatment step and silicon oxide layer lamination step by PE-CVD.

Example 12

A polymer substrate with hard coating layer was formed in the same manner as Example 1 with the exception of using the cured underlayer coating composition (V) instead of the cured underlayer coating composition (I) used in in Example 1.

Example 13

A polymer substrate with hard coating layer was formed in the same manner as Example 1 with the exception of using the cured underlayer coating composition (VI) instead of the cured underlayer coating composition (I) used in in Example 1.

Example 14

A polymer substrate with hard coating layer was formed in the same manner as Example 1 with the exception of using a co-extruded sheet of polycarbonate resin (Panlite L1250Z, Teijin Ltd.) and acrylic resin (Acrypet VH001; 1 wt % of ultraviolet absorbing agent (LA-31) in PMMA, Mitsubishi Rayon Co., Ltd.) as a substrate resin.

Reference Example 1

A polymer substrate with hard coating layer was produced in the same manner as Example 4 with the exception of changing the treatment time during plasma treatment used in Example 4 to 2000 seconds.

However, since the substrate surface temperature of this polymer substrate with hard coating layer during plasma treatment exceeded 150° C., considerable shape distortion attributable to heat distortion was observed and the appearance was poor, the substrate was judged to be unacceptable and was not evaluated for performance as a polymer substrate with hard coating layer.

Comparative Example 1

A polymer substrate with hard coating layer was attempted to be formed in the same manner as Example 1 with the exception of using the cured underlayer coating composition (VII) instead of the cured underlayer coating composition (I) used in Example 1.

However, in this polymer substrate having a hard coating layer, the cured underlayer decomposed and deteriorated during plasma treatment and surface roughness exceeded 20 nm, and since the appearance became turbid during subsequent formation of the silicon oxide layer and the silicon oxide layer peeled spontaneously, the substrate was judged to be unacceptable and was not evaluated for performance as a polymer substrate with hard coating layer.

Comparative Example 2

A polymer substrate with hard coating layer was formed in the same manner as Example 1 with the exception of using the cured underlayer coating composition (VIII) instead of the cured underlayer coating composition (I) used in Example 1.

Comparative Example 3

A polymer substrate with hard coating layer was formed in the same manner as Example 1 with the exception of formation of a silicon oxide layer by PE-CVD but not carrying out the plasma treatment carried out in Example 1.

Comparative Example 4

A polymer substrate with hard coating layer was formed in the same manner as Example 1 with the exception of carrying out the plasma treatment of Example 1 at high-frequency electrical power of 0.1 KW and changing the treatment time to 100 seconds.

Comparative Example 5

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 670 sccm over the course of 40 seconds, and high-frequency electrical power was continuously decreased to 1.0 KW.

After applying high-frequency electrical power of 1.0 KW for a total of 1400 seconds at a D4H flow rate of 47 sccm and oxygen flow rate of 670 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 670 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.9 µm. In addition, the maximum temperature of the substrate surface on the side laminated with the silicon oxide layer by PE-CVD was about 125° C. throughout the plasma treatment step and silicon oxide layer lamination step by PE-CVD.

Comparative Example 6

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 1330 sccm over the course of 40 seconds, and high-frequency electrical power was continuously decreased to 1.0 KW.

After applying high-frequency electrical power of 1.0 KW for a total of 1250 seconds at a D4H flow rate of 47 sccm and oxygen flow rate of 1330 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1330 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.9 In addition, the maximum temperature of the substrate surface on the side laminated with the silicon oxide layer by PE-CVD was about 120° C. throughout the plasma treatment step and silicon oxide layer lamination step by PE-CVD.

Comparative Example 7

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 47 sccm and the oxygen flow rate was continuously increased to 2000 sccm over the course of 40 seconds, and high-frequency electrical power was continuously decreased to 1.0 KW.

After applying high-frequency electrical power of 1.0 KW for a total of 1200 seconds at a D4H flow rate of 47 sccm and oxygen flow rate of 2000 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2000 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.9 μm. In addition, the maximum temperature of the substrate surface on the side laminated with the silicon oxide layer by PE-CVD was about 110° C. throughout the plasma treatment step and silicon oxide layer lamination step by PE-CVD.

Comparative Example 8

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 900 sccm over the course of 40 seconds, and high-frequency electrical power was continuously decreased to 1.0 KW.

After applying high-frequency electrical power of 1.0 KW for a total of 1050 seconds at a D414 flow rate of 70 sccm and oxygen flow rate of 900 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 900 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.3 In addition, the maximum temperature of the substrate surface on the side laminated with the silicon oxide layer by PE-CVD was about 125° C. throughout the plasma treatment step and silicon oxide layer lamination step by PE-CVD.

Comparative Example 9

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 70 sccm and the oxygen flow rate was continuously increased to 3000 sccm over the course of 40 seconds, and high-frequency electrical power was continuously decreased to 1.0 KW.

After applying high-frequency electrical power of 1.0 KW for a total of 800 seconds at a D4H flow rate of 70 sccm and oxygen flow rate of 3000 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 3000 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.1 μm. In addition, the maximum temperature of the substrate surface on the side laminated with the silicon oxide layer by PE-CVD was about 95° C. throughout the plasma treatment step and silicon oxide layer lamination step by PE-CVD.

Comparative Example 10

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 2700 sccm over the course of 40 seconds, and high-frequency electrical power was continuously decreased to 1.0 KW.

After applying high-frequency electrical power of 1.0 KW for a total of 550 seconds at a D4H flow rate of 95 sccm and oxygen flow rate of 2700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 5.8 μm. In addition, the maximum temperature of the substrate surface on the side laminated with the silicon oxide layer by PE-CVD was about 100° C. throughout the plasma treatment step and silicon oxide layer lamination step by PE-CVD.

Comparative Example 11

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 0.6 KW.

After applying high-frequency electrical power of 0.6 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 0.6 KW.

After applying high-frequency electrical power of 0.6 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 0.6 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.5 In addition, the maximum temperature of the substrate surface on the side laminated with the silicon oxide layer by PE-CVD was about 95° C. throughout the plasma treatment step and silicon oxide layer lamination step by PE-CVD.

Comparative Example 12

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.3 KW.

After applying high-frequency electrical power of 1.3 KW for a total of 500 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.3 KW.

After applying high-frequency electrical power of 1.3 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.3 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.3 μm. In addition, the maximum temperature of the substrate surface on the side laminated with the silicon oxide layer by PE-CVD was about 135° C. throughout the plasma treatment step and silicon oxide layer lamination step by PE-CVD.

Comparative Example 13

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 110 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 2.8 µm. In addition, the maximum temperature of the substrate surface on the side laminated with the silicon oxide layer by PE-CVD was about 90° C. throughout the plasma bombardment treatment step and silicon oxide layer lamination step by PE-CVD.

Comparative Example 14

A polymer substrate with hard coating layer was formed in the same manner as Example 8 with the exception of forming the silicon oxide layer obtained by PE-CVD in Example 8 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 1700 sccm over the course of 40 seconds, and high-frequency electrical power was continuously decreased to 1.0 KW.

After applying high-frequency electrical power of 1.0 KW for a total of 900 seconds at a D4H flow rate of 95 sccm and oxygen flow rate of 1700 sccm, D4H flow rate was continuously decreased to 70 sccm and oxygen flow rate to 1250 sccm over the course of 60 seconds while maintaining high-frequency electrical power at 1.0 KW.

After applying high-frequency electrical power of 1.0 KW for 160 seconds at a D4H flow rate of 70 sccm and oxygen flow rate of 1250 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1250 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 9.2 µm. In addition, the maximum temperature of the substrate surface on the side laminated with the silicon oxide layer by PE-CVD was about 140° C. throughout the plasma treatment step and silicon oxide layer lamination step by PE-CVD.

Comparative Example 15

A polymer substrate with hard coating layer was formed in the same manner as Example 1 with the exception of forming the silicon oxide layer obtained by PE-CVD in Example 1 according to the procedure described below.

Namely, after applying high-frequency electrical power of 1.5 KW for 30 seconds at a D4H flow rate of 20 sccm and oxygen flow rate of 600 sccm, the flow rate of D4H was continuously increased to 95 sccm and the oxygen flow rate was continuously increased to 1700 sccm over the course of 40 seconds, and high-frequency electrical power was continuously decreased to 1.0 KW.

Here, the average deposition rate from the start of formation of the silicon oxide layer by PE-CVD to 30 seconds after the start of formation was 1.7 nm/sec.

After applying high-frequency electrical power of 1.0 KW for a total of 720 seconds at a D4H flow rate of 95 sccm and oxygen flow rate of 1350 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 1350 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 6.6 In addition, the maximum temperature of the substrate surface on the side laminated with the silicon oxide layer by PE-CVD was about 110° C. throughout the plasma treatment step and silicon oxide layer lamination step by PE-CVD.

Comparative Example 16

A polymer substrate with hard coating layer was formed in the same manner as Example 1 with the exception of forming the silicon oxide layer by PE-CVD in Example 1 according to the procedure described below.

Namely, after applying high-frequency electrical power of 1.5 KW for 60 seconds at a D4H flow rate of 10 sccm and oxygen flow rate of 300 sccm, the flow rate of D4H was continuously increased to 95 sccm and the oxygen flow rate was continuously increased to 2700 sccm over the course of 40 seconds, and high-frequency electrical power was continuously decreased to 1.0 KW.

After applying high-frequency electrical power of 1.0 KW for a total of 370 seconds at a D4H flow rate of 95 sccm and oxygen flow rate of 2700 sccm, D4H flow rate was continuously decreased to 0 sccm over the course of 30 seconds while maintaining high-frequency electrical power at 1.0 KW followed by discontinuing the application of high-frequency electrical power. Furthermore, the oxygen flow rate was fixed at 2700 sccm until the application of high-frequency electrical power was discontinued.

Thus, a target polymer substrate with hard coating layer was obtained by cooling a substrate for 5 minutes on parallel plate electrodes following completion of the formation of a silicon oxide layer thereon by PE-CVD, returning the atmosphere inside the device to atmospheric pressure and removing the substrate from the device.

Furthermore, the film thickness of the silicon oxide layer obtained by PE-CVD was about 4.1 µm. In addition, the maximum temperature of the substrate surface on the side laminated with the silicon oxide layer by PE-CVD was about 90° C. throughout the plasma treatment step and silicon oxide layer lamination step by PE-CVD.

Comparative Example 17

A polycarbonate resin (Panlite L1250Z, Teijin Ltd.) was charged into an injection press molding device to obtain a transparent polycarbonate resin sheet having a thickness of 4 mm and measuring 550 mm on a side.

Both sides of the polycarbonate resin sheet serving as a substrate were dip-coated with the aforementioned precursor material liquid for the adhesive layer and dried followed by heat-curing for 1 hour at 120° C. to laminate and form an adhesive layer having a film thickness of about 8 μm on both sides of the polycarbonate substrate.

Continuing, the aforementioned precursor material composition (IX) for the cured underlayer was dip-coated thereon and air-dried followed by heat-curing for 1 hour at 120° C. to laminate and form the cured underlayer having a film thickness of about 4 μm on both sides.

A polymer substrate with hard coating layer was subsequently obtained by forming a silicon oxide layer by PE-CVD in the same manner as Example 1 with the exception of changing the duration of plasma treatment to 600 seconds.

Comparative Example 18

A polymer substrate with hard coating layer was obtained in the same manner as Example 1 of Patent Document 4.

Namely, an active energy ray-cured primer composition was air-sprayed onto a polycarbonate resin sheet to a dry film thickness of 8 μm. Continuing, after preheating for 10 minutes at 80° C., the polycarbonate resin sheet was irradiated with an active energy ray at a dose of 2,000 mJ/cm$^2$ using a high-pressure mercury lamp to produce a cured coating layer.

Next, an inorganic substance layer was laminated thereon using a plasma CVD device to a film thickness of 5 μm to obtain a polymer substrate with hard coating layer.

Comparative Example 19

A polymer substrate with hard coating layer was obtained in the same manner as Example 1 of Patent Document 5.

Namely, a first hard coating layer in the form of a UV-cured resin (trade name: "UVHC7800", Momentive Performance Materials Japan Inc.) was first laminated onto the surface of a substrate film in the form of a PMMA film having a thickness of 188 μm (trade name: "RT050", Kuraray Co., Ltd.) to a thickness of 15 μm by gravure printing followed by drying for 1 minute in an atmosphere at 60° C. and curing by irradiating with UV light.

An anchor coating layer in the form of an organic-inorganic hybrid resin (trade name: "NH-1000G", Nippon Soda Co., Ltd.) was laminated on the surface thereof by bar coating. At this time, a filler (trade name: "NH-9100S", Nippon Soda Co., Ltd.) was mixed with the raw material resin.

A plasma-deposited layer containing hexamethylenedisiloxane (HMDSO, Shin-Etsu Chemical Co., Ltd.) was laminated as a second hard coating layer to obtain a polymer substrate with hard coating layer.

Here, the film thickness of the anchor coating layer was 7.0 μm, the amount of filler added was 2.5%, and the thickness of the second hard coating layer was 150 nm.

Comparative Example 20

A polymer substrate with hard coating layer was obtained in the same manner as Example 1 of Patent Document 6.

Namely, a composite coating composition was flow-coated onto a cured coating film in the form of a Lexan polycarbonate sheet after having cleaned the surface thereof (150 mm×150 mm×4 mm thick) to a thickness of about 9 to 14 μm followed by heat-curing for 60 minutes at 120° C. to obtain an intermediate layer.

Moreover, the uppermost layer in the form of a coating composed of silicon, oxygen, carbon and hydrogen atoms was laminated onto the coating film by plasma polymerization to obtain a laminate. More specifically, prior to plasma polymerization, a substrate having a cured coating of the composite coating composition formed thereon was cleaned by hand with a lint-free cloth using isopropyl alcohol and deionized water. Next, plasma polymerization was carried out in a vacuum chamber by a continuous two-sided expanding thermal plasma process. The two plasma coating positions consisted of a row of expanding thermal plasma sources that created argon plasma jets at supersonic speed. The plasma jets expanded at the plasma coating positions and reacted with an organic silicon reagent and oxidizing agent injected directly into the chamber. This organic silicon reagent was octamethylcyclotetrasiloxane (Gelest, Inc.) and the oxidizing agent was 99% industrial grade oxygen (Airgas, Inc.). The substrate was continuously transferred through the chamber and heated to about 40° C. to 70° C. before entering the coating positions.

TABLE 3

Table 2-1: Example 1

| | | Cured Underlayer | | | | |
|---|---|---|---|---|---|---|
| | | | PB treatment | | | |
| Coating comp. type | Thick. (μm) | Power (W) | Treat. Time (sec.) | | Surface roughness (Ra) (nm) | Water contact angle (°) |
| (I) | 8 | 1000 | 200 | | 1.4 | 30 |

| | CVD film deposition process | | | | | |
|---|---|---|---|---|---|---|
| | Initial | Form. of | | Highly hard layer | | |
| Control parameter | compact layer | gradient structure | Bulk layer | Gradient part | Steady part | Final step |
| Power (W) | 1500 | 1500 ⇒1000 | 1000 | — | — | 1000 |
| Monomer (sccm) | 10 | 10 ⇒95 | 95 | — | — | 95 ⇒0 |

TABLE 3-continued

Table 2-1: Example 1

| | | | | | | |
|---|---|---|---|---|---|---|
| Oxygen (sccm) | 300 | 300 ⇒1350 | 1350 | — | — | 1350 |
| Time (sec.) | 60 | 40 | 720 | — | — | 30 |

CVD layer

| Thick. (μm) | Initial ave. dep.rate (nm/sec) | Critical compres. ratio | Max. Indent. depth (nm) | Indent. hardness (Gpa) | Surface roughness (Ra) (nm) | Infrared absorb. peak intens. ratio α930/α1020 | Infrared absorb. peak intens. ratio α1280/α1020 |
|---|---|---|---|---|---|---|---|
| 6.6 | 0.8 | 0.974 | 145 | 3.6 | 2.2 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.1 | 0.5 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 0.9 |

TABLE 4

Table 2-2: Example 2

Cured Underlayer

PB treatment

| Coating comp. type | Thick. (μm) | Power (W) | Treat. Time (sec.) | Surface roughness (Ra) (nm) | Water contact angle (°) |
|---|---|---|---|---|---|
| (II) | 8 | 1000 | 200 | 1.5 | 30 |

CVD film deposition process

| Control parameter | Initial compact layer | Form. of gradient structure | Bulk layer | Highly hard layer Gradient part | Highly hard layer Steady part | Final step |
|---|---|---|---|---|---|---|
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 4-continued

Table 2-2: Example 2

CVD layer

| Thick. (μm) | Initial ave. dep.rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | $\alpha 930/\alpha 1020$ | $\alpha 1280/\alpha 1020$ |
| 6.6 | 0.8 | 0.975 | 147 | 3.4 | 2.4 | 0.28 | 0.013 |

Initial performance

| Appear. | Adhesion | Optical property | | Abrasive resistance |
|---|---|---|---|---|
| | | TT (%) | Haze (%) | Taber 1000revo. ΔH (%) |

| Boiling water resistance | | | Heat resistance | | | | | |
|---|---|---|---|---|---|---|---|---|
| | | | 110° C.1000 hr | | | 130° C.1000 hr | | |
| Appear. | Adhesion | Elapsed result | Appear. | Adhesion | Elapsed result | Appear. | Adhesion | Elapsed result |
| A | A(100) | 89.1 | 0.5 | A(0.7) | A | A(100) | A | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 1.1 |

TABLE 5

Table 2-3: Example 3

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (III) | 8 | 1000 | 200 | 1.3 | 25 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 5-continued

Table 2-3: Example 3

CVD layer

| Thick. (μm) | Initial ave. dep.rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.973 | 144 | 3.6 | 2.0 | 0.26 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.2 | 0.4 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.5 | A | A(100) | 1.4 | A | A(100) | 3.6 |

TABLE 6

Table 2-4: Example 4

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (IV) | 8 | 1000 | 200 | 1.1 | 35 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 6-continued

Table 2-4: Example 4

CVD layer

| | | | Nanoindentation measurement | | | | |
|---|---|---|---|---|---|---|---|
| Thick. | Initial ave. dep.rate | Critical compres. | Max. Indent. depth | Indent. hardness | Surface roughness | Infrared absorb. peak intens. ratio | |
| (μm) | (nm/sec) | ratio | (nm) | (Gpa) | (Ra) (nm) | α930/α1020 | α1280/α1020 |
| 6.6 | 0.8 | 0.973 | 145 | 3.5 | 2.1 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 88.8 | 0.6 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.4 | A | A(100) | 1.2 | A | D(0) | 2.8 |

TABLE 7

Table 2-5: Example 5

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (IV) | 8 | 1000 | 400 | 3.8 | 20 |

CVD film deposition process

| | Initial | Form. of | | Highly hard layer | | |
|---|---|---|---|---|---|---|
| Control parameter | compact layer | gradient structure | Bulk layer | Gradient part | Steady part | Final step |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 7-continued

Table 2-5: Example 5

CVD layer

| Thick. (μm) | Initial ave. dep.rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.974 | 145 | 3.6 | 2.1 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 88.8 | 0.7 | A(0.6) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.4 | D | D(0) | 1.2 | — | — | — |

TABLE 8

Table 2-6: Example 6

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1700 | 1700 | — | — | 1700 |
| Time (sec.) | 60 | 40 | 900 | — | — | 30 |

TABLE 8-continued

Table 2-6: Example 6

CVD layer

| | | | Nanoindentation measurement | | | | |
|---|---|---|---|---|---|---|---|
| Thick. | Initial ave. dep. rate | Critical compres. ratio | Max. Indent. depth | Indent. hardness | Surface roughness | Infrared absorb. peak intens. ratio | |
| (μm) | (nm/sec) | | (nm) | (Gpa) | (Ra) (nm) | α930/α1020 | α1280/α1020 |
| 8.3 | 0.8 | 0.974 | 149 | 3.1 | 3.0 | 0.29 | 0.014 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.0 | 0.6 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 1.1 |

TABLE 9

Table 2-7: Example 7

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒70 | 70 | — | — | 70 ⇒0 |
| Oxygen (sccm) | 300 | 300 ⇒1500 | 1500 | — | — | 1500 |
| Time (sec.) | 60 | 40 | 600 | — | — | 30 |

TABLE 9-continued

Table 2-7: Example 7

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 5.5 | 0.8 | 0.975 | 142 | 4.1 | 2.3 | 0.24 | 0.011 |

Initial performance

| Appear. | Adhesion | Optical property | | Abrasive resistance |
|---|---|---|---|---|
| | | TT (%) | Haze (%) | Taber 1000revo. ΔH (%) |
| A | A(100) | 89.0 | 0.5 | A(0.4) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 0.8 |

TABLE 10

Table 2-8: Example 8

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | 1000 | 1000 | 1000 |
| Monomer (sccm) | 10 | 10 ⇒95 | 95 | 95 ⇒70 | 70 | 70 ⇒0 |
| Oxygen (sccm) | 300 | 300 ⇒1700 | 1700 | 1700 ⇒1250 | 1250 | 1250 |
| Time (sec.) | 60 | 40 | 500 | 60 | 160 | 30 |

TABLE 10-continued

Table 2-8: Example 8

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.3 | 0.8 | 0.971 | 137 | 4.8 | 2.1 | 0.23 | 0.006 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.1 | 0.6 | A(0.3) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 0.9 |

TABLE 11

Table 2-9: Example 9

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1100 | 1100 | 1100 | 1100 | 1100 |
| Monomer (sccm) | 10 | 10 ⇒95 | 95 | 95 ⇒70 | 70 | 70 ⇒0 |
| Oxygen (sccm) | 300 | 300 ⇒1700 | 1700 | 1700 ⇒1250 | 1250 | 1250 |
| Time (sec.) | 60 | 40 | 450 | 60 | 160 | 30 |

TABLE 11-continued

Table 2-9: Example 9

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | $\alpha 930/\alpha 1020$ | $\alpha 1280/\alpha 1020$ |
| 6.2 | 0.8 | 0.973 | 135 | 5.0 | 2.1 | 0.22 | 0.004 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 88.8 | 0.6 | A(1.3) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 0.9 |

TABLE 12

Table 2-10: Example 10

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒800 | 800 | 800 | 800 | 800 |
| Monomer (sccm) | 10 | 10 ⇒95 | 95 | 95 ⇒70 | 70 | 70 ⇒0 |
| Oxygen (sccm) | 300 | 300 ⇒1700 | 1700 | 1700 ⇒1250 | 1250 | 1250 |
| Time (sec.) | 60 | 40 | 500 | 60 | 160 | 30 |

TABLE 12-continued

Table 2-10: Example 10

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.5 | 0.8 | 0.970 | 146 | 4.1 | 2.4 | 0.26 | 0.012 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.1 | 0.5 | A(0.7) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 0.9 |

TABLE 13

Table 2-11: Example 11

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1100 | 1100 | 1100 | 1100 | 1100 |
| Monomer (sccm) | 10 | 10 ⇒95 | 95 | 95 ⇒70 | 70 | 95 ⇒0 |
| Oxygen (sccm) | 300 | 300 ⇒1700 | 1700 | 1700 ⇒1250 | 1250 | 1250 |
| Time (sec.) | 60 | 40 | 290 | 60 | 160 | 30 |

TABLE 13-continued

Table 2-11: Example 11

CVD layer

| | | | Nanoindentation measurement | | | | |
|---|---|---|---|---|---|---|---|
| Thick. | Initial ave. dep. rate | Critical compres. ratio | Max. Indent. depth | Indent. hardness | Surface roughness | Infrared absorb. peak intens. ratio | |
| (μm) | (nm/sec) | | (nm) | (Gpa) | (Ra) (nm) | α930/α1020 | α1280/α1020 |
| 4.3 | 0.8 | 0.973 | 134 | 5.1 | 1.9 | 0.22 | 0.004 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.0 | 0.5 | A(1.1) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.4 | A | A(100) | 1.2 |

TABLE 14

Table 2-12: Example 12

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (V) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 14-continued

Table 2-12: Example 12

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.974 | 145 | 3.6 | 2.2 | 0.27 | 0.013 |

Initial performance

| Appear. | Adhesion | Optical property | | Abrasive resistance |
|---|---|---|---|---|
| | | TT (%) | Haze (%) | Taber 1000revo. ΔH (%) |
| A | A(100) | 89.0 | 0.8 | A(1.8) |

Heat resistance

| Boiling water resistance | | 110° C.1000 hr | | | 130° C.1000 hr | | |
|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.6 | C | D(0) | 1.8 | — | — | — |

TABLE 15

Table 2-13: Example 13

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (VI) | 8 | 1000 | 200 | 2.6 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 15-continued

Table 2-13: Example 13

CVD layer

| | | | Nanoindentation measurement | | | | |
|---|---|---|---|---|---|---|---|
| Thick. (μm) | Initial ave. dep. rate (nm/sec) | Critical compres. ratio | Max. Indent. depth (nm) | Indent. hardness (Gpa) | Surface roughness (Ra) (nm) | Infrared absorb. peak intens. ratio α930/α1020 | α1280/α1020 |
| 6.6 | 0.8 | 0.974 | 145 | 3.6 | 2.2 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.0 | 0.5 | A(0.7) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.5 | A | D(0) | 1.1 | — | — | — |

TABLE 16

Table 2-13a: Example 14

Cured Underlayer

PB treatment

| Coating comp. type | Thick. (μm) | Power (W) | Treat. Time (sec.) | Surface roughness (Ra) (nm) | Water contact angle (°) |
|---|---|---|---|---|---|
| (I) | 8 | 1000 | 200 | 1.4 | 30 |

CVD film deposition process

| Control parameter | Initial compact layer | Form. of gradient structure | Bulk layer | Highly hard layer Gradient part | Steady part | Final step |
|---|---|---|---|---|---|---|
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 16-continued

Table 2-13a: Example 14

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.974 | 145 | 3.6 | 2.2 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.1 | 0.5 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | A(100) | A | A | A(100) | A | A | A(100) | A |

Weather resistance (SXOM180 W/m$^2$, rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | A(100) | 0.1 | A | A(100) | 0.3 |

TABLE 17

Table 2-14: Reference Example 1

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (IV) | 8 | 1000 | 2000 | — | — |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 17-continued

Table 2-14: Reference Example 1

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| (not evaluated due to poor appearance) | | | | | | | |

Initial performance

| Appear. | Adhesion | Optical property | | Abrasive resistance |
|---|---|---|---|---|
| | | TT (%) | Haze (%) | Taber 1000revo. ΔH (%) |
| (not evaluated due to poor appearance) | | | | |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| (not evaluated due to poor appearance) | | | | | | | | |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| (not evaluated due to poor appearance) | | | | | | | | |

TABLE 18

Table 2-15: Comparative Example 1

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (VII) | 8 | 1000 | | 200 | 78.5 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 18-continued

Table 2-15: Comparative Example 1

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |

(not evaluated due to white turbidity of substrate spontaneous peeling of silicon oxide layer)

Initial performance

| Appear. | Adhesion | Optical property | | Abrasive resistance |
|---|---|---|---|---|
| | | TT (%) | Haze (%) | Taber 1000revo. ΔH (%) |

(not evaluated due to white turbidity of substrate spontaneous peeling of silicon oxide layer)

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |

(not evaluated due to white turbidity of substrate spontaneous peeling of silicon oxide layer)

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |

(not evaluated due to white turbidity of substrate spontaneous peeling of silicon oxide layer)

TABLE 19

Table 2-16: Comparative Example 2

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (VIII) | 8 | 1000 | | 200 | 1.1 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 19-continued

Table 2-16: Comparative Example 2

CVD layer

| Thick. (μm) | Initial ave. dep. rate (nm/sec) | Critical compres. | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.986 | 143 | 3.8 | 2.2 | 0.27 | 0.013 |

Initial performance

| Appear. | Adhesion | Optical property | | Abrasive resistance |
|---|---|---|---|---|
| | | TT (%) | Haze (%) | Taber 1000revo. ΔH (%) |
| A | D(0) | 89.3 | 0.4 | A(0.8) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| C | D(0) | — | — | — | — | — | — | — |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| — | — | — | — | — | — | — | — | — |

TABLE 20

Table 2-17: Comparative Example 3

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | No treated | | 0.5 | 80 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 20-continued

Table 2-17: Comparative Example 3

CVD layer

| | | | Nanoindentation measurement | | | | |
|---|---|---|---|---|---|---|---|
| Thick. | Initial ave. dep. rate | Critical compres. ratio | Max. Indent. depth | Indent. hardness | Surface roughness | Infrared absorb. peak intens. ratio | |
| (μm) | (nm/sec) | | (nm) | (Gpa) | (Ra) (nm) | α930/α1020 | α1280/α1020 |
| 6.6 | 0.8 | 0.979 | 146 | 3.4 | 2.2 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | D(70) | 89.1 | 0.4 | A(0.8) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | D(0) | — | A | D(70) | — | A | D(70) | — |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| C | D(0) | 0.1 | — | — | — | — | — | — |

TABLE 21

Table 2-18: Comparative Example 4

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 100 | 100 | 0.8 | 55 |

CVD film deposition process

| | Initial | Form. of | | Highly hard layer | | |
|---|---|---|---|---|---|---|
| Control parameter | compact layer | gradient structure | Bulk layer | Gradient part | Steady part | Final step |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 21-continued

Table 2-18: Comparative Example 4

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.6 | 0.8 | 0.977 | 144 | 3.6 | 2.2 | 0.27 | 0.013 |

Initial performance

| | | Optical property | | Abrasive resistance |
|---|---|---|---|---|
| Appear. | Adhesion | TT (%) | Haze (%) | Taber 1000revo. ΔH (%) |
| A | A(100) | 89.3 | 0.5 | A(0.5) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | D(20) | D | A | A(100) | D | A | A(100) | D |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | D(0) | 0.1 | — | — | — | — | — | — |

TABLE 22

Table 2-19: Comparative Example 5

Cured Underlayer

| Coating comp. type | Thick. (μm) | PB treatment | | | |
|---|---|---|---|---|---|
| | | Power (W) | Treat. Time (sec.) | Surface roughness (Ra) (nm) | Water contact angle (°) |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒47 | 47 | — | — | 47 ⇒0 |
| Oxygen (sccm) | 300 | 300 ⇒670 | 670 | — | — | 670 |
| Time (sec.) | 60 | 40 | 1400 | — | — | 30 |

TABLE 22-continued

Table 2-19: Comparative Example 5

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 5.9 | 0.8 | 0.982 | 120 | 5.7 | 2.2 | 0.20 | 0.000 |

Initial performance

| Appear. | Adhesion | Optical property | | Abrasive resistance |
|---|---|---|---|---|
| | | TT (%) | Haze (%) | Taber 1000revo. ΔH (%) |
| A | A(100) | 88.9 | 0.7 | A(0.7) |

Heat resistance

| Boiling water resistance | | | 110° C.1000 hr | | | 130° C.1000 hr | | |
|---|---|---|---|---|---|---|---|---|
| Appear. | Adhesion | Elapsed result | Appear. | Adhesion | Elapsed result | Appear. | Adhesion | Elapsed result |
| A | D(0) | — | A | A(100) | D | A | A(100) | D |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A(100) | 0.1 | A | D(0) | 0.6 | — | — | — |

TABLE 23

Table 2-20: Comparative Example 6

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒47 | 47 | — | — | 47 ⇒0 |
| Oxygen (sccm) | 300 | 300 ⇒1330 | 1330 | — | — | 1330 |
| Time (sec.) | 60 | 40 | 1250 | — | — | 30 |

TABLE 23-continued

Table 2-20: Comparative Example 6

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 5.9 | 0.8 | 0.981 | 122 | 5.5 | 2.2 | 0.21 | 0.000 |

Initial performance

| Appear. | Adhesion | Optical property | | Abrasive resistance |
|---|---|---|---|---|
| | | TT (%) | Haze (%) | Taber 1000 revo. ΔH (%) |
| A | A (100) | 88.8 | 0.6 | A (0.4) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | D (60) | — | C | D (0) | — | C | D (0) | — |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | D (0) | 0.7 | — | — | — |

TABLE 24

Table 2-21: Comparative Example 7

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒47 | 47 | — | — | 47 ⇒0 |
| Oxygen (sccm) | 300 | 300 ⇒2000 | 2000 | — | — | 2000 |
| Time (sec.) | 60 | 40 | 1200 | — | — | 30 |

TABLE 24-continued

Table 2-21: Comparative Example 7

CVD layer

| | | | Nanoindentation measurement | | | | |
|---|---|---|---|---|---|---|---|
| Thick. (μm) | Initial ave. dep. rate (nm/sec) | Critical compres. ratio | Max. Indent. depth (nm) | Indent. hardness (Gpa) | Surface roughness (Ra) (nm) | Infrared absorb. peak intens. ratio | |
| | | | | | | α930/α1020 | α1280/α1020 |
| 5.9 | 0.8 | 0.980 | 128 | 5.3 | 2.2 | 0.22 | 0.000 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.5 | A (0.2) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | D | C | D (0) | — | C | D (0) | — |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | D (0) | 0.7 | — | — | — |

TABLE 25

Table 2-22: Comparative Example 8

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒70 | 70 | — | — | 70 ⇒0 |
| Oxygen (sccm) | 300 | 300 ⇒900 | 900 | — | — | 900 |
| Time (sec.) | 60 | 40 | 1050 | — | — | 30 |

TABLE 25-continued

Table 2-22: Comparative Example 8

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.3 | 0.8 | 0.978 | 130 | 5.1 | 2.2 | 0.24 | 0.001 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 88.9 | 0.6 | A (0.5) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | D | C | D (0) | — | C | D (0) | — |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | D (0) | 0.6 | — | — | — |

TABLE 26

Table 2-23: Comparative Example 9

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒70 | 70 | — | — | 70 ⇒0 |
| Oxygen (sccm) | 300 | 300 ⇒3000 | 3000 | — | — | 3000 |
| Time (sec.) | 60 | 40 | 800 | — | — | 30 |

TABLE 26-continued

Table 2-23: Comparative Example 9

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 6.1 | 0.8 | 0.971 | 168 | 2.9 | 2.2 | 0.32 | 0.008 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 88.8 | 0.6 | D (2.1) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | A | B | A (100) | A | B | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.8 | A | D (0) | 2.6 |

TABLE 27

Table 2-24: Comparative Example 10

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒2700 | 2700 | — | — | 2700 |
| Time (sec.) | 60 | 40 | 550 | — | — | 30 |

TABLE 27-continued

Table 2-24: Comparative Example 10

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 5.8 | 0.8 | 0.968 | 184 | 2.6 | 2.2 | 0.31 | 0.023 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.5 | D (2.1) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | A | B | A (100) | A | B | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.9 | A | D (0) | 3.0 |

TABLE 28

Table 2-25: Comparative Example 11

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒600 | 600 | 600 | 600 | 600 |
| Monomer (sccm) | 10 | 10 ⇒95 | 95 | 95 ⇒70 | 70 | 95 ⇒0 |
| Oxygen (sccm) | 300 | 300 ⇒1700 | 1700 | 1700 ⇒1250 | 1250 | 1500 |
| Time (sec.) | 60 | 40 | 500 | 60 | 160 | 30 |

TABLE 28-continued

Table 2-25: Comparative Example 11

CVD layer

| | | | Nanoindentation measurement | | | Infrared absorb. peak intens. ratio | |
|---|---|---|---|---|---|---|---|
| Thick. | Initial ave. dep. rate | Critical compres. | Max. Indent. depth | Indent. hardness | Surface roughness | | |
| (μm) | (nm/sec) | ratio | (nm) | (Gpa) | (Ra) (nm) | α930/α1020 | α1280/α1020 |
| 6.5 | 0.8 | 0.970 | 177 | 2.9 | 2.2 | 0.30 | 0.022 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 88.9 | 0.6 | D (2.1) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | A | B | A (100) | A | B | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.7 | A | D (0) | 2.2 |

TABLE 29

Table 2-26: Comparative Example 12

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1300 | 1300 | 1300 | 1300 | 1300 |
| Monomer (sccm) | 10 | 10 ⇒95 | 95 | 95 ⇒70 | 70 | 95 ⇒0 |
| Oxygen (sccm) | 300 | 300 ⇒1700 | 1700 | 1700 ⇒1250 | 1250 | 1500 |
| Time (sec.) | 60 | 40 | 500 | 60 | 160 | 30 |

TABLE 29-continued

Table 2-26: Comparative Example 12

CVD layer

| | | | Nanoindentation measurement | | | | |
|---|---|---|---|---|---|---|---|
| Thick. (μm) | Initial ave. dep. rate (nm/sec) | Critical compres. ratio | Max. Indent. depth (nm) | Indent. hardness (Gpa) | Surface roughness (Ra) (nm) | Infrared absorb. peak intens. ratio α930/α1020 | α1280/α1020 |
| 6.3 | 0.8 | 0.978 | 132 | 5.4 | 2.2 | 0.21 | 0.000 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 88.8 | 0.5 | A (0.6) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | D | A | A (100) | A | A | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.5 | A | D (0) | 1.3 |

TABLE 30

Table 2-27: Comparative Example 13

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| | Initial | Form. of | | Highly hard layer | | |
|---|---|---|---|---|---|---|
| Control parameter | compact layer | gradient structure | Bulk layer | Gradient part | Steady part | Final step |
| Power (W) | 1500 | 1500 ⇒1000 | 1000 | 1000 | 1000 | 1000 |
| Monomer (sccm) | 10 | 10 ⇒95 | 95 | 95 ⇒70 | 70 | 95 ⇒0 |
| Oxygen (sccm) | 300 | 300 ⇒1700 | 1700 | 1700 ⇒1250 | 1250 | 1500 |
| Time (sec.) | 60 | 40 | 110 | 60 | 160 | 30 |

TABLE 30-continued

Table 2-27: Comparative Example 13

CVD layer

| | | | Nanoindentation measurement | | | | |
|---|---|---|---|---|---|---|---|
| Thick. (μm) | Initial ave. dep. rate (nm/sec) | Critical compres. ratio | Max. Indent. depth (nm) | Indent. hardness (Gpa) | Surface roughness (Ra) (nm) | Infrared absorb. peak intens. ratio α930/α1020 | α1280/α1020 |
| 2.8 | 0.8 | 0.971 | 132 | 4.1 | 2.2 | 0.24 | 0.007 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.6 | D (2.7) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | A | A | A (100) | A | A | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.6 | A | D (0) | 1.5 |

TABLE 31

Table 2-28: Comparative Example 14

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| | Initial | Form. of | | Highly hard layer | | |
|---|---|---|---|---|---|---|
| Control parameter | compact layer | gradient structure | Bulk layer | Gradient part | Steady part | Final step |
| Power (W) | 1500 | 1500 ⇒1000 | 1000 | 1000 | 1000 | 1000 |
| Monomer (sccm) | 10 | 10 ⇒95 | 95 | 95 ⇒70 | 70 | 95 ⇒0 |
| Oxygen (sccm) | 300 | 300 ⇒1700 | 1700 | 1700 ⇒1250 | 1250 | 1500 |
| Time (sec.) | 60 | 40 | 900 | 60 | 160 | 30 |

TABLE 31-continued

Table 2-28: Comparative Example 14

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 9.2 | 0.8 | 0.974 | 143 | 4.9 | 2.2 | 0.23 | 0.006 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.5 | A (0.2) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | D (50) | D | A | A (100) | A | A | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | C | D (0) | 0.3 | — | — | — |

TABLE 32

Table 2-29: Comparative Example 15

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (I) | 8 | 1000 | 200 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 20 | 10 ⇒95 | 95 | — | — | 95 ⇒0 |
| Oxygen (sccm) | 600 | 300 ⇒1700 | 1700 | — | — | 1700 |
| Time (sec.) | 30 | 40 | 720 | — | — | 30 |

TABLE 32-continued

Table 2-29: Comparative Example 15

CVD layer

| | | | Nanoindentation measurement | | | | |
|---|---|---|---|---|---|---|---|
| Thick. (μm) | Initial ave. dep. rate (nm/sec) | Critical compres. ratio | Max. Indent. depth (nm) | Indent. hardness (Gpa) | Surface roughness (Ra) (nm) | Infrared absorb. peak intens. ratio | |
| | | | | | | α930/α1020 | α1280/α1020 |
| 6.6 | 1.7 | 0.977 | 135 | 3.2 | 2.2 | 0.28 | 0.015 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.5 | A (0.5) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | D | A | A (100) | A | A | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | D (20) | 0.4 | C | D (0) | 0.9 |

TABLE 33

Table 2-30: Comparative Example 16

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| (I) | 8 | 1000 | 200 | 1.4 | 30 |

CVD film deposition process

| | Initial | Form. of | | Highly hard layer | | |
|---|---|---|---|---|---|---|
| Control parameter | compact layer | gradient structure | Bulk layer | Gradient part | Steady part | Final step |
| Power (W) | 1500 | 1500 ⇒1000 | 1000 | — | — | 1000 |
| Monomer (sccm) | 20 | 10 ⇒95 | 95 | — | — | 95 ⇒0 |
| Oxygen (sccm) | 600 | 300 ⇒2700 | 2700 | — | — | 2700 |
| Time (sec.) | 30 | 40 | 370 | — | — | 30 |

TABLE 33-continued

Table 2-30: Comparative Example 16

CVD layer

| Thick. (μm) | Initial ave. dep. rate (nm/sec) | Critical compres. ratio | Nanoindentation measurement | | Surface roughness (Ra) (nm) | Infrared absorb. peak intens. ratio | |
|---|---|---|---|---|---|---|---|
| | | | Max. Indent. depth (nm) | Indent. hardness (Gpa) | | α930/α1020 | α1280/α1020 |
| 4.1 | 0.8 | 0.967 | 185 | 2.5 | 2.2 | 0.31 | 0.024 |

Initial performance

| | | Optical property | | Abrasive resistance |
|---|---|---|---|---|
| Appear. | Adhesion | TT (%) | Haze (%) | Taber 1000 revo. ΔH (%) |
| A | A (100) | 89.0 | 0.6 | D (3.3) |

Heat resistance

| Boiling water resistance | | | 110° C. 1000 hr | | | 130° C. 1000 hr | | |
|---|---|---|---|---|---|---|---|---|
| Appear. | Adhesion | Elapsed result | Appear. | Adhesion | Elapsed result | Appear. | Adhesion | Elapsed result |
| A | A (100) | A | B | A (100) | A | B | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | D (40) | x | C | D (0) | 3.2 |

TABLE 34

Table 2-31: Comparative Example 17

Cured Underlayer

| Coating comp. type | Thick. (μm) | PB treatment | | Surface roughness (Ra) (nm) | Water contact angle (°) |
|---|---|---|---|---|---|
| | | Power (W) | Treat. Time (sec.) | | |
| (IX) | 8 | 1000 | 600 | 1.4 | 30 |

CVD film deposition process

| Control parameter | Initial compact layer | Form. of gradient structure | Bulk layer | Highly hard layer | | Final step |
|---|---|---|---|---|---|---|
| | | | | Gradient part | Steady part | |
| Power (W) | 1500 | 1500 ⇒1000 | 1000 | — | — | 1000 |
| Monomer (sccm) | 10 | 10 ⇒95 | 95 | — | — | 95 ⇒0 |
| Oxygen (sccm) | 300 | 300 ⇒1350 | 1350 | — | — | 1350 |
| Time (sec.) | 60 | 40 | 720 | — | — | 30 |

TABLE 34-continued

Table 2-31: Comparative Example 17

CVD layer

| | | | Nanoindentation measurement | | | Infrared absorb. peak intens. ratio | |
|---|---|---|---|---|---|---|---|
| Thick. | Initial ave. dep. rate | Critical compres ratio. | Max. Indent. depth | Indent. hardness | Surface roughness | | |
| (μm) | (nm/sec) | | (nm) | (Gpa) | (Ra) (nm) | α930/α1020 | α1280/α1020 |
| 6.6 | 0.8 | 0.974 | 145 | 3.6 | 2.2 | 0.27 | 0.013 |

Initial performance

| | | Optical property | | Abrasive resistance |
|---|---|---|---|---|
| | | TT | Haze | Taber 1000 revo. |
| Appear. | Adhesion | (%) | (%) | ΔH (%) |
| A | A (100) | 89.1 | 0.5 | A (0.5) |

| Boiling water resistance | | | Heat resistance | | | | | |
|---|---|---|---|---|---|---|---|---|
| | | | 110° C. 1000 hr | | | 130° C. 1000 hr | | |
| Appear. | Adhesion | Elapsed result | Appear. | Adhesion | Elapsed result | Appear. | Adhesion | Elapsed result |
| A | A (100) | A | A | A (100) | A | C | A (100) | A |

Weather resistance (SXOM180 W/m², rainfall for 18 min. of 120 min.)

| 2000 hr | | | 4000 hr | | | 8000 hr | | |
|---|---|---|---|---|---|---|---|---|
| Appear. | Adhesion | ΔE | Appear. | Adhesion | ΔE | Appear. | Adhesion | ΔE |
| A | A (100) | 0.1 | A | A (100) | 0.2 | A | A (100) | 0.5 |

TABLE 35

Table 2-32: Comparative Example 18

Cured Underlayer

| | | PB treatment | | | |
|---|---|---|---|---|---|
| Coating comp. type | Thick. (μm) | Power (W) | Treat. Time (sec.) | Surface roughness (Ra) (nm) | Water contact angle (°) |
| — | — | — | — | 8.0 | 80 |

CVD layer

| | | | Nanoindentation measurement | | | Infrared absorb. peak intens. ratio | |
|---|---|---|---|---|---|---|---|
| Thick. | Initial ave. dep. rate | Critical compres ratio | Max. Indent. Depth | Indent. hardness | Surface roughness | | |
| (μm) | (nm/sec) | | (nm) | (Gpa) | (Ra) (nm) | α930/α1020 | α1280/α1020 |
| 5.0 | — | 0.979 | 145 | 3.6 | 2.2 | 0.27 | 0.013 |

TABLE 35-continued

Table 2-32: Comparative Example 18

Initial performance

| Appear. | Adhesion | Optical property | | Abrasive resistance |
| --- | --- | --- | --- | --- |
| | | TT (%) | Haze (%) | Taber 1000 revo. ΔH (%) |
| A | A (100) | 89.1 | 0.5 | A (1.8) |

| Boiling water resistance | | | Heat resistance | | | | | |
| --- | --- | --- | --- | --- | --- | --- | --- | --- |
| | | | 110° C. 1000 hr | | | 130° C. 1000 hr | | |
| Appear. | Adhesion | Elapsed result | Appear. | Adhesion | Elapsed result | Appear. | Adhesion | Elapsed result |
| A | A (100) | D | A | A (100) | A | C | A (100) | A |

| Weather resistance (SXOM180 W/m², rainfall for 18 min. of 120 min.) | | | | | | | | |
| --- | --- | --- | --- | --- | --- | --- | --- | --- |
| 2000 hr | | | 4000 hr | | | 8000 hr | | |
| Appear. | Adhesion | ΔE | Appear. | Adhesion | ΔE | Appear. | Adhesion | ΔE |
| A | A (100) | 0.1 | A | D (20) | 3.1 | C | D (0) | 7.8 |

TABLE 36

Table 2-33: Comparative Example 19

Cured Underlayer

| Coating comp. type | Thick. (μm) | PB treatment | | Surface roughness (Ra) (nm) | Water contact angle (°) |
| --- | --- | --- | --- | --- | --- |
| | | Power (W) | Treat. Time (sec.) | | |
| — | — | — | — | 7.0 | 70 |

Second hard coat. layer

| Thick. (μm) | Initial ave. dep. rate (nm/sec) | Critical compres ratio. | Nanoindentation measurement | | Surface roughness (Ra) (nm) | Infrared absorb. peak intens. ratio | |
| --- | --- | --- | --- | --- | --- | --- | --- |
| | | | Max. Indent. Depth (nm) | Indent. hardness (Gpa) | | α930/α1020 | α1280/α1020 |
| 0.3 | — | 0.973 | 145 | 3.6 | 2.2 | 0.27 | 0.013 |

Initial performance

| Appear. | Adhesion | Optical property | | Abrasive resistance |
| --- | --- | --- | --- | --- |
| | | TT (%) | Haze (%) | Taber 1000 revo. ΔH (%) |
| A | A (100) | 89.1 | 0.5 | D (3.3) |

TABLE 36-continued

Table 2-33: Comparative Example 19

| Boiling water resistance | | | Heat resistance | | | | | |
|---|---|---|---|---|---|---|---|---|
| | | | 110° C. 1000 hr | | | 130° C. 1000 hr | | |
| Appear. | Adhesion | Elapsed result | Appear. | Adhesion | Elapsed result | Appear. | Adhesion | Elapsed result |
| A | A (100) | D | A | A (100) | A | C | A (100) | A |

| Weather resistance (SXOM180 W/m², rainfall for 18 min. of 120 min.) | | | | | | | | |
|---|---|---|---|---|---|---|---|---|
| 2000 hr | | | 4000 hr | | | 8000 hr | | |
| Appear. | Adhesion | ΔE | Appear. | Adhesion | ΔE | Appear. | Adhesion | ΔE |
| A | A (100) | 0.1 | A | A (100) | 0.2 | C | D (0) | 2.2 |

TABLE 37

Table 2-34: Comparative Example 20

| Cured Underlayer | | | | | |
|---|---|---|---|---|---|
| | | PB treatment | | | |
| Coating comp. type | Thick. (μm) | Power (W) | Treat. Time (sec.) | Surface roughness (Ra) (nm) | Water contact angle (°) |
| — | — | — | — | 12.0 | 70 |

| CVD layer | | | | | | | |
|---|---|---|---|---|---|---|---|
| | | | Nanoindentation measurement | | | | |
| Thick. | Initial ave. dep. rate | Critical compres ratio. | Max. Indent. Depth | Indent. hardness | Surface roughness | Infrared absorb. peak intens. ratio | |
| (μm) | (nm/sec) | | (nm) | (Gpa) | (Ra) (nm) | α930/α1020 | α1280/α1020 |
| 3.1 | — | 0.973 | 145 | 3.6 | 2.2 | 0.27 | 0.013 |

| Initial performance | | | | |
|---|---|---|---|---|
| | | Optical property | | Abrasive resistance |
| Appear. | Adhesion | TT (%) | Haze (%) | Taber 1000 revo. ΔH (%) |
| A | A (100) | 89.1 | 0.5 | A (0.7) |

| Boiling water resistance | | | Heat resistance | | | | | |
|---|---|---|---|---|---|---|---|---|
| | | | 110° C. 1000 hr | | | 130° C. 1000 hr | | |
| Appear. | Adhesion | Elapsed result | Appear. | Adhesion | Elapsed result | Appear. | Adhesion | Elapsed result |
| A | A (100) | D | A | A (100) | A | C | A (100) | A |

| Weather resistance (SXOM180 W/m², rainfall for 18 min. of 120 min.) | | | | | | | | |
|---|---|---|---|---|---|---|---|---|
| 2000 hr | | | 4000 hr | | | 8000 hr | | |
| Appear. | Adhesion | ΔE | Appear. | Adhesion | ΔE | Appear. | Adhesion | ΔE |
| A | A (100) | 0.6 | A | A (100) | 2.8 | C | D (0) | 6.4 |

In Tables 2-1 to 2-31 above, the case of the absence of peeling and the formation of cracks in the evaluations of "appearance" for initial performance, boiling water resistance, heat resistance (110° C. for 1000 hr, 130° C. for 1000 hr) and weather resistance (2000 hr, 4000 hr, 8000 hr) was evaluated as "A", the case of crack formation in the absence of peeling was evaluated as "B", the case of the occurrence of partial peeling was evaluated as "C", and the case of crack formation along with the occurrence of partial peeling was evaluated as "D".

In addition, in Tables 2-1 to 2-31 above, in evaluations of parameters other than "appearance", the case of a favorable result was evaluated as "A", while the case of a poor result was evaluated as "D".

Evaluation of Examples and Comparative Examples

Based on the results shown in Tables 2-1 to 2-13 above, preferable results were determined to be obtained when the thickness of the cured underlayer is 1 to 20 the film thickness of the silicon oxide layer is within the range of 3.5 to 9.0 μm, the maximum nanoindentation depth of the silicon oxide layer is 150 nm or less, and the critical compression ratio K of the silicon oxide layer in a 3-point bending test is 0.975 or less. In contrast, preferably results were not obtained when any of these parameters were not satisfied. More specifically, the following matters were able to be determined from Tables 2-1 to 2-31.

(1) Examples 1 to 4

In Examples 1 to 4, the conditions for forming the silicon oxide layer by PE-CVD were the same and the indispensable constituent features were satisfied. In addition, although there were some differences in the compositions of the cured underlayer and critical compression ratio of the silicon oxide layer obtained by PE-CVD, since each of these values was within the preferable range of the present application, favorable results were obtained for Taber abrasion resistance, boiling water performance, water resistance performance and heat resistance performance. In addition, favorable results were also obtained for accelerated weather resistance, and in Examples 1 and 2 in particular, as a result of adding the hydroxyphenyltriazine-based Tinuvin 400 as inorganic ultraviolet absorber to the cured underlayer, changes in color (ΔE) of the polymer substrates with hard coating layer primarily caused by UV-induced deterioration of the polymer substrate and adhesive layer were relatively inhibited with respect to Examples 3 and 4.

(2) Example 5

Although Example 5 satisfied the indispensable constituent features and was produced in the same manner as Example 4 with the exception of using a relatively long plasma treatment time for the cured underlayer, there were differences in the surface roughness of the cured underlayer as measured by DFM, and there were also some differences in the critical compression ratio of the silicon oxide layer obtained by PE-CVD. However, since each of these values was within the preferable range of the present application, favorable results were obtained for Taber abrasion resistance, boiling water performance, water resistance performance and heat resistance performance, and favorable results were also obtained for accelerated weather resistance.

(3) Example 6

Example 6 satisfied the indispensable constituent features, and although the film thickness of the silicon oxide layer obtained by PE-CVD approached the upper limit of the preferable range of the present application, since it satisfied the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(4) Example 11

Example 11 satisfied the indispensable constituent features, and although the composition of the cured underlayer and plasma treatment conditions approached the lower limits of the preferable ranges of the present application, since it satisfied the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(5) Examples 7 to 10

Although Examples 7 to 10 satisfied the indispensable constituent features and the composition of the cured underlayer and plasma treatment conditions were identical to the preferable ranges of the present application, the production conditions (deposition conditions) of the silicon oxide layer obtained by PE-CVD differed, and critical compression ratio, maximum nanoindentation depth, indentation hardness and surface roughness as measured by DFM also differed. However, since each of these values was within the preferable range of the present application, favorable results were obtained for Taber abrasion resistance, boiling water performance, water resistance performance and heat resistance performance, and favorable results were also obtained for accelerated weather resistance.

(6) Example 12

Example 12 satisfied the indispensable constituent features, and although the inorganic component ratio of the cured underlayer approached the lower limit of the preferable range of the present application, since it satisfied the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(7) Example 13

Although Example 13 satisfied the indispensable constituent features but did not contain an organic-inorganic hybrid acrylic resin for improving dispersibility of the multifunctional (meth)acrylate and inorganic fine particles in the cured underlayer composition, since it satisfied the parameters of the preferable ranges of the present application with respect to the cured underlayer and silicon oxide layer obtained by PE-CVD, favorable results were obtained for Taber abrasion resistance, boiling water performance, water resistance performance and heat resistance performance, and favorable results were also obtained for accelerated weather resistance.

(8) Comparison of Examples 1 to 4, 12 and 13 with Comparative Example 1

Despite Examples 1 to 4, 12 and 13 having the same cured underlayer plasma treatment conditions and conditions for forming the silicon oxide layer by PE-CVD, Examples 1 to 4 demonstrated favorable results, while Comparative Example 1 did not allow the obtaining of a substrate that was worth evaluating. In Comparative Example 1, the inorganic component ratio of the cured underlayer coating agent was below the preferable range of the present application and the indispensable constituent features were not satisfied. As a result, the cured underlayer was decomposed and deteriorated by plasma treatment, surface roughness increased rapidly, and a silicon oxide layer worth evaluating was unable to be formed.

(9) Comparison of Examples 1 to 4, 12 and 13 with Comparative Example 2

Despite Examples 1 to 4, 12 and 13 and Comparative Example 2 having the same cured underlayer plasma treatment conditions and conditions for forming the silicon oxide layer by PE-CVD, there were differences in boiling water performance, water resistance performance and accelerated weather resistance performance, with Examples 1 to 4 demonstrating favorable results, while Comparative Example 2 demonstrated inadequate results. Here, although the critical compression ratio was within the preferable range of the present application in Examples 1 to 4, 12 and 13, it was outside of this range in Comparative Example 2, thereby preventing the indispensable constituent features from being satisfied. In addition, although the cured underlayer had a preferable composition in Examples 1 to 4, 12 and 13, the ratio of the inorganic component in Comparative Example 2 exceeded the upper limit of the preferable range.

(10) Comparison of Example 1 with Comparative Example 15

Despite Example 1 and Comparative Example 15 having the same cured underlayer as well as the same plasma treatment conditions and conditions for forming the silicon oxide layer by PE-CVD, there were differences in boiling water performance, water resistance performance and accelerated weather resistance performance, with Example 1 demonstrating favorable results, while Comparative Example 15 demonstrated inadequate results. Here, although the critical compression ratio was within the preferable range of the present application in Example 1, it was outside of this range in Comparative Example 15, thereby preventing the indispensable constituent features from being satisfied. In addition, although the initial deposition rate of the silicon oxide layer obtained by PE-CVD was within the preferable range of the present application in Example 1, it was outside this range in Comparative Example 15.

(11) Comparison of Example 1 with Comparative Examples 3 and 4

Despite Example 1 and Comparative Examples 3 and 4 having the same composition of the cured underlayer as well as the same conditions for forming the silicon oxide layer by PE-CVD, there were differences in boiling water performance and accelerated weather resistance performance, with Example 1 demonstrating favorable results, while Comparative Examples 3 and 4 demonstrated inadequate results. Here, although the critical compression ratio was within the preferable range of the present application in Example 1, it was outside of this range in Comparative Examples 3 and 4, thereby preventing the indispensable constituent features from being satisfied. In addition, although the surface roughness of the cured underlayer as measured by DFM and the water contact angle were within the preferable ranges of the present application in Example 1, they were outside these ranges in Comparative Examples 3 and 4. These differences were due to differences in plasma treatment conditions of the cured underlayer.

(12) Comparison of Examples 1 and 6 to 11 with Comparative Examples 5 to 8 and 12

Despite Examples 1 and 6 to 11 and Comparative Examples 5 to 8 and 12 having the same composition of the cured underlayer, plasma treatment conditions, surface roughness of the cured underlayer as measured by DFM and water contact angle, there were differences in boiling water performance and accelerated weather resistance performance, with Example 4 demonstrating favorable results, while Comparative Examples 5 to 8 and 12 demonstrated inadequate results. Here, although the critical compression ratio was within the preferable range of the present application in Examples 1 and 6 to 11, it was outside of this range in Comparative Examples 5 to 8 and 12, thereby preventing the indispensable constituent features from being satisfied.

(13) Comparison of Examples 1 and 6 to 11 with Comparative Examples 9 to 11

Despite Examples 1 and 6 to 11 and Comparative Examples 9 to 11 and 16 having the same composition of the cured underlayer, plasma treatment conditions, surface roughness of the cured underlayer as measured by DFM and water contact angle, there were differences in abrasion resistance performance, with Examples 1 and 6 to 11 demonstrating favorable results, while Comparative Examples 9 to 11 and 16 demonstrated inadequate results. Here, although maximum indentation depth as determined by measuring nanoindentation was within the preferable range of the present application in Examples 1 and 6 to 11, it was outside this range in Comparative Examples 9 to 11 and 16, thereby preventing the indispensable constituent features from being satisfied. In addition, although the infrared absorbance peak intensity ratios ($\alpha_{1280}/\alpha_{1020}$) and ($\alpha_{930}/\alpha_{1020}$) of the silicon oxide layer obtained by PE-CVD were within the preferable ranges of the present application, the ratios were outside these ranges in Comparative Examples 9 to 11 and 16. These differences were due to differences in conditions for depositing the silicon oxide layer by PE-CVD.

(14) Comparison of Example 8 and Comparative Example 13

Although Comparative Example 13 was produced under similar conditions to those of Example 8, differing from Example 8, inadequate results were obtained for Taber abrasion resistance. This was due to the film thickness of the silicon oxide layer obtained by PE-CVD in Comparative Example 13 being below the preferable range of the present application, thereby preventing the indispensable constituent features from being satisfied.

(15) Comparison of Example 8 and Comparative Example 14

Although Comparative Example 14 was produced under similar conditions to those of Example 8, differing from Example 8, inadequate results were obtained for boiling water performance and accelerated weather resistance performance. This was due to the film thickness of the silicon oxide layer obtained by PE-CVD in Comparative Example 14 exceeding the preferable range of the present application, thereby preventing the indispensable constituent features from being satisfied.

(16) Comparison of Example 11 and Comparative Example 16

Although the film thicknesses of the silicon oxide layer obtained by PE-CVD were nearly the same in Example 11 and Comparative Example 16, Taber abrasion resistance was favorable for Example 11, but inadequate for Comparative Example 16. This difference is due to maximum indentation depth as determined by measuring nanoindentation and indentation hardness being outside the preferable ranges in Comparative Example 16, despite being within the preferable ranges of the present application in Example 11, thereby preventing the indispensable constituent features from being satisfied.

(17) Comparison of Example 1 and Comparative Example 17

Despite Example 1 and Comparative Example 17 having the same conditions for forming the silicon oxide layer by PE-CVD and the surface roughness and water contact angle of the surface of the cured underlayer following plasma treatment being within the preferable ranges of the present application in both cases, in contrast to heat resistance for 1000 hours at 130° C. being favorable in Example 1, cracks formed in the coating layer during the same test in Comparative Example 17. This was caused by the cured underlayer of Comparative Example 17 being in the form of a heat-cured siloxane resin layer having inferior heat resistance (in the sense of durability with respect to tensile stress due to the effect of the difference in coefficient of linear expansion) in contrast to the cured underlayer being in the form of a UV-cured acrylic resin layer within the preferable range of the present application in Example 1.

(18) Comparison of Example 1 and Comparative Examples 18 and 20

Although Example 1 and Comparative Examples 18 and 20 demonstrated favorable initial performance, in Comparative Examples 18 and 20, cracks formed and partial peeling occurred during observations over time following the boiling water resistance test. In addition, partial peeling also occurred in the heat resistance test for 1000 hours at 130° C. This was caused by the critical compression ratio in Example 1 being within the preferable range of the present application while being outside this range in Comparative Examples 18 and 20.

(19) Comparison of Example 1 and Comparative Example 19

Although Example 1 and Comparative Example 19 demonstrated favorable initial performance, in Comparative Example 19, cracks formed and partial peeling occurred during observations over time following the boiling water resistance test. In addition, partial peeling also occurred in the heat resistance test for 1000 hours at 130° C. This was caused by the film thickness of the silicon oxide layer in Example 1 being within the preferable range of the present application while being outside this range in Comparative Example 19.

INDUSTRIAL APPLICABILITY

The polymer substrate with hard coating layer of the present invention has superior surface abrasion resistance comparable to that of inorganic glass and is also provided with a high level of environmental resistance enabling it to be used for long periods of time even in harsh usage environments, and can be used in, for example, automobile window materials, construction members and surface protective plates of solar batteries, thereby making it extremely useful.

BRIEF DESCRIPTION OF THE REFERENCE SYMBOLS

1 Vacuum vessel
2 Power supply
3 Matching box
4 Exhaust port
5 Vacuum pump
6A Cooling medium
7 Reaction gas
10 Cathode electrode
14 Shielding component
20 Anode electrode
30,31 Treated substrates
40,41 Gas introducing head
40A,41A Blowout holes
40B,41B Inlets
50 Polymer substrate
60 Adhesive layer
70 Cured underlayer
80 Silicon oxide layer obtained by PE-CVD
81 Cut line (separation starting line)
90 3-point bending tester (side where indentation load applied)
90A,90B End fulcrum points
100 3-point bending tester (side containing fulcrum points)
100A Central fulcrum point
110 Direction of application of indentation load
120 Blade for making cut
130 Bent center

The invention claimed is:
1. A polymer substrate with hard coating layer comprising a polymer substrate having a thickness of 1 mm to 20 mm and a hard coating layer on the surface thereof; wherein,
the hard coating layer comprises:
a cured underlayer laminated on the surface of the polymer substrate, containing 10 to 90 parts by weight of multifunctional acrylate and 90 to 10 parts by weight of inorganic oxide fine particles and/or a hydrolysis-condensation product of an organic silicon compound, and having a thickness of 1 μm to 20 μm, and
a silicon oxide layer that makes direct contact with the cured underlayer on the opposite side from the polymer substrate, is formed by PE-CVD using an organic silicon compound selected from an organosiloxane, organosilane or (organo)silazane as raw material, and satisfies all of the following requirements (a) to (c):
(a) film thickness of the silicon oxide layer is within the range of 3.5 to 9.0 μm,
(b) maximum indentation depth of the surface of the silicon oxide layer, as determined by measuring nanoindentation under conditions of a maximum load of 1 mN, is 150 nm or less, and
(c) the value of critical compression ratio K of the silicon oxide layer, as defined by formula (1) in a 3-point bending test of the polymer substrate with hard coating layer that imparts indentation displacement in which the surface laminated with the silicon oxide layer becomes concave, is 0.975 or less:

$$K=(R-D/2)/R-(0.00215 \times d) \quad \text{Formula (1)}$$

(wherein,
D represents the total thickness (mm) of the polymer substrate with hard coating layer,
d represents the film thickness (μm) of the silicon oxide layer, and
R represents the bend radius (mm) of the polymer substrate with hard coating layer, measured when the silicon oxide layer begins to separate from a cut line (separation starting line) drawn in advance at the location of the central fulcrum point where a weight is applied in a 3-point bending test),
wherein the ratio of infrared absorbance of the silicon oxide layer at a wave number of 1280 cm$^{-1}$ to that at a wave number of 1020 cm$^{-1}$ ($\alpha_{1280}/\alpha_{1020}$) is within the range of 0.002 to 0.020, and
the inorganic oxide fine particles and/or the hydrolysis-condensation product of the organic silicon compound of the cured underlayer is reacted with a (meth)acrylic resin having alkoxysilyl groups, hydroxyl groups, amino groups, or carboxyl groups in a side chain thereof.

2. The polymer substrate with hard coating layer according to claim 1, wherein the ratio of infrared absorbance of the silicon oxide layer at a wave number of 930 cm$^{-1}$ to that at a wave number of 1020 cm$^{-1}$ ($\alpha_{930}/\alpha_{1020}$) is 0.30 or less.

3. The polymer substrate with hard coating layer according to claim 1, wherein indentation hardness of the surface of the silicon oxide layer as determined by measuring nanoindentation under conditions of a maximum load of 1 mN is 3.0 GPa or more.

4. The polymer substrate with hard coating layer according to claim 1, wherein surface roughness (Ra) of the silicon oxide layer when measured using the dynamic force mode (DFM) of a scanning probe microscope under conditions of observing by 5.0 μm square is 5.0 nm or less.

5. The polymer substrate with hard coating layer according to claim 1, wherein the (meth)acrylic resin contains 0.1 to 5 mol/kg of the hydroxyl groups, amino groups, carboxyl groups, alkoxysilyl groups or a combination thereof in the compound thereof.

6. A method for producing the polymer substrate with hard coating layer according to claim 1, comprising: forming the cured underlayer by coating a precursor material composition containing 10 to 90 parts by weight of a multi-functional acrylate and 90 to 10 parts by weight of an inorganic oxide fine particle and/or silicon compound hydrolysis-condensation product onto the polymer substrate followed by drying and heat curing or active energy ray curing.

7. The method for producing the polymer substrate with hard coating layer according to claim 6, wherein the surface of the cured underlayer is adjusted by plasma excitation or colliding an ionized inert gas with the surface of the cured underlayer.

8. The method for producing the polymer substrate with hard coating layer according to claim 6, wherein the silicon oxide layer is formed by making the average deposition rate (nm/sec) from the start of deposition to 30 seconds after the start of deposition to be 1 nm/sec or less.

9. The method for producing the polymer substrate with hard coating layer according to claim 8, wherein the silicon oxide layer is formed by making the average deposition rate (nm/sec) starting from 30 seconds after the start of deposition to be 2 nm/sec or more.

10. The method for producing the polymer substrate with hard coating layer according to claim 9, wherein the deposition rate of the silicon oxide layer is increased continuously or incrementally in two or more steps.

* * * * *